US008946800B2

(12) United States Patent
Kume et al.

(10) Patent No.: US 8,946,800 B2
(45) Date of Patent: Feb. 3, 2015

(54) SEMICONDUCTOR DEVICE WITH PROTECTIVE LAYER AND METHOD OF MANUFACTURING SAME

(75) Inventors: Ippei Kume, Kawasaki (JP); Kenichiro Hijioka, Kawasaki (JP); Naoya Inoue, Kawasaki (JP); Hiroyuki Kunishima, Kawasaki (JP); Manabu Iguchi, Kawasaki (JP); Hiroki Shirai, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/593,084

(22) Filed: Aug. 23, 2012

(65) Prior Publication Data

US 2013/0056850 A1    Mar. 7, 2013

(30) Foreign Application Priority Data

Sep. 2, 2011  (JP) .................. 2011-191983

(51) Int. Cl.
*H01L 27/108*  (2006.01)
*H01L 49/02*  (2006.01)

(52) U.S. Cl.
CPC .... *H01L 27/10894* (2013.01); *H01L 27/10814* (2013.01); *H01L 27/10808* (2013.01); *H01L 27/10852* (2013.01); *H01L 28/90* (2013.01)
USPC .................. 257/296; 257/306; 257/E27.088; 257/E27.097; 438/253

(58) Field of Classification Search
CPC combination set(s) only.
See application file for complete search history.

(56) References Cited

U.S. PATENT DOCUMENTS

| | | | | |
|---|---|---|---|---|
| 6,709,945 B2* | 3/2004 | McClure | | 438/396 |
| 6,965,139 B2 | 11/2005 | Ohno | | |
| 6,984,861 B2 | 1/2006 | Yamada et al. | | |
| 7,247,902 B2 | 7/2007 | Ohno | | |
| 7,400,005 B2 | 7/2008 | Kumura et al. | | |
| 7,659,567 B2 | 2/2010 | Aoki | | |
| 2003/0022437 A1* | 1/2003 | Fishburn | | 438/245 |
| 2003/0178665 A1* | 9/2003 | Takenaka | | 257/306 |
| 2004/0166668 A1* | 8/2004 | Ito | | 438/637 |
| 2004/0185634 A1* | 9/2004 | Lim et al. | | 438/396 |
| 2008/0296729 A1* | 12/2008 | Kubota et al. | | 257/532 |
| 2009/0001437 A1* | 1/2009 | Won et al. | | 257/300 |
| 2010/0224922 A1 | 9/2010 | Shinhara | | |
| 2011/0001216 A1* | 1/2011 | Inoue | | 257/532 |
| 2011/0241169 A1* | 10/2011 | Higashino | | 257/532 |
| 2012/0193760 A1* | 8/2012 | Manabe et al. | | 257/532 |
| 2013/0092993 A1* | 4/2013 | Hijioka et al. | | 257/301 |
| 2013/0285203 A1* | 10/2013 | HIROI et al. | | 257/532 |

FOREIGN PATENT DOCUMENTS

| | | | |
|---|---|---|---|
| JP | 2000-332216 A | 11/2000 | |
| JP | 2004-342787 A | 12/2004 | |
| JP | 2005-044972 A | 2/2005 | |
| JP | 2006-222389 A | 8/2006 | |
| JP | 2007-201101 A | 8/2007 | |
| JP | 2010-206094 A | 9/2010 | |
| JP | 2011-108757 A | 6/2011 | |

* cited by examiner

*Primary Examiner* — Julio J Maldonado
*Assistant Examiner* — Molly Reida
(74) *Attorney, Agent, or Firm* — Foley & Lardner LLP

(57) ABSTRACT

To provide a semiconductor device featuring reduced variation in capacitor characteristics. In the semiconductor device, a protective layer is provided at the periphery of the upper end portion of a recess (hole). This protective layer has a dielectric constant higher than that of an insulating layer placed in the same layer as the protective layer and configuring a multilayer wiring layer placed in a logic circuit region.

26 Claims, 72 Drawing Sheets

DELAY INCREASE PERCENTAGE = $\frac{tpd_{eDRAM} - tpd_{w/oDRAM}}{tpd_{w/oDRAM}} \times 100 \, (\%)$

… (1)

SEMICONDUCTOR DEVICE WITH PROTECTIVE LAYER AND METHOD OF MANUFACTURING SAME

CROSS-REFERENCE TO RELATED APPLICATIONS

The disclosure of Japanese Patent Application No. 2011-191983 filed on Sep. 2, 2011 including the specification, drawings and abstract is incorporated herein by reference in its entirety.

BACKGROUND

The present invention relates to a semiconductor device and a method of manufacturing a semiconductor device.

In the integrated circuit field of electronics industry, there is a growing demand for further high integration and further speed-up. The progress in integration has enlarged the scale of circuits, leading to an increase in difficulty level in circuit design.

An integrated circuit obtained by mounting both a logic circuit and a memory circuit on the same semiconductor substrate is called "mixed circuit". The mixed circuit has an improved integration degree, because the logic circuit and the memory circuit are arranged with a short distance. In addition, it has an improved operation rate because a wiring distance between circuits can be decreased.

Patent Documents 1 to 3 describe a semiconductor device having a mixed circuit. This semiconductor device has, on one substrate, a logic portion and a DRAM (Dynamic Random Access Memory) portion. The logic portion has, on the substrate, a first transistor, a first contact, a wiring, and an interlayer insulating layer. The first contact electrically couples the first transistor and the wiring. This wiring is buried in the interlayer insulating layer. The DRAM portion has, on the substrate, a second transistor, a second contact, a capacitor, and an interlayer insulating layer. The second contact electrically couples the second transistor and the capacitor. The capacitor is buried in a recess (which may hereinafter be called "capacitor burying recess) formed in the interlayer insulating layer. The capacitor and the wiring are formed in the same layer. The interlayer insulating layer in which the capacitor burying recess has been formed is made of the same material as that of the interlayer insulating layer in which the wiring has been buried.

[Patent Document 1] Japanese Patent Laid-Open No. 2007-201101
[Patent Document 2] Japanese Patent Laid-Open No. 2000-332216
[Patent Document 3] Japanese Patent Laid-Open No. 2004-342787

SUMMARY

In the semiconductor devices described above, high-speed operation is required. An interlayer insulating layer having wirings buried therein are required to have a low dielectric constant in order to reduce the parasitic capacitance between wirings. In order to satisfy such a requirement, a typical low-dielectric-constant film (Low-k film) is employed as an interlayer insulating layer having wirings buried therein.

As a result of investigation, however, the present inventors have found that when a capacitor burying recess is formed in a low-dielectric-constant interlayer insulating layer, there occurs variation in the shape of an upper end portion of the recess. In other words, they have found that a so-called shoulder loss occurs at the upper end portion of the recess.

This variation in shape at the upper end portion of the recess may lead to variation in the capacitance of a capacitor.

The invention provides a semiconductor device equipped with a substrate, a multilayer wiring layer provided on the substrate, a capacitor buried in a recess formed in the multilayer wiring layer and having a lower electrode, a capacitor insulating film, and an upper electrode, a logic circuit provided on the substrate, an upper coupling wiring to be coupled to the capacitor, and a protective layer provided at the periphery of the upper end portion of the recess. In this semiconductor device, the dielectric constant of the protective layer is higher than that of an insulating layer configuring the multilayer wiring layer provided in the logic circuit and this insulating layer lies in the same layer as the protective layer.

The present invention provides a method of manufacturing a semiconductor device including a step of forming an insulating layer on a substrate, a step of forming a wiring in the insulating layer, a step of forming a trench by selectively removing the insulating layer from a memory circuit formation region different from a logic circuit formation region in which the wiring has been formed, forming, in the trench, a protective layer having a dielectric constant greater than that of the insulating layer, forming a recess by partially removing at least the protective layer, forming a capacitor by burying, in the recess, a lower electrode, a capacitor insulating film, and an upper electrode, and forming an upper coupling wiring to be coupled onto the upper electrode.

As a result of investigation, the present inventors have found that variation in shape of the recess at the upper end portion thereof has occurred due to small mechanical strength of the interlayer insulating layer, because with a decrease in dielectric constant, the interlayer insulating layer is likely to have smaller mechanical strength and undergo deformation.

The protective layer is made of a material having a high dielectric constant and therefore becomes a member excellent in mechanical strength. By this protective layer, the periphery of the upper end portion of the capacitor burying recess is protected. In other words, a recess is formed in the protective layer having high mechanical strength. Variation (so-called shoulder loss) in the shape of the upper end portion of the recess is therefore reduced so that variation in the height of a capacitor among recesses or among products can be reduced.

The present invention provides a semiconductor device having less variation in the capacitance of a capacitor.

DETAILED DESCRIPTION

Figure 1:
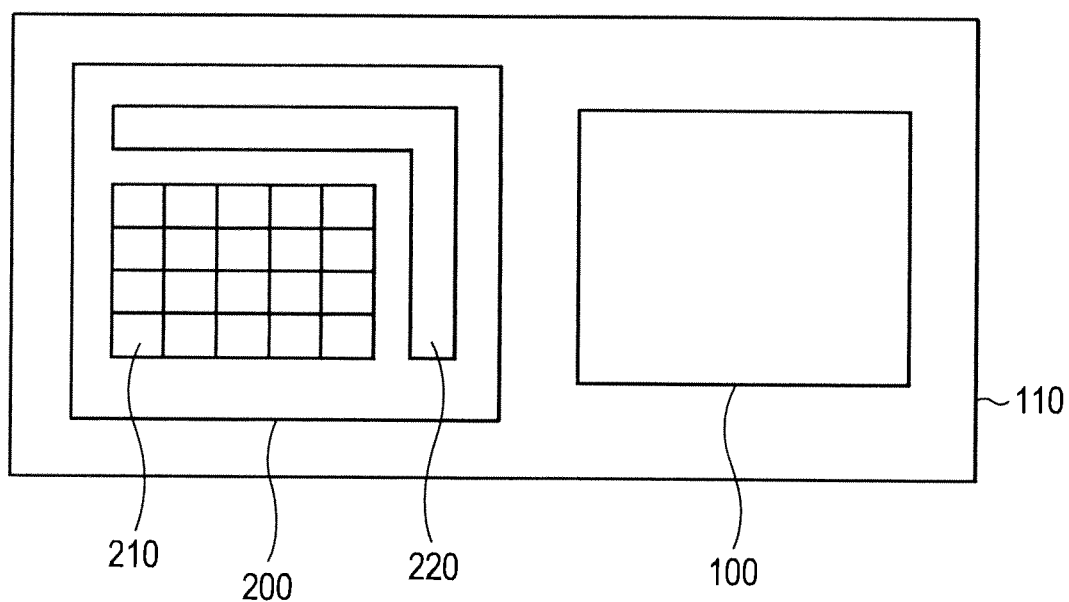
FIG. 1 is an upper surface view schematically showing a semiconductor device according to a first embodiment.

The embodiments of the invention will hereinafter be described referring to drawings. In all the drawings, like constituent elements are identified by like reference numerals and a description will be omitted as needed.

Figure 2:
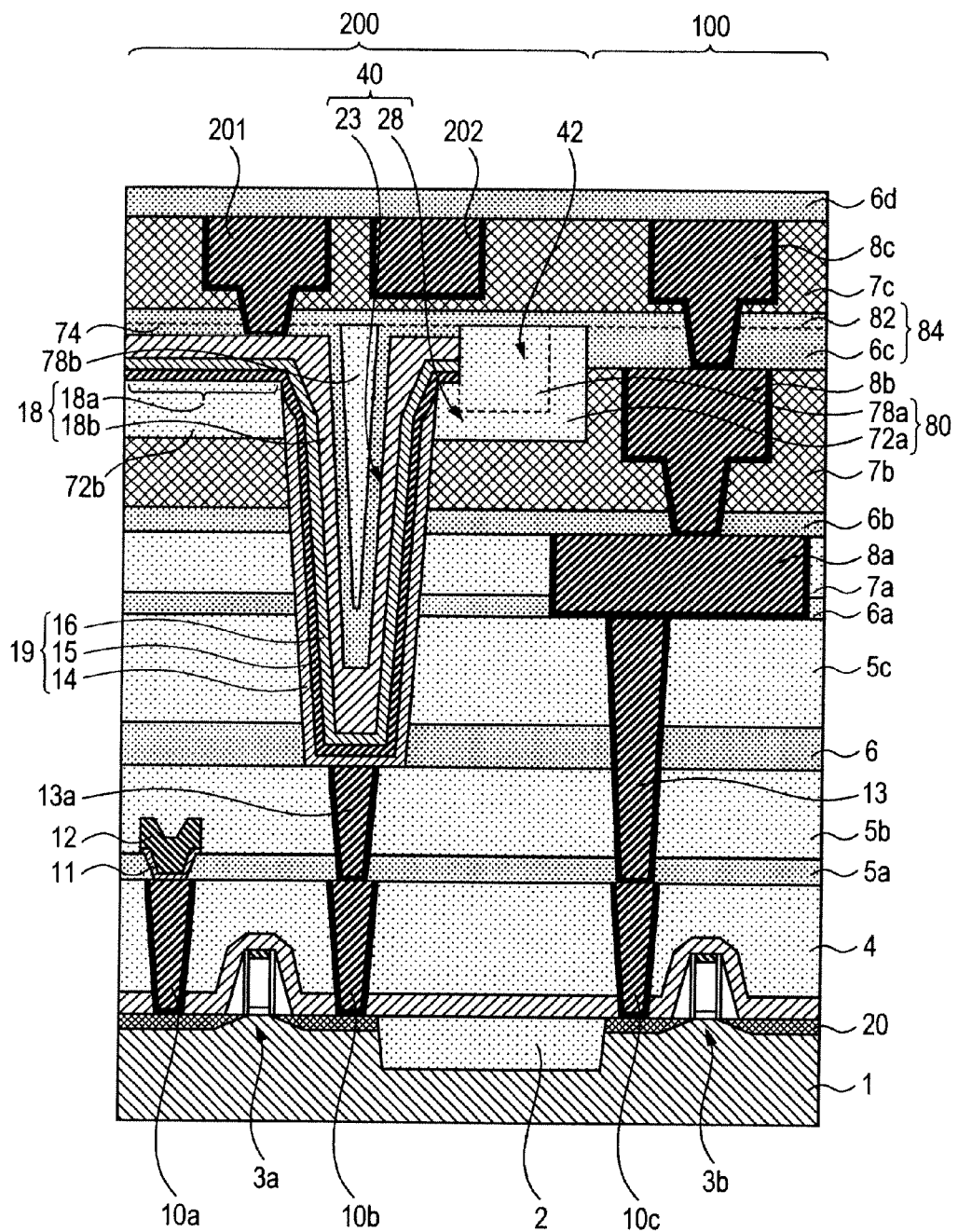
FIG. 2 is a cross-sectional view schematically showing the semiconductor device according to the first embodiment.

(First Embodiment) A semiconductor device of the first embodiment will be described. FIG. 1 is an upper surface view schematically showing the semiconductor device according to the first embodiment. FIG. 2 is a cross-sectional view schematically showing the semiconductor device according to the first embodiment.

The semiconductor device of the present embodiment is equipped with a substrate, a multilayer wiring layer, a capacitor, a peripheral circuit, a logic circuit, an upper coupling wiring, and a protective layer. The semiconductor device has, as shown in FIG. 1, a logic circuit 100 and a memory circuit 200. In a planar view, the logic circuit 100 is placed in a logic circuit region, in a semiconductor substrate 1, which is a region different from a memory circuit region. The memory circuit 200 is, in a planar view, placed in the memory circuit region in the semiconductor substrate 1. The memory circuit 200 has a capacitor 19 and a peripheral circuit 220. The multilayer wiring layer is formed on a substrate (semiconductor substrate 1) and has a plurality of wiring layers. The wiring layer has a wiring and an insulating layer (interlayer insulating film). The capacitor 19 is buried in a recess (hole 23) provided in the multilayer wiring layer. The capacitor 19 has a lower electrode 14, a capacitor insulating film 15, and an upper electrode 16. The memory circuit 200 controls the capacitor 19. The protective layer (protective layer 80) is provided at the periphery of the upper end portion of the recess (hole 23). The protective layer 80 has a dielectric constant higher than that of a first insulating layer configuring the multilayer wiring layer provided in the logic circuit 100. The first insulating layer lies in the same layer as the protective layer 80.

The protective layer 80 of the semiconductor device of the present embodiment is made of a material having a high dielectric constant so that it becomes a member superior in mechanical strength to a low-dielectric-constant film configuring the wiring layer. In addition, the protective layer 80 becomes a member superior in chemical stability to the low-dielectric-constant film configuring the wiring layer. The protective layer 80 is arranged at the periphery of the upper end portion of a recess (which may hereinafter be called "capacitor burying recess") in which the capacitor 19 is to be buried. This means that the protective layer 80 protects the upper end portion of the capacitor burying recess. Variation in the shape of the capacitor burying recess (hole 23) among recesses or among products can therefore be reduced. As a result, the semiconductor device according to the present embodiment has a structure with less variation in capacitor characteristics such as capacitance of a capacitor.

Each configuration of the present embodiment will next be described in detail. As shown in FIG. 1, the semiconductor device of the present embodiment has a structure in which both a memory circuit 200 including a capacitor 210 and a logic circuit 100 in which a semiconductor element is to be formed have been mounted on a semiconductor substrate 110. The logic circuit 100 is formed not in a peripheral circuit 220 of a capacitor 210 in the memory circuit 200 but in a region different from the memory circuit 200. For example, a logic circuit region is a region in which a high-speed logic circuit such as CPU (Central Processing Unit) has been formed.

As shown in FIG. 2, the logic circuit 100 and the memory circuit 200 are formed individually on the semiconductor substrate 1. It is to be noted that the constituent elements shown in the drawing of the logic circuit 100 and the memory circuit 200 are only some of elements configuring each circuit and the scope of right of the invention is not limited by active elements having no direct relationship with the embodiment of the invention or a coupling method of multilayer wirings.

As shown in FIG. 2, the semiconductor substrate 1 has, on the surface thereof, a logic circuit region and a memory circuit region. The logic circuit region has an active element 3b configuring the logic circuit 100. The memory circuit region has an active element 3a configuring a memory cell of the memory circuit 200. These active element 3a and active element 3b are isolated from each other by an element isolation film 2 formed on the surface of the semiconductor substrate 1. As the element isolation film 2 (silicon oxide film or the like) or active element 3a or 3b (transistor, or the like), that manufactured by an ordinarily employed manufacturing method of a semiconductor device can be used and the scope of right of the invention is not limited by the structure or material of them.

It is to be noted that in an actual memory circuit 200, a bit line 12 and the longer direction of the gate of the active element 3a configuring the memory cell are arranged in such a positional relationship as to make substantially right angles to each other. To simplify the drawing, however, the longer direction of the gate of the active element 3a, similar to the bit line 12, is shown as that extending in a direction perpendicular to the plane of paper. The positional relationship between the bit line 12 and the longer direction of the gate of the active element 3b configuring the logic circuit 100, in the cross-sectional views shown herein, is shown similarly unless otherwise specifically indicated. In this drawing, an arrow means a surface or a hole or a wiring trench.

As shown in FIG. 2, the semiconductor substrate 1 has thereon an element isolation film 2. This element isolation film 2 isolates the memory circuit region from the logic circuit region. The memory circuit has an active element 3a (first transistor). The logic circuit region has an active element 3b (second transistor). The transistors have a diffusion layer 20 formed on the surface of the semiconductor substrate 1. These transistors have, thereon, contact interlayer insulating layers 4, 5a, 5b, and 5c. The contact interlayer insulating layer 4 (first contact insulating layer) has therein first cell contacts (cell contact 10a and cell contact 10b) and a second cell contact (cell contact 10c) and the contact interlayer insulating layers 5a and 5b (second contact insulating layers) have therein a barrier metal film (bit contact 11) and a bit line 12. The contact interlayer insulating layers 5a, 5b, and 5c have a coupling contact 13 buried therein. The cell contact 10a couples the diffusion layer 20 of the active element 3a to the bit line 12. The cell contact 10b couples the diffusion layer 20 of the active element 3a to the capacitor contact 13a. The cell contact 10c couples the diffusion layer 20 of the active element 3b to the coupling contact 13. The capacitor contact 13a couples the cell contact 10b to the capacitor 19. The coupling contact 13 couples the cell contact 10c to a wiring 8a of the logic circuit 100. The lower surface of the coupling contact 13 is in direct contact with the upper surface of the cell contact 10c (for example, when a barrier metal film is formed at the periphery of the coupling contact 13, the barrier metal film on the lower surface of the coupling contact 13 is in contact with the upper surface of the cell contact 10c). The lower surface of the capacitor contact 13a may be brought into direct contact with the upper surface of the cell contact 10b or may be coupled via a barrier metal film. The naming of the contacts is made so as to clearly define them in the specification of the invention and the definition of each contact in this specification is based on the definition described above.

It is to be noted that in an actual memory circuit 200, a bit line 12 and the longer direction of the gate of the active element 3a configuring the memory cell are arranged in such a positional relationship as to make substantially right angles to each other. To simplify the drawing, however, the longer direction of the gate of the active element 3a, similar to the bit line 12, is shown as that extending in a direction perpendicular to the plane of paper. The positional relationship between the bit line 12 and the longer direction of the gate of the active element 3b configuring the logic circuit 100, in the cross-sectional views shown herein, is shown similarly unless otherwise specifically indicated. In this drawing, an arrow means a surface or a hole or a wiring trench.

As at least one of the contact interlayer insulating layers 4, 5a, 5b, and 5c, a silicon oxide film may be used but an insulating film having a lower relative dielectric constant than that of a silicon oxide film is more preferred. As such an insulating film, an insulating film usually called "low-dielectric-constant film" obtained by substituting the oxygen atom of a silicon oxide film with a fluorine or carbon atom or a hydrocarbon group; or an insulating film having at least silicon, oxygen and carbon and having fine pores with a diameter of several nanometer or less, a so-called porous film may be used. The relative dielectric constant of an insulating film having therein no fine pores is preferably 3.1 or less. More preferably, the relative dielectric constant of an insulating film having therein fine pores is 2.6 or less. Such a structure makes it possible to decrease the parasitic capacitance of the contact, decrease the delay of the memory circuit and the logic circuit, and as a result, improve the operation rate of a semiconductor element.

In the memory circuit 200, one of the diffusion layers of the active element 3a is electrically coupled to the bit line 12 via the cell contact 10a. The other one of the diffusion layers of the active element 3a and the capacitor 19 are electrically coupled to each other via the capacitor contact 13a. Due to such a structure, the active element 3a, the bit line 12, and the capacitor 19 are coupled to each other to configure one transistor/one capacitor type memory cell, which is a typical memory cell of a DRAM (Dynamic Random Access Memory) circuit.

The contact interlayer insulating layer 5c has thereon cap layers 6a, 6b, 6c, and 6d and interlayer insulating layers 7a, 7b, and 7c which have been stacked alternately in the order of mention. In the logic circuit region, interlayer films have therein wirings 8a, 8b, and 8c, respectively. The wirings 8b and 8c are more preferably formed by the dual damascene process typically used as a formation method of a multilayer wiring of a semiconductor device. This makes it possible to decrease a manufacturing cost of wirings and reduce the resistance of a via for coupling between respective wirings present in different layers. In the wirings 8b and 8c shown in FIG. 2, these reference numbers represent wirings and also vias for coupling them to an underlying wiring layer. Unless otherwise particularly specified, wirings formed by the damascene process include vias in the present embodiment. The wirings 8a to 8c may have at the periphery thereof a barrier metal film.

A metal wiring material for wirings can be selected from metal materials containing Cu, W, and Al, alloys having such a metal material as a main component (for example, 95 mass % or greater), or metal materials made thereof. All the wirings configuring the logic circuit 100 may have a dual damascene structure and be made of a metal material containing Cu or having Cu as a main component. By using such a material, the resulting semiconductor device has an improved operation rate. On the other hand, as a contact plug material (cell contacts 10a, 10b, and 10c, bit line 12, capacitor contact 13a, coupling contact 13, and the like), materials of the same kind as the metal wiring materials may be used. The contact plug materials may be made of a material same as or different from those used for metal wirings. For example, metal materials containing W or having W as a main component are preferred as the contact plug material from the standpoint of burying characteristic and heat stability.

The material of the interlayer insulating layer may be a silicon oxide film or an ordinarily used low-dielectric-constant insulating film obtained by incorporating fluorine, carbon, or the like in a silicon oxide film. Alternatively, it may be a so-called porous film obtained by making fine pores in an insulating film. In the present embodiment, the interlayer insulating layer 7c having the wiring 8c buried therein is preferably a low-dielectric constant film. As the interlayer insulating layer, an insulating material containing Si and at least one element selected from C, O, and H or a film material prepared using such constituent elements and at the same time having pores in the film may be used. The insulating material used here preferably has a pore size small enough to prevent penetration, into the film, of gas phase materials used for the formation of a metal electrode or a capacitor insulating film during a capacitor formation step. Since many gas phase materials have a size of from 0.5 to 1 nm, the pore size of the insulating material is required to be 1 nm or less, desirably 0.5 nm or less. In order to reduce the parasitic capacitance between wirings not only in the logic circuit 100 and the memory circuit 200, the relative dielectric constant of the interlayer insulating layer is preferably lower than that of a silicon oxide film. This makes it possible to reduce the parasitic capacitance between wirings and reduce delay of circuit operation. Of the interlayer insulating layers, all the interlayer insulating layers in the same layer as the capacitor 19 are preferably composed of a low-dielectric-constant film. For example, all the insulating layers of two or more wiring layers which lie in the same layer as the capacitor 19 are preferably insulating layers having a relative dielectric constant lower than that of a silicon oxide film. This makes it possible to reduce the parasitic capacitance between wirings or between contacts and increase the operation rate of a semiconductor device.

Insulating films corresponding to the cap layers 6a to 6d are more preferably insulating films made of silicon, carbon, and nitrogen or films obtained by stacking films having these elements and at the same time, having resistance against metal diffusion (metal diffusion prevention films). The cap layer is, for example, an SiC film or an SiON film.

In the logic circuit 100, the active element 3b and the wiring 8a which is the bottom layer of wirings configuring the multilayer wiring are electrically coupled by series coupling of two contacts, that is, the cell contact 10c and the coupling contact 13. Such a structure makes it possible to form, on the same semiconductor substrate 1, both the logic circuit 100 and the memory circuit 200 and at the same time, make the design parameters of them identical to each other.

Next, the structure of the capacitor 19 will be described. The capacitor 19 is a memory element configuring the memory circuit 200. A plurality of capacitors 19 may be arranged in the memory circuit 200. The capacitor 19 has a lower electrode 14, a capacitor insulating film 15, and an upper electrode 16. The capacitor 19 is formed in a hole 23 formed in the multilayer wiring layer. The hole 23 extends across a cap layer 6, the contact interlayer insulating layer 5c, the cap layer 6a, the interlayer insulating layer 7a, the cap layer 6b, the interlayer insulating layer 7b, and the protective layer 80. This means that the capacitor 19 extends across one contact layer and two wiring layers. In other words, the capacitor 19 is placed in the same layers as the upper end portion of the coupling contact 13, the wiring 8a, and the wiring 8b. In the present embodiment, the number of insulating layers through which the capacitor 19 penetrates is determined in consideration of the capacitance of the capacitor and is not particularly limited.

At the periphery of the upper end portion of the capacitor burying recess (hole 23), the protective layer 80 is formed. The hole 23 shown in FIG. 2 has, at the periphery of the upper end portion thereof, the protective layer 80. The protective layer 80 may be, in a planar view, present only at one portion of the periphery of the opening portion of the hole 23 or may extend throughout the periphery thereof.

The protective layer 80 covers the respective end portions of the capacitor insulating film 15 and the upper electrode 16 located outside the opening portion of the hole 23. In other words, the end portion of the protective layer 80 is, in a planar view, located outside the respective end portions of the capacitor insulating film 15 and the upper electrode 16. This means that the end portion of the protective layer 80 is located between the capacitor 19 and the wiring 8b. In the present embodiment, by extending the end portion of the protective layer 80 outside the opening portion of the hole 23, it is possible to secure an alignment margin for exposure and at the same time, to secure a burying margin in a trench (recess 42). In the present embodiment, in a cross-sectional view, the horizontal thickness of the protective layer 72a is preferably greater than the perpendicular thickness.

The protective layer 80 has a protective layer 72a, a protective layer 72b, and a protective layer 78a. The protective layer 80 (at least the protective layer 72a and the protective layer 72b) has a higher dielectric constant than that of the interlayer insulating layer 7b. In other words, the protective layer 80 has higher mechanical strength and higher chemical stability than the interlayer insulating layer 7b lying in the same layer. In general, a high dielectric constant means high mechanical strength. In the present embodiment, the term "high mechanical strength" means that when the protective layer is subjected to a selective removal method such as dry etching or a deposition method such as CVD, deformation of an opening shape in the film or quality change of the film is suppressed compared with a low-k film. The interlayer insulating layer 7b is an interlayer insulating layer which lies in the same layer as the protective layer 80 and at which the upper end portion of the hole 23 is located. The dielectric constant of each of the protective layer 72a and the protective layer 72b is not particularly limited and is for example, preferably 3.0 or greater but not greater than 4.5.

In the present embodiment, the capacitor 19 means a region in which the lower electrode 14 and the upper electrode 16 are placed opposite to each other. In addition, in the present embodiment, the term "a first member and a second member are placed in the same layer" means that in a cross-sectional view, a region of the first member in a film thickness direction and a region of the second member in a film thickness direction may overlap at least partially in the in-layer direction. This embraces, for example, a complete overlap mode and a partial overlap mode.

The hole 23 is an opening portion formed in at least the protective layer 80, more preferably an opening portion extending across the protective layer 80, the cap layer, and the interlayer insulating layer. The protective layer 80 is formed on the bottom surface of the trench 28 (which may hereinafter be called "upper coupling wiring trench") in which the upper coupling wiring 18 is buried. The trench 28 is an opening portion formed in the interlayer insulating layer 7b and has a wider opening area than that of the hole 23. Such a hole 23 is formed in the protective layer 80 arranged on the bottom surface of the trench 28.

The inner wall surface of the hole 23 forms a continuous surface with the upper surface of the protective layer 80 formed on the bottom surface of the trench 28. This continuous surface embraces a bent surface or a convex-concave surface. The hole 23 is formed in the interlayer insulating layer 7b lying in the same layer as the trench 28. The upper end portion of the capacitor 19 can therefore be increased up to the interlayer insulating layer in which an extraction wiring portion 18a is buried. Accordingly, the resulting semiconductor device can have improved capacitor capacitance.

The capacitor insulating film 15 and the upper electrode 16 extend from the inner wall of the hole 23 to the bottom surface of the trench 28. The capacitor insulating film 15 and the upper electrode 16 are placed on the lower electrode 14 on the inner wall of the hole 23 and at the same time, placed on the extraction wiring portion 18a on the bottom surface of the trench 28.

The trench 28 has, on the bottom surface thereof, protective layers 72a and 72b. The upper coupling wiring 18 is composed of an extraction wiring portion 18a and a buried electrode 18b. The extraction wiring portion 18a is made of the same member as the buried electrode 18b and at the same time is seamless. In other words, the extraction wiring portion 18a is formed in the same step as that of the buried electrode 18b. This extraction wiring portion 18a is placed over and along the protective layers 72a and 72b. In other words, the extraction wiring portion 18a extends from the side wall of the hole 23 to the outside thereof. The extraction wiring portion 18a is placed on the upper electrode 16 over the upper surfaces of the protective layers 72a and 72b. The buried electrode 18b is placed along the upper surface of the upper electrode 16 in the hole 23. The buried electrode 18b is buried in a portion of a space of the hole 23 which has remained after burying of the capacitor 19. Incidentally, the upper electrode 16 and the upper coupling wiring 18 may have, therebetween, a barrier metal film.

The protective layer 80 has a protective layer 72a, a protective layer 72b, and a buried insulating member 78b. The protective layer 72a is composed of the same member as the protective layer 72b. In other words, they are formed in the same step. The protective layer 72b is placed between two capacitors 19. The protective layer 72b is placed on the outer wall of the lower electrode 14 and on the bottom surface of the capacitor insulating film 15. The protective layer 72a is placed on the outer wall of the capacitor 19. The protective layer 72a may be, in a cross-sectional view, U-shaped. The protective layer 72a is placed on the outer wall of the upper end portion of the lower electrode 14, on the bottom surface of the upper electrode 16, and on the bottom surface and the inner wall of the trench 28. In the U-shaped protective layer 72a, a recess 42 is formed. A protective layer 78a is buried in the recess 42. The protective layer 78a and the protective layer 72a may have therebetween an interface. The interface can be observed using, for example, SEM (Scanning Electron Microscope) or TEM (Transmission Electron Microscope). The protective layer 78a is made of, preferably the same material as the protective layer 72a but it may be made of a different material. The protective layer 78a has, for example, in a cross-sectional view, a quadrangular shape such as rectangular shape. This protective layer 78a is at least placed on the end portion of the capacitor insulating film 15, on the end portion of the upper electrode 16, and on the end portion of the extraction wiring portion 18a, and further it may be placed on the end portion of the cap layer 74.

The film thickness of the protective layer 72b is not particularly limited and it is, for example, preferably ½ or greater of the depth of the wiring trench. This wiring trench is placed in the same layer as the upper coupling wiring 18 and is placed in the logic circuit region. In the present embodiment, the wiring 8b is buried in the wiring trench. One example of the film thickness of the protective layer 72b is, for example, preferably 20 nm or greater but not greater than 60 nm. By adjusting the film thickness of the protective layer 72b to the lower limit or greater, variation in the shape of the hole 23 can be suppressed sufficiently.

The upper coupling wiring 18 has thereon a cap layer 74. The mode is not limited to it and the upper coupling wiring is not always required to have this cap layer 74. The cap layer 74 may extend over the upper surface of the extraction wiring portion 18a and the upper surface of the buried electrode 18b. This cap layer 74 is formed inside the hole 23. In the present embodiment, the cap layer 74 is placed between the buried electrode 18b and the buried insulating member 78b.

In the hole 23, the capacitor 19, the buried electrode 18b, the cap layer 74, and the buried insulating member 78b are buried. The buried insulating member 78b may be placed over the buried electrode 18b. The upper electrode 16 of the capacitor 19 is formed along the inner wall of the recess (hole 23) and it has an end portion on the protective layer 80. The buried insulating member 78b is preferably buried fully in the space of the recess (hole 23) which has remained after the lower electrode 14, the capacitor insulating film 15, the upper electrode 16, and the buried electrode 18b have been buried. The buried insulating member 78b is preferably made of the same member as the protective layer 78a and it is preferably formed in the same strep as that of the protective layer 78a.

In the present embodiment, burying of the buried insulating member 78 in the hole 23 means that compared with absence of the buried insulating member 78b, the extraction wiring portion 18a has a small film thickness. By decreasing the film thickness of the extraction wiring portion 18a, the height of the capacitor 19 can be increased. Decrease in the film thickness of the extraction wiring portion 18a therefore leads to increase the capacitor capacitance. The film thickness of the extraction wiring portion 18a suggests that when a manufacturing process as described below is employed, the film thickness is smaller when the buried insulating member 78b is buried in a portion of the hole 23, compared with when the buried electrode 18 is buried fully in the hole 23. An occupation ratio of the buried insulating member 78b in the space of the hole 23 is, for example, preferably 10% or greater, more preferably 20% or greater and on the other hand, it is preferably 50% or less, more preferably 40% or less. The space occupation ratio can be determined, for example, from the maximum value of the cross-sectional area. The cross-sectional area can be calculated, for example, from an SEM image. By controlling the space occupation ratio of the buried insulating member 78b to fall within the above range, the balance between the film thinness of the extraction wiring portion 18a and the film formation property is excellent.

The height of the capacitor 19 is higher when neither cap layer 74 nor the cap layer 82 is formed. In addition, by adjusting the film thickness of the cap layer 74 to not greater than the film thickness of the cap layer 6c, the capacitor 19 can have an increased height. This makes it possible to increase the capacitance of the capacitor.

In the present embodiment, the cap layer 74 is formed on the upper coupling wiring 18. The cap layer 74 (first cap layer) is preferably more etch-resistant than the protective layer 80. The cap layer 74 is formed between the buried electrode 18b and the buried insulating member 78b. This layer contributes to prevention of the upper surface of the upper coupling wiring 18 from being roughened by etching or the like. In addition, it contributes to prevention of the height of the upper surface of the upper coupling wiring 18 from varying among products. As a result, an increase in resistance or variation in resistance is suppressed and a semiconductor device having excellent reliability can be realized. The cap layer 74 has, in addition, a metal diffusion preventing property. Even if the metal material of the upper coupling wiring 18 contains Cu, diffusion of Cu can be prevented. As a result, a semiconductor device excellent in reliability can be realized. In addition, since the buried insulating member 78b fills the remaining space of the hole 23, the using amount of the upper coupling wiring 18 can be reduced, leading to a reduction in the manufacturing cost of the semiconductor device.

The upper surface of the extraction wiring portion 18a is preferably flush with the upper surface of the protective layer 78a and the upper surface of the cap layer 6c. The extraction wiring portion 18a has thereon a cap layer 74. The upper surface of the cap layer 74 is preferably flush with the upper surface of the protective layer 78a and the upper surface of the cap layer 6c. In the present embodiment, the term "flush with" means that when the height of the surface is measured by the below-described method, the maximum difference in the height of the surface relative to the average height of the surface is preferably 30 nm or less, more preferably 20 nm or less, still more preferably 10 nm or less. Examples of the measuring method include a method of obtaining a cross-sectional image including the upper surface 30 of the upper coupling wiring 18 and the upper surface 34 of the cap layer 6c by using, for example, SEM (Scanning Electron Microscope) or TEM (Transmission Electron Microscope) and measuring variation in the height of step difference from the cross-sectional image; and a method of measuring the profile of the height in a plane direction by using a profiler widely used in an inspection step in the manufacturing steps of a semiconductor device.

Although not illustrated, a difference in height between the upper surface of the extraction wiring portion 18a and the upper surface of the wiring 8b is preferably 30 nm or less, but the difference is not particularly limited to it. On the upper surface of the upper coupling wiring, excessive etching or insufficient etching is therefore suppressed. The upper coupling wiring and the buried electrode are made of the same material and they are integrated with each other. During formation of the upper coupling wiring, etch back of the buried electrode in order to secure a space for the formation of the upper coupling wiring is therefore not necessary. Accordingly, excessive etching of the buried electrode is suppressed. Thus, the present invention provides a structure excellent in yield.

The cap layer 74 (first cap layer), the protective layer 78a, and the cap layer 6c (second cap layer) have, on the upper surfaces thereof, a cap layer 82 (third cap layer). This cap layer 82 extends continuously from the memory circuit region to the logic circuit region. The cap layer 82 and the cap layer 74 and/or the cap layer 82 and the cap layer 6c may have therebetween an interface.

The lower electrode 14 and the upper electrode 16 sandwich the capacitor insulating film 15 therebetween and function as an electrode for a parallel plate capacitor. For the formation of the lower electrode 14 or the upper electrode 16, using a refractory metal such as titanium or tantalum or a nitride thereof as the material is more preferred. It is preferred to use a material capable of improving the crystallinity of the capacitor insulating film 15.

As the material of the capacitor insulating film 15, a film having a higher relative dielectric constant than that of a silicon nitride film such as a film made of zirconium dioxide ($ZrO_2$) or zirconium aluminate ($ZrAlO_x$), or a film obtained by adding, to zirconium dioxide, a lanthanoid such as Tb, Er, or Yb, an oxide containing any one of Zr, Ta, Hf, Al, Nb, and Si, an oxide having any of them as a main component, and high dielectric constant materials containing $SrTiO_3$ and having a perovskite structure. An increase in the relative dielectric constant of the capacitor insulating film 15 leads to an increase in the electrostatic capacitance of the capacitor 19.

In the present embodiment, the upper coupling wiring (the extraction wiring portion 18a and the buried electrode 18b) can be composed of, for example, a material containing W, TiN, Cu, and Al, a material having any of these metal elements as a main component (for example, 95 mass % or greater), or a material made of these metal elements. In any case, inevitable atoms mixed during the manufacturing steps are permitted. In the present embodiment, the capacitor 19 having improved reliability can be obtained by using a metal material such as W or TiN as a metal material having a stable burying property or chemical stability. When Cu is used, a cap layer 74 covering the upper coupling wiring 18 may be formed.

The lower limit of the height of the capacitor 19 in the layer thickness direction of the multilayer wiring layer (which may hereinafter be called "layer thickness direction" simply) is at least one layer, more preferably at least two layers. The upper limit of the height of the capacitor 19 in the layer thickness direction is not particularly limited. The "one layer" is composed of one wiring layer (interlayer insulating layer 7a or 7b) in the multilayer wiring layer and one cap layer (cap layer 6a or 6b) formed between wiring layers. The capacitor 19 of the present embodiment extends across a multilayer wiring layer corresponding to layers, but it may extend across any number of multilayer wirings. However, two layers or so are preferred because when many wiring layers occupy the memory circuit formation region, lack of a wiring resource may occur. The capacitor 19 may be buried in the contact insulating layer.

To the extraction wiring portion 18a of the capacitor 19, a wiring 201 having a fixed potential is coupled. The potential of the fixed-potential wiring 201 can be set freely by a designer of the memory circuit. According to the first embodiment, a plurality of signal wirings 202 is placed above the capacitor 19.

In an upper surface view, the upper coupling wiring 18 has the extraction wiring portion 18a extending outside the region in which the lower electrode 14 is provided and coupling of the capacitor 19 to the fixed-potential wiring in order to function the capacitor 19 as a memory cell of the memory circuit 200, coupling of the wiring 201 having a fixed potential to the extraction wiring portion 18a is required. Designers of this semiconductor device can therefore realize a free wiring layout by using, among upper-level wiring layers of the capacitor 19, a wiring layer in the region in which the lower electrode 14 is provided. For example, a signal wiring 202 can be utilized as a shunt wiring of a word line or bit line of the memory circuit 200.

The wiring 201 having a fixed potential and the signal wiring 202 configuring the memory circuit 200 and the wiring 8c configuring the logic circuit 100 may have thereon a wiring layer composed of a wiring and an interlayer insulating layer. This makes it possible to provide a semiconductor device by using an ordinarily employed multilayer wiring structure of a semiconductor device. It is evident for those skilled in the art that a semiconductor device having such a configuration can be manufactured, so that a structure of wirings situated above the wiring layer in which the wiring 201 having a fixed potential, the signal wiring 202, and the wiring 8c have been formed is not shown.

Next, a manufacturing method of the semiconductor device of the first embodiment will be described specifically referring to drawings. FIGS. 3 to 22 are views showing the steps of the manufacturing method of the semiconductor device of the first embodiment. The manufacturing method of the semiconductor device of the present embodiment includes the following steps. First, an insulating layer (interlayer insulating layer 7b) is formed on a substrate (semiconductor substrate 1). Then, a wiring 8b is formed in the insulating layer (interlayer insulating layer 7b). Next, the insulting layer (interlayer insulating layer 7b) in a memory circuit formation region different from a logic circuit formation region in which the wiring 8b has been formed is selectively removed to form a trench 28. A protective layer 72 having a dielectric constant higher than that of the insulating layer (interlayer insulating layer 7b) is formed in the trench 28. At least the protective layer 72 is partially removed to form a recess (hole 23). Then, a lower electrode 14, a capacitor insulating film 15, and an upper electrode 16 are buried in the recess (hole 23) to form a capacitor 19. Next, an upper coupling wiring 18 to be coupled onto the capacitor 19 is formed. In such a manner, a memory circuit 200 and a logic circuit 100 are formed on the same substrate (semiconductor substrate 1).

Figure 3:
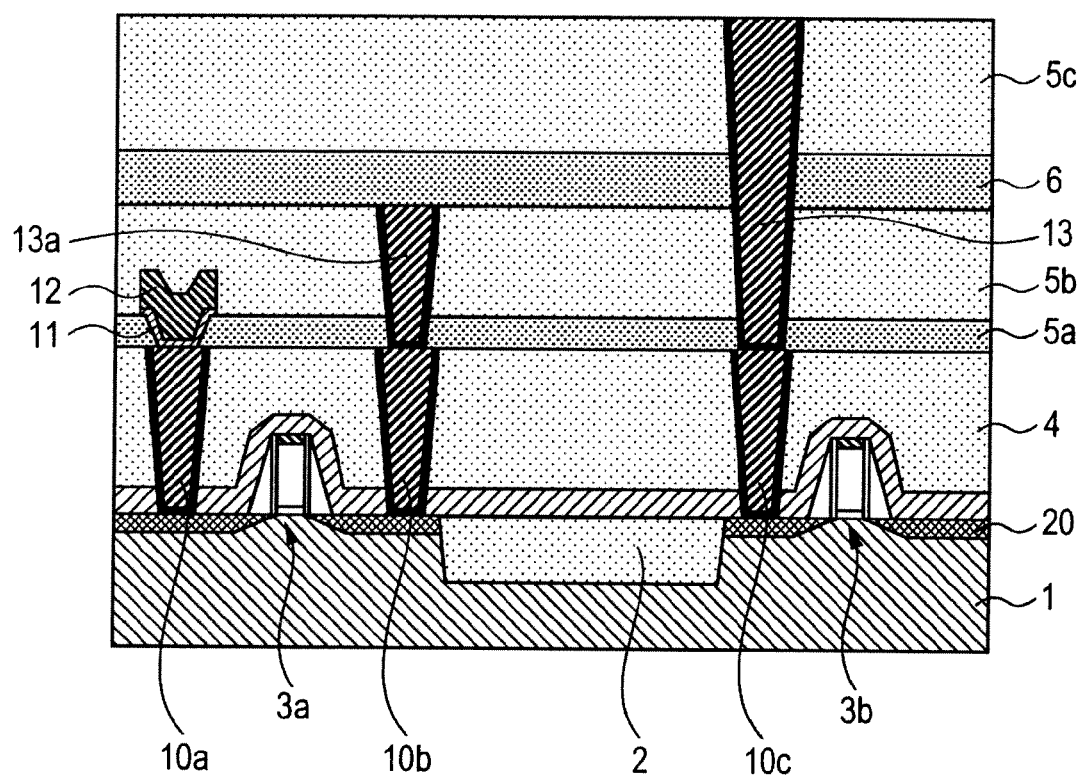
FIG. 3 is a cross-sectional view showing a step of a manufacturing procedure of the semiconductor device according to the first embodiment.

Next, the steps of the present embodiment will be described more specifically. First, as shown in FIG. 3, an element isolation film 2 and active elements 3a and 3b are formed on a semiconductor substrate 1 by the ordinarily employed method. On these active elements, a contact interlayer insulating layer 4 is formed. In this contact interlayer insulating layer 4, cell contacts 10a, 10b, and 10c are buried. Described specifically, in the contact interlayer insulating layer 4, opening portions to be cell contacts are formed by photolithography. These opening portions are filled with a contact material by using CVD (Chemical Vapor Deposition). Next, CMP (Chemical Mechanical Polishing) is conducted to remove surplus contact materials to form the cell contacts 10a, 10b, and 10c, respectively. Then, a contact interlayer insulating layer 5a for bit contact is deposited on the contact interlayer insulating layer 4. Then, in the contact interlayer insulating layer 5a, an opening portion for a bit contact 11 is formed by photolithography and reactive ion etching. Then, after deposition of a metal material containing W, having W as a main component, or composed of W by using CVD, photolithography and reactive ion etching are conducted to form the bit contact 11 and a bit line 12. A contact interlayer insulating layer 5b is then deposited, followed by planarization by CMP. In a manner similar to that employed for the formation of the cell contact 10, a capacitor contact 13a is formed in the contact interlayer insulating layer 5b. Next, a cap layer 6 and a contact interlayer insulating layer 5c are formed on the contact interlayer insulating layer 5b. Then, a coupling contact 13 penetrating through the contact interlayer insulating layer 5a, the cap layer 6, and the contact interlayer insulating layer 5c is formed. The steps described above are conducted to realize the structure shown in FIG. 3.

In FIG. 3, diffusion layers have, on the surface thereof, an alloy of silicon with a metal such as cobalt, nickel, or platinum, which alloy is usually called silicide. As the gate electrode of the active element 3a or 3b, an ordinarily used polysilicon electrode or a partially metal silicided polysilicon electrode may be used, or a metal gate electrode which has been developed actively in recent years may be used. As the formation method of the metal gate electrode, a gate first method, a gate last method, and the like are known, but either one may be used for the memory circuit and the logic circuit in the present embodiment. FIG. 3, therefore, shows a more common polysilicon gate. In the ordinarily used manufacturing method of a semiconductor device, the cell contacts 10a, 10b, and 10c, the bit contact 11, the bit line 12, the capacitor contact 13a, the coupling contact 13 are often made of tungsten. The scope of right of the invention is however not impaired by the material of the contact or bit line. For example, the contact or bit line may be made of copper or an alloy having copper as a main component. Moreover, when a contact is formed by burying a contact material in the opening portion thereof, a barrier metal such as titanium or a nitride thereof is usually formed on the bottom surface of the opening portion. It does not have an influence on the configuration or advantage of the present embodiment so that it is not illustrated. This means that the structure and manufacturing method of the present embodiment are characterized by the structure and the formation method of the capacitor and the logic circuit wiring located in a substantially same layer as the capacitor and other portions configuring the logic circuit and the memory circuit do not impair the structure and advantage of the present embodiment so that an ordinarily employed structure and manufacturing method of a semiconductor device may be used.

As at least one of the contact interlayer insulating layers 4, 5a, 5b, and 5c, the low-dielectric-constant film described above may be used. As these contact interlayer insulating layers, a stack of low-dielectric-constant films different in kind may be used. Deposition of a low-dielectric-constant film (for example, an insulating film deposited by surface reaction by using the plasma polymerization process) excellent in step-difference burying property as a lower layer can improve a burying property between narrow-pitch gates, thereby providing a semiconductor device having improved reliability.

Figure 4:
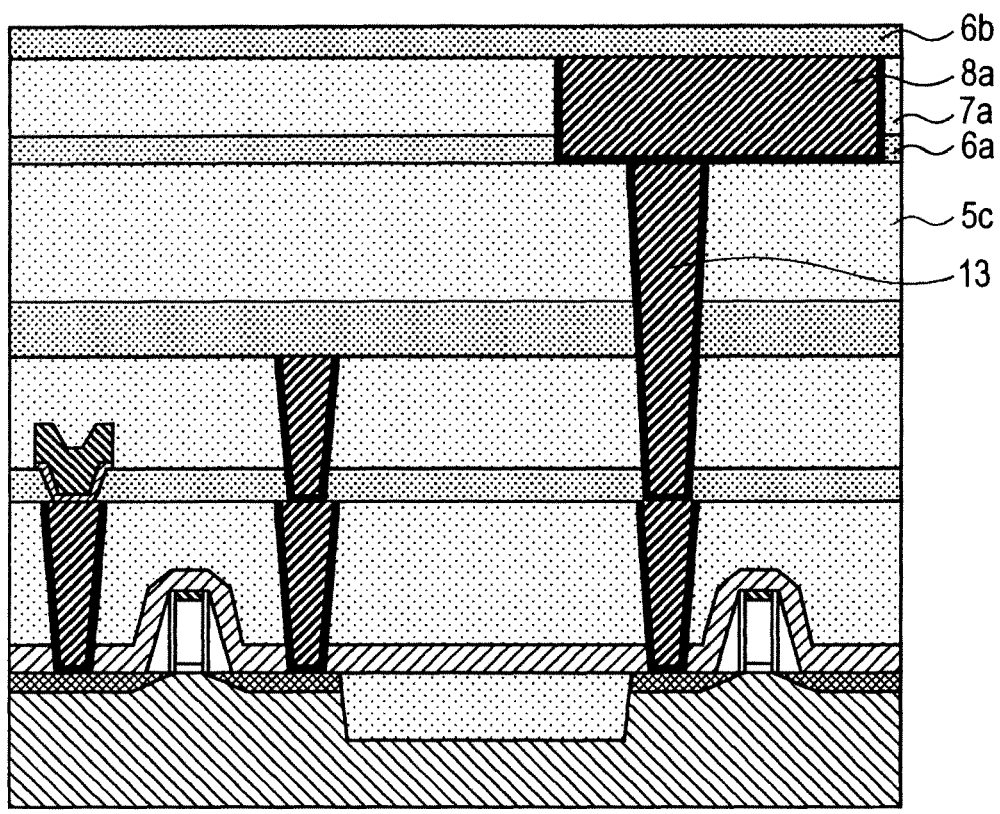
FIG. 4 is a cross-sectional view showing a step of the manufacturing procedure of the semiconductor device according to the first embodiment.

Next, as shown in FIG. 4, a cap layer 6a and an interlayer insulating layer 7a are deposited on the contact interlayer insulating layer 5c. Then, by the related-art method, a wiring 8a is formed in the cap layer 6a and the interlayer insulating layer 7a. Then, a cap layer 6b is deposited on the interlayer insulating layer 7a and the wiring 8a.

Figure 5:
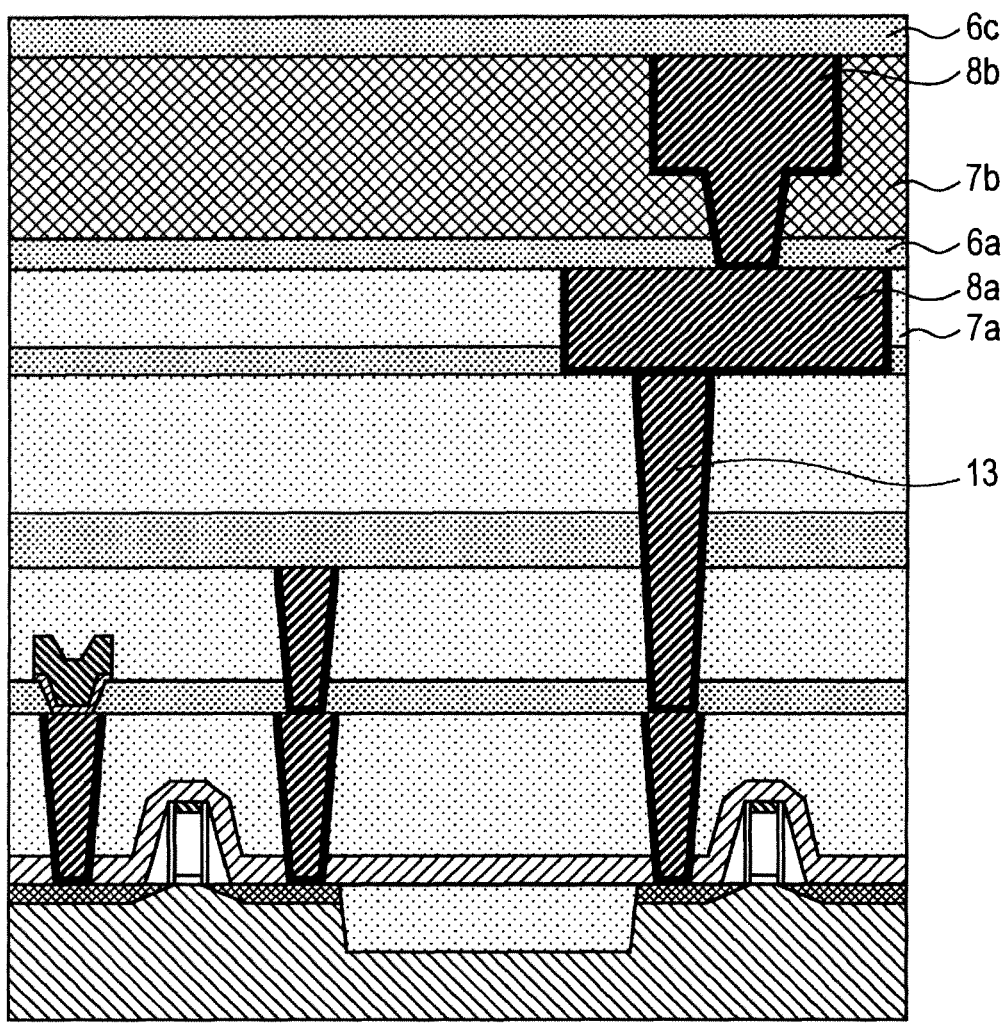
FIG. 5 is a cross-sectional view showing a step of the manufacturing procedure of the semiconductor device according to the first embodiment.

Next, as shown in FIG. 5, an interlayer insulating layer 7b is deposited on the cap layer 6b. The cap layer 6b is preferably an insulating film functioning as an etching stopper providing a high etching selectivity to the interlayer insulating layer 7b when the interlayer insulating layer 7b is subjected to reactive ion etching, but it is not always necessary in the structure of the present embodiment. The interlayer insulating layer 7b may be made of the material same as or different from that of the interlayer insulating layer 7a. The interlayer insulating layer 7b is preferably a low-dielectric-constant film. In the present embodiment, the term "made of the material same as" embraces a mode in which two materials have an utterly same composition and a mode in which the main component contained in an amount of 50% or greater has the same composition (in other words, a subtle difference of the composition of a trace component is permitted insofar as the same advantage can be produced).

Then, after formation of a hard mask not illustrated in the drawing on the interlayer insulating layer 7b, a multilayer resist layer composed of a bottom resist (flat film), a low-temperature oxide film, an antireflection film, and a photoresist, which are not illustrated in the drawing, is formed further. A via pattern of a desired logic circuit wiring is transferred using photolithography to form an opening portion.

Next, with the photoresist as a mask, reactive ion etching or the like is conducted to form an opening portion of a via. Then, the multilayer resist layers are removed. For example, after removal of the photoresist and the like by ashing, the hard mask is left on the interlayer insulating layer 7b.

Then, on the hard mask, a multilayer resist layer is formed. An opening portion of a desired wiring pattern is formed in this photoresist 27b by photolithography.

Next, with the photoresist as a mask, reactive ion etching or the like method is conducted to form an opening portion of the wiring. After formation of the opening portion of the wiring, the interlayer insulating layer 7b is etched under etching conditions under which an etching rate to the cap layer 6b is higher than that to the interlayer insulating layer 7b to form a coupling opening portion with the wiring 8a of the logic circuit. Then, the multilayer resist layer is removed. Although not illustrated, after formation of the opening portion of the wiring, the hard mask may be removed by reactive ion etching.

Next, a barrier metal film and a conductive film are buried in the opening portion of the logic circuit wiring simultaneously. As the material configuring the barrier metal film, any of titanium, tantalum, or ruthenium, nitride thereof, or a film stack of them may be used. The barrier metal film has preferably a configuration not permitting diffusion of the conductive film. As the conductive film, materials ordinarily used for forming wirings of a semiconductor device such as copper and an alloy having copper as a main component may be used.

Next, surplus portions of the conductive film, the barrier metal film, and the hard mask are removed selectively by using CMP or the like method. The wiring 8b having a damascene structure is thus formed in the interlayer insulating layer 7b. The wiring 8b may have either a single damascene structure or a dual damascene structure, but it has preferably a low resistance dual damascene structure.

Next, a cap layer 6c is deposited so as to cover at least the upper surface of the wiring 8b. The cap layer 6c is, similar to the cap layers 6a and 6b, preferably an insulating film not permitting diffusion of a material configuring the wiring 8b. It may be, for example, an insulating film containing elements such as silicon, carbon, and nitrogen or a film stack structure thereof.

Figure 6:
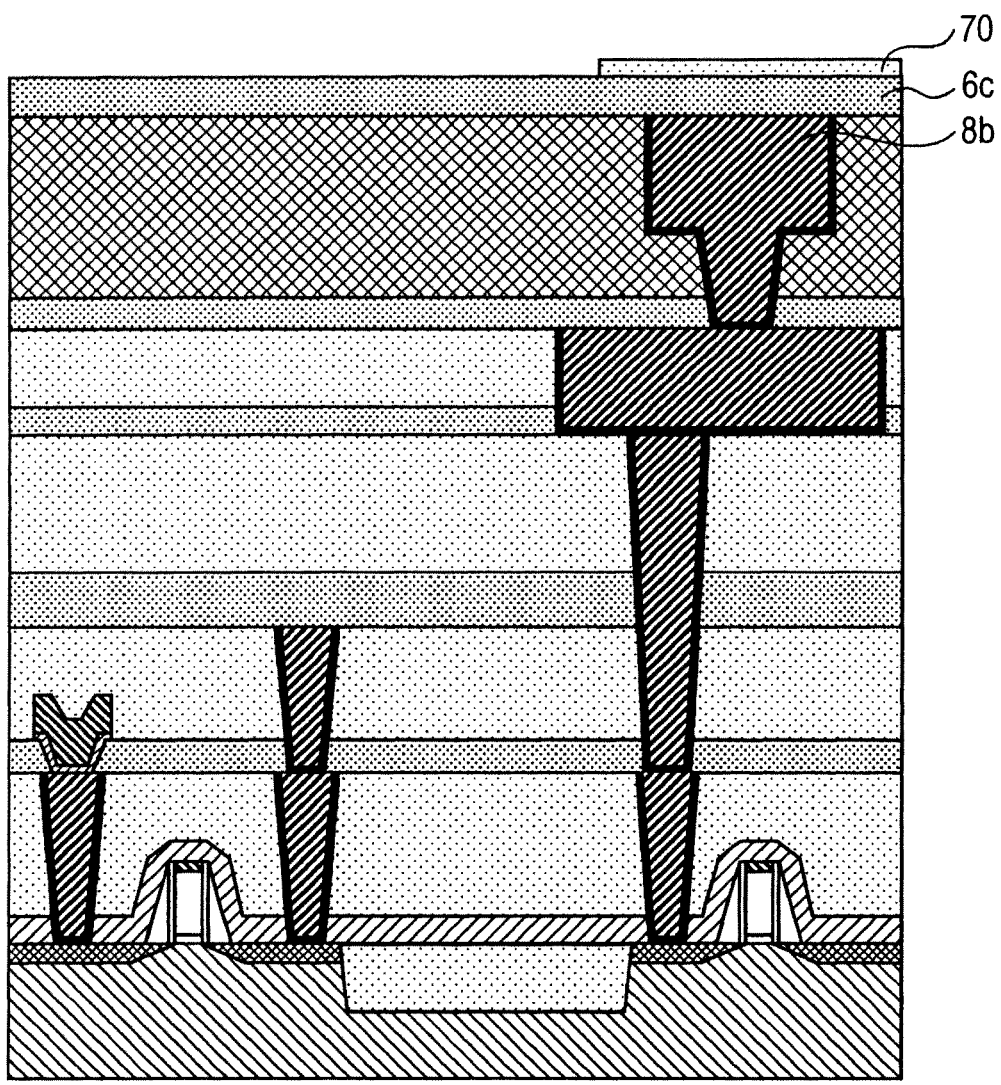
FIG. 6 is a cross-sectional view showing a step of the manufacturing procedure of the semiconductor device according to the first embodiment.

Next, as shown in FIG. 6, a hard mask 70 is formed on the cap layer 6c. The hard mask 70 has an opening pattern in a region in which an upper coupling wiring trench (which may also be called "plate trench") is formed. As the material of the hard mask 70, for example, a silicon oxide film can be used.

Figure 7:
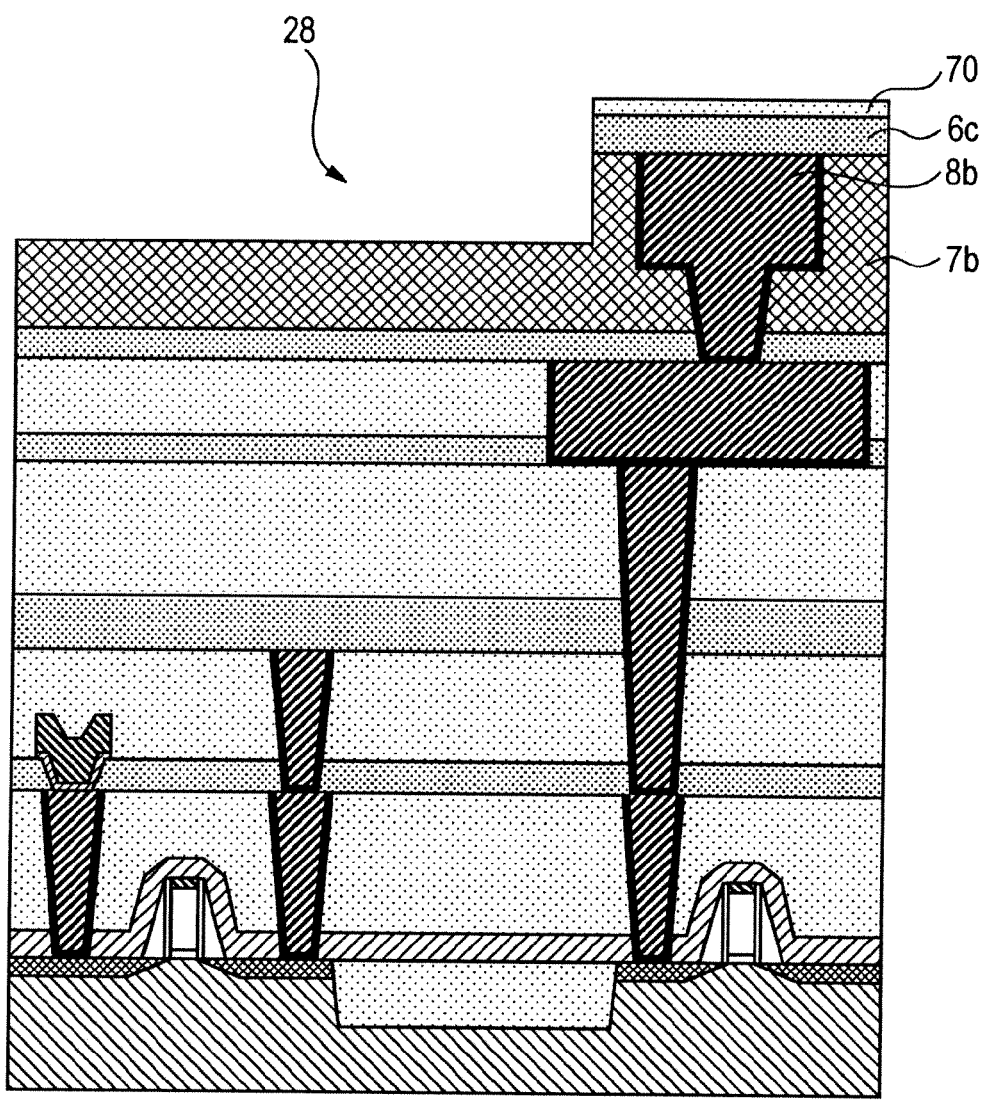
FIG. 7 is a cross-sectional view showing a step of the manufacturing procedure of the semiconductor device according to the first embodiment.

Then, as shown in FIG. 7, the interlayer insulating layer 7b is removed selectively to form an upper coupling wiring trench (trench 28). In the present embodiment, a portion of the interlayer insulating layer 7b may remain below the bottom surface of the trench 28. The depth of the trench 28 can be adjusted as needed.

Figure 8:
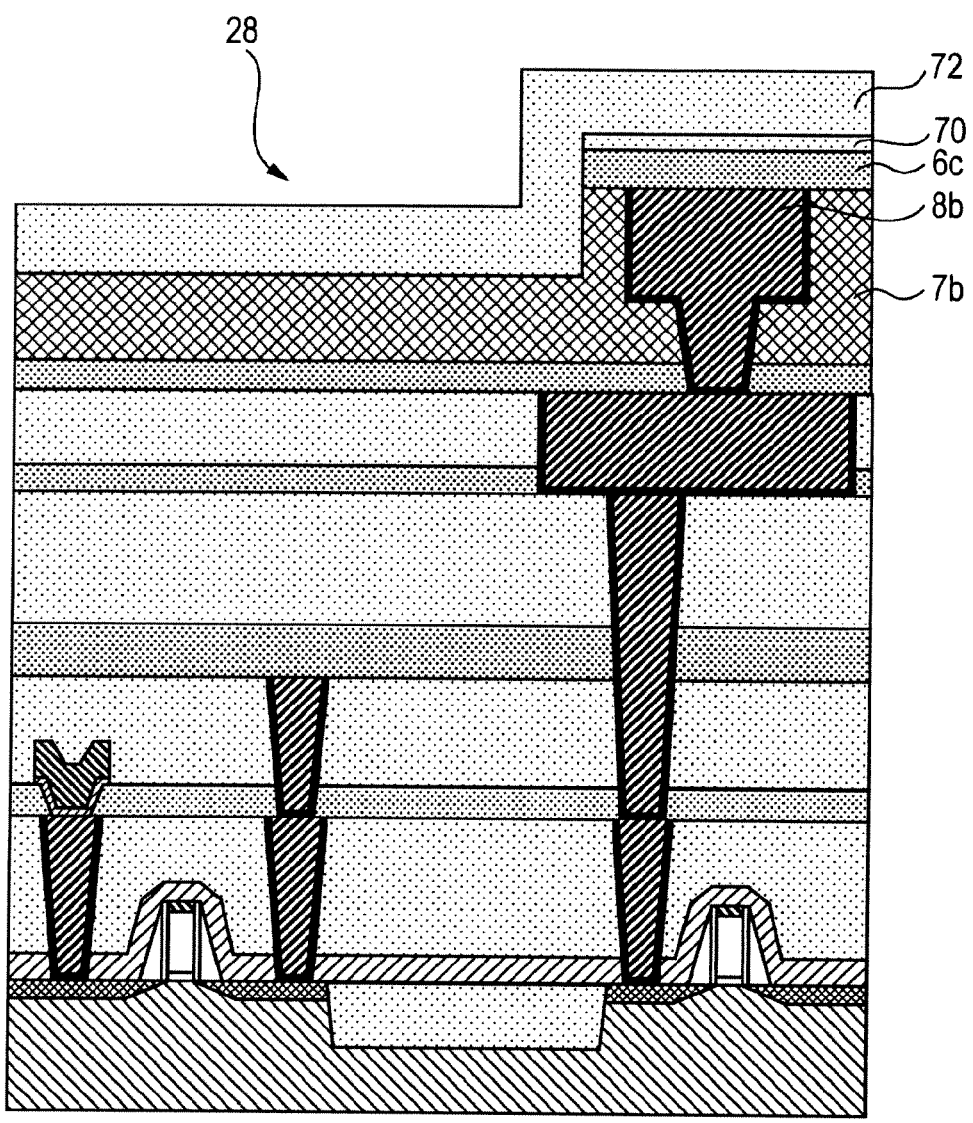
FIG. 8 is a cross-sectional view showing a step of the manufacturing procedure of the semiconductor device according to the first embodiment.

Next, as shown in FIG. 8, a protective layer 72 is formed on at least the bottom surface of the trench 28. The protective layer 72 protects the exposed portion of the trench 28. The protective layer shown in FIG. 8 is formed on the bottom surface and side walls of the trench 28 and the upper surface of the hard mask 70. Here, the height of the capacitor and the position of the upper surface of the upper coupling wiring can be controlled by the position of the bottom surface of the trench 28 and the film thickness of the protective layer 72. No particular limitation is imposed on the film thickness of the protective layer 72 and it is, for example, preferably 20 nm or greater but not greater than 60 nm. The dielectric constant of the protective layer 72 is required to be greater than that of the interlayer insulating layer 7b. No particular limitation is imposed on the material of the protective layer 72 and, for example, a silicon oxide film may be used. In this case, the interlayer insulating layer 7b is made of a material having a dielectric constant smaller than that of a silicon oxide film.

Figure 9:
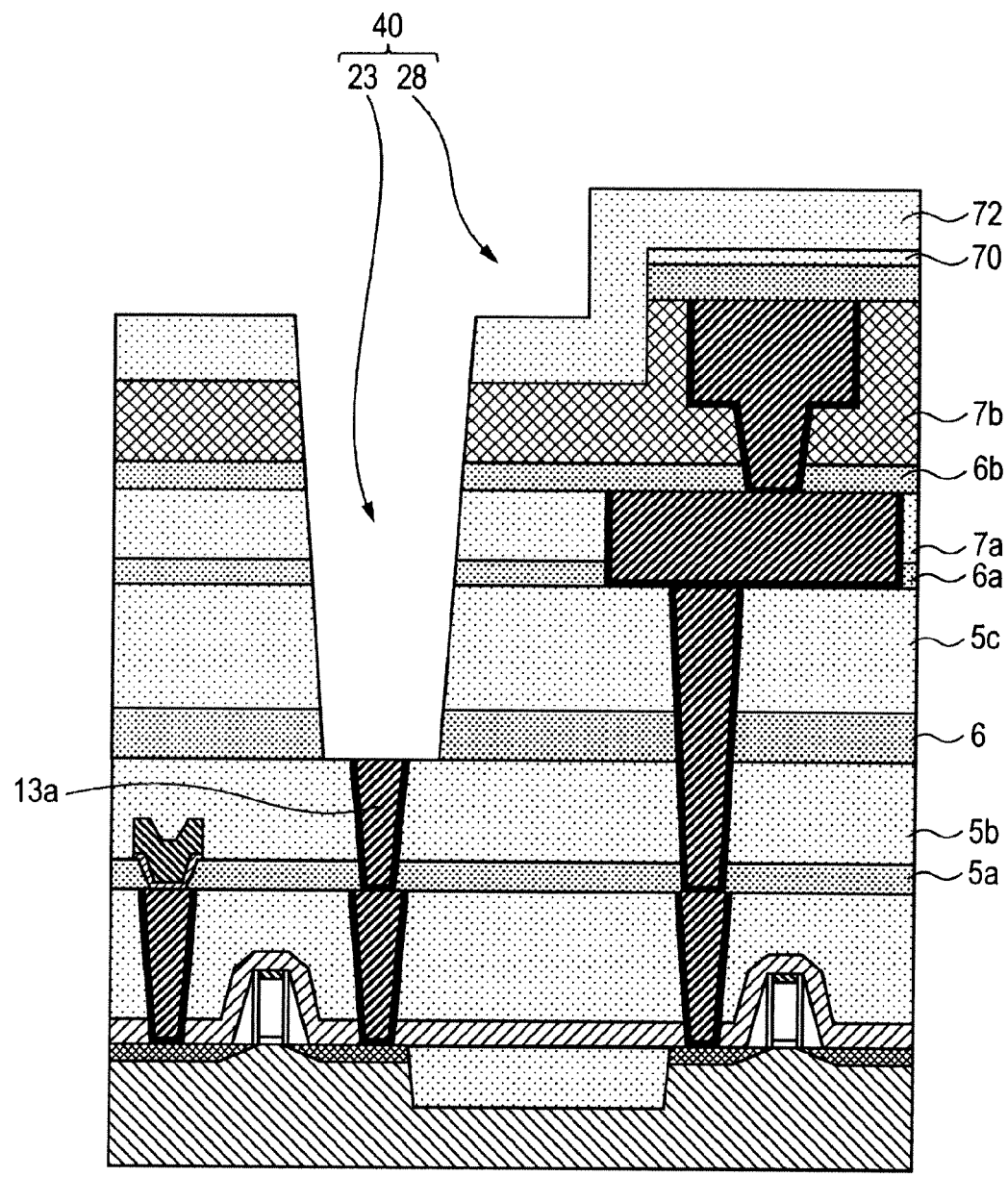
FIG. 9 is a cross-sectional view showing a step of the manufacturing procedure of the semiconductor device according to the first embodiment.

Next, as shown in FIG. 9, the protective layer 72 formed on the bottom surface of the trench 28 is removed partially. In the present embodiment, the protective layer 72, the interlayer insulating layer 7b, the cap layer 6b, the interlayer insulating layer 7a, and the cap layer 6 are removed partially to form a capacitor burying recess (hole 23). From the bottom surface of the hole 23, the upper surface of the capacitor contact 13a is exposed. The hole 23 is formed in the protective layer 72 on the bottom surface of the trench 28. The spaces of the hole 23 and the trench 28 may be called "recess 40", collectively.

In the present embodiment, the recess (hole 23) is formed in the protective layer 72 and the interlayer insulating layer 7b. The hole 23 can be formed using, for example, dry etching. During dry etching, the exposed portion of the upper surface of the interlayer insulating layer 7b is covered with the protective layer 72. The protective layer 72 is made of a material having a relatively high dielectric constant compared with the interlayer insulating layer 7b so that it becomes a member having high mechanical strength. The upper end portion of the opening portion of the hole 23 is formed in the protective layer 72 having high mechanical strength. Variation in the opening shape of the hole 23 among holes 23 or among products is therefore reduced, leading to suppression of variation in the height of the capacitor. As a result, a semiconductor device having less variation in capacitor characteristics can be realized.

Figure 10:
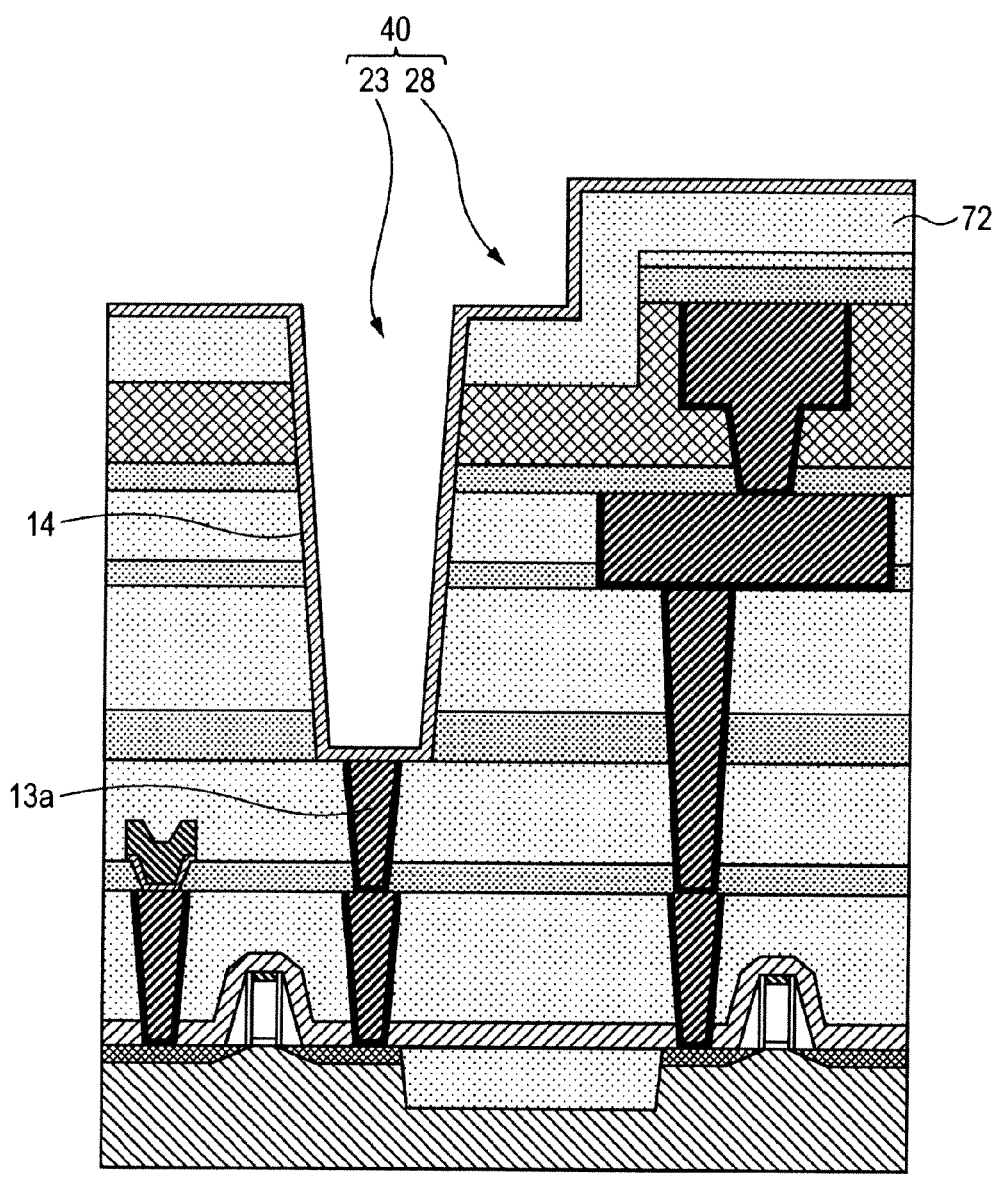
FIG. 10 is a cross-sectional view showing a step of the manufacturing procedure of the semiconductor device according to the first embodiment.

As shown in FIG. 10, a lower electrode 14 is deposited in the hole 23 and on the upper surface of the protective layer 72. The lower electrode 14 may be formed by a method ordinarily used for the formation of a semiconductor device such as CVD, sputtering, or ALD (Atomic Layer Deposition). Prior to the deposition of the lower electrode 14, surface etching is sometimes conducted by RF sputtering or the like to improve the contact property with the capacitance contact 13a, but such pretreatment does not impair the advantage of the invention so that details of it are not described herein. As the material configuring the lower electrode 14, refractory metals and nitrides thereof such as titanium, nitride of titanium, tantalum, and nitride of tantalum, and stacked structures thereof may be used. According to the manufacturing method of the present embodiment, a TiN film is used as the lower electrode 14.

When CVD, sputtering, ALD (Atomic Layer Deposition), or the like method is used, the exposed portion of the upper surface of the interlayer insulating layer 7b is covered with the protective layer 72. Since the protective layer 72 is made of a material having a higher dielectric constant than that of the interlayer insulating layer 7b, it becomes a chemically stable member. Variation in the opening shape of the hole 23 among the holes 23 or among products is reduced and variation in the height of the capacitor can be suppressed. As a result, a semiconductor device having less variation in capacitor characteristics can be realized. As described above, by covering the interlayer insulating layer which is a low-dielectric-constant film with the protective layer, deterioration in the low-dielectric-constant film during the capacitor formation process can be suppressed, leading to improvement in the yield of the semiconductor device.

Figure 11:
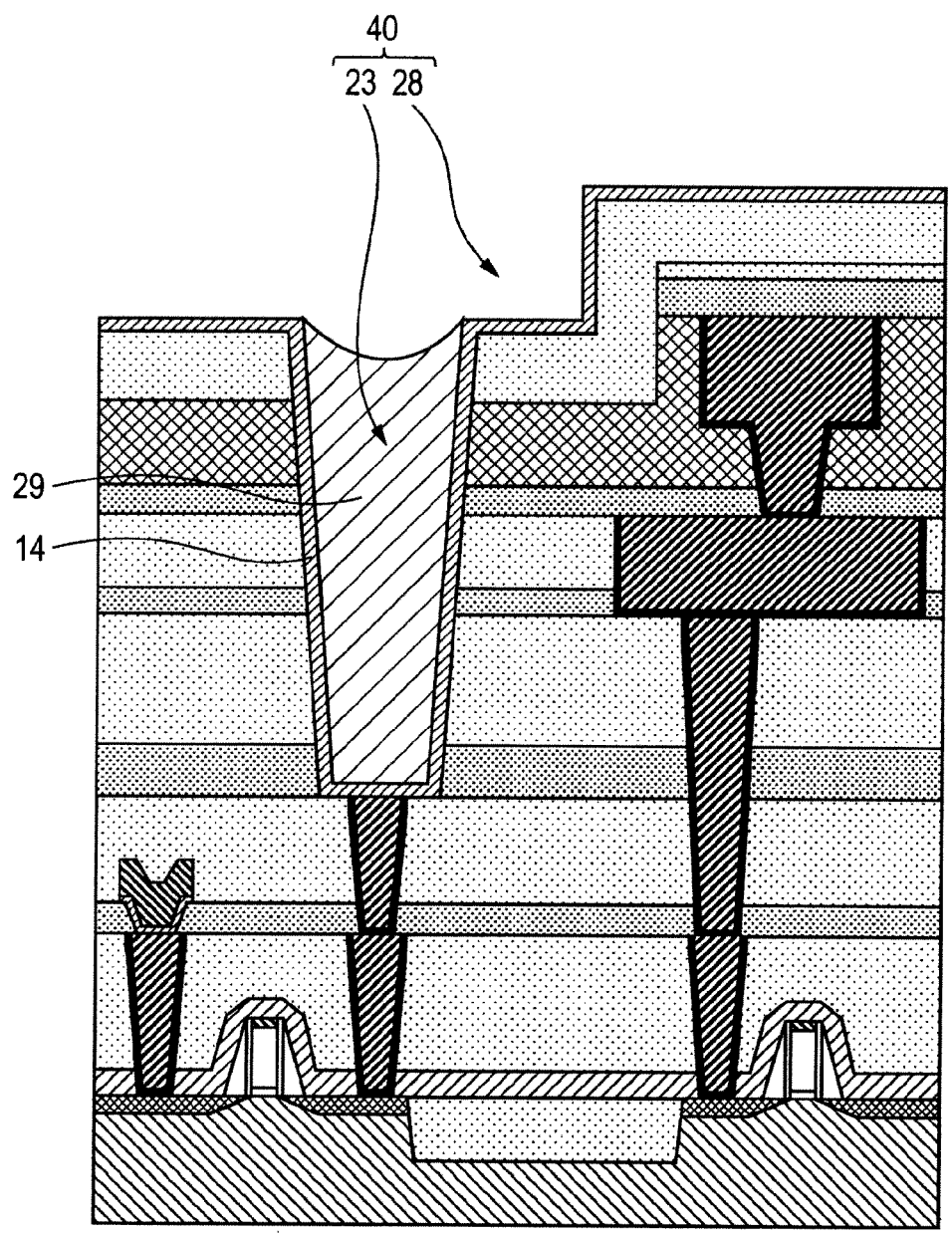
FIG. 11 is a cross-sectional view showing a step of the manufacturing procedure of the semiconductor device according to the first embodiment.

Next, as shown in FIG. 11, a photoresist 29 is buried, by the method of application or the like, in the hole 23 which has a cylinder-shaped capacitance and on which the lower electrode 14 has been deposited. It is preferred that the photoresist 29 is left only in the hole 23 and has a height not reaching the upper end of the hole 23. If necessary, the photoresist 29 may be subjected to exposure and development to remove an unnecessary portion of the photoresist in advance.

Figure 12:
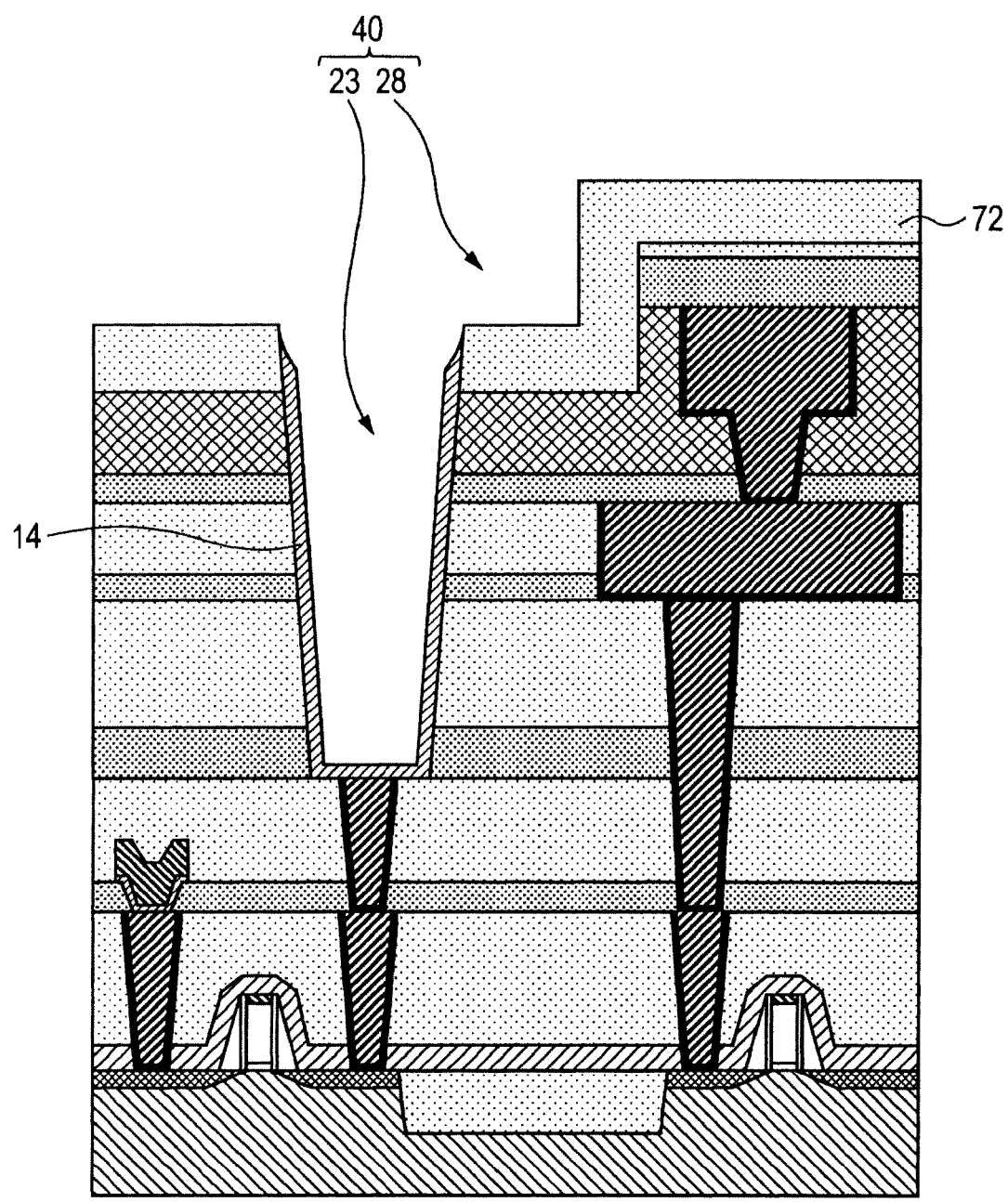
FIG. 12 is a cross-sectional view showing a step of the manufacturing procedure of the semiconductor device according to the first embodiment.

Next, as shown in FIG. 12, the lower electrode 14 is etched back by using, for example, reactive ion etching. As shown in FIG. 12, by etching back while leaving the photoresist 29 only in the hole 23, the lower electrode 14, like the capacitor 19, not reaching the uppermost layer of the hole 23 can be formed.

Figure 13:
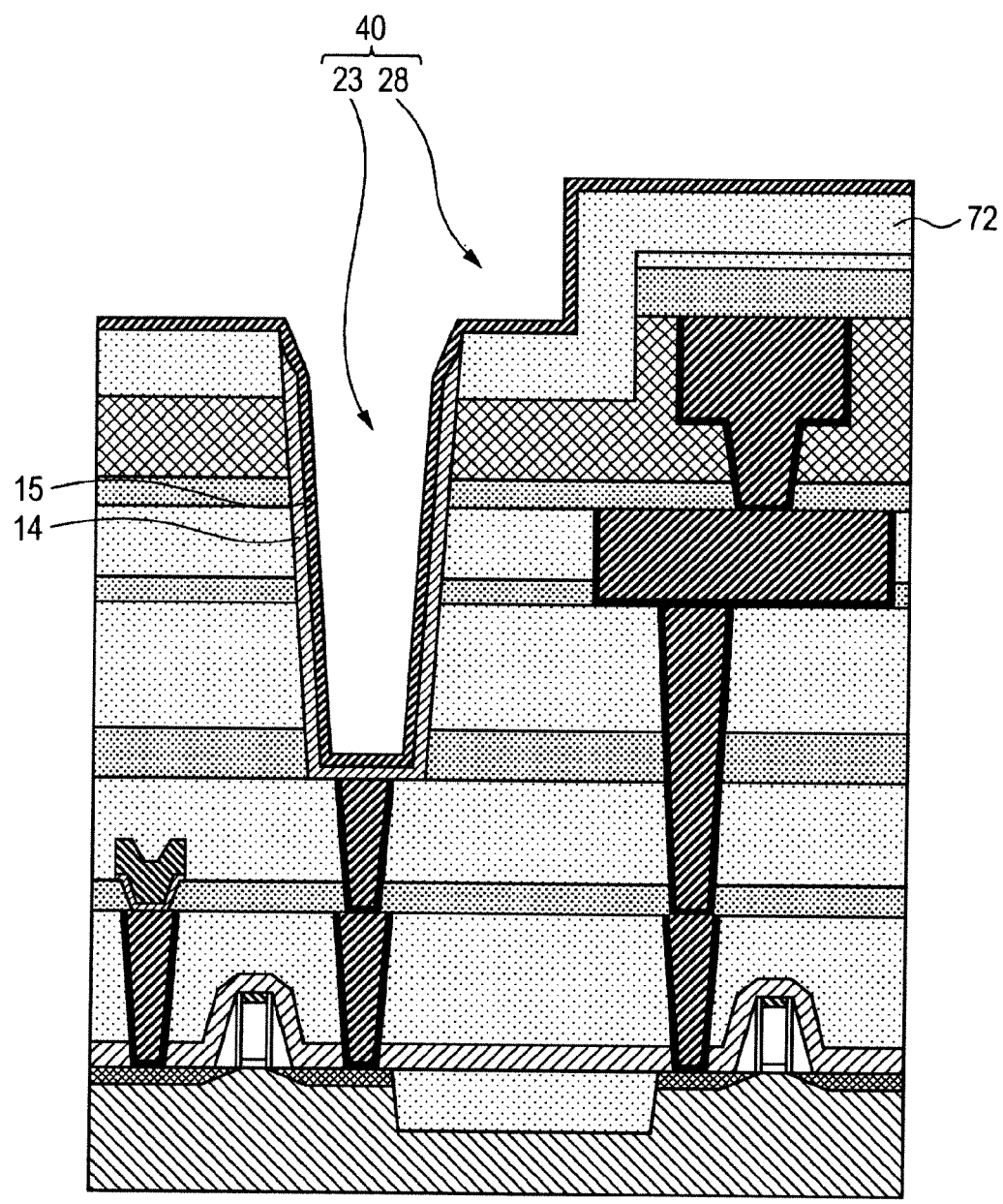
FIG. 13 is a cross-sectional view showing a step of the manufacturing procedure of the semiconductor device according to the first embodiment.

Next as shown in FIG. 13, a capacitor insulating film 15 is deposited on the lower electrode 14. The capacitor insulating film 15 is formed so as to cover at least the respective upper portions of the hole 23 and the protective layer 72. Although the capacitor insulating film 15 may be formed by using a method ordinarily employed for the formation of a semiconductor device such as CVD, sputtering, or ALD, using ALD capable of depositing a thin film of several nm with good uniformity is more preferred. As the capacitor insulating film 15, for example, zirconium dioxide ($ZrO_2$) or zirconium aluminate ($ZrAlO_x$), moreover a film obtained by adding to zirconium dioxide a lanthanoid such as Tb, Er, or Yb may be used. According to the manufacturing method of the present embodiment, $ZrO_2$ is used as the capacitor insulating film 15. Although not illustrated, after deposition of the capacitor insulating film 15, sintering may be conducted to improve the crystallinity.

Figure 14:
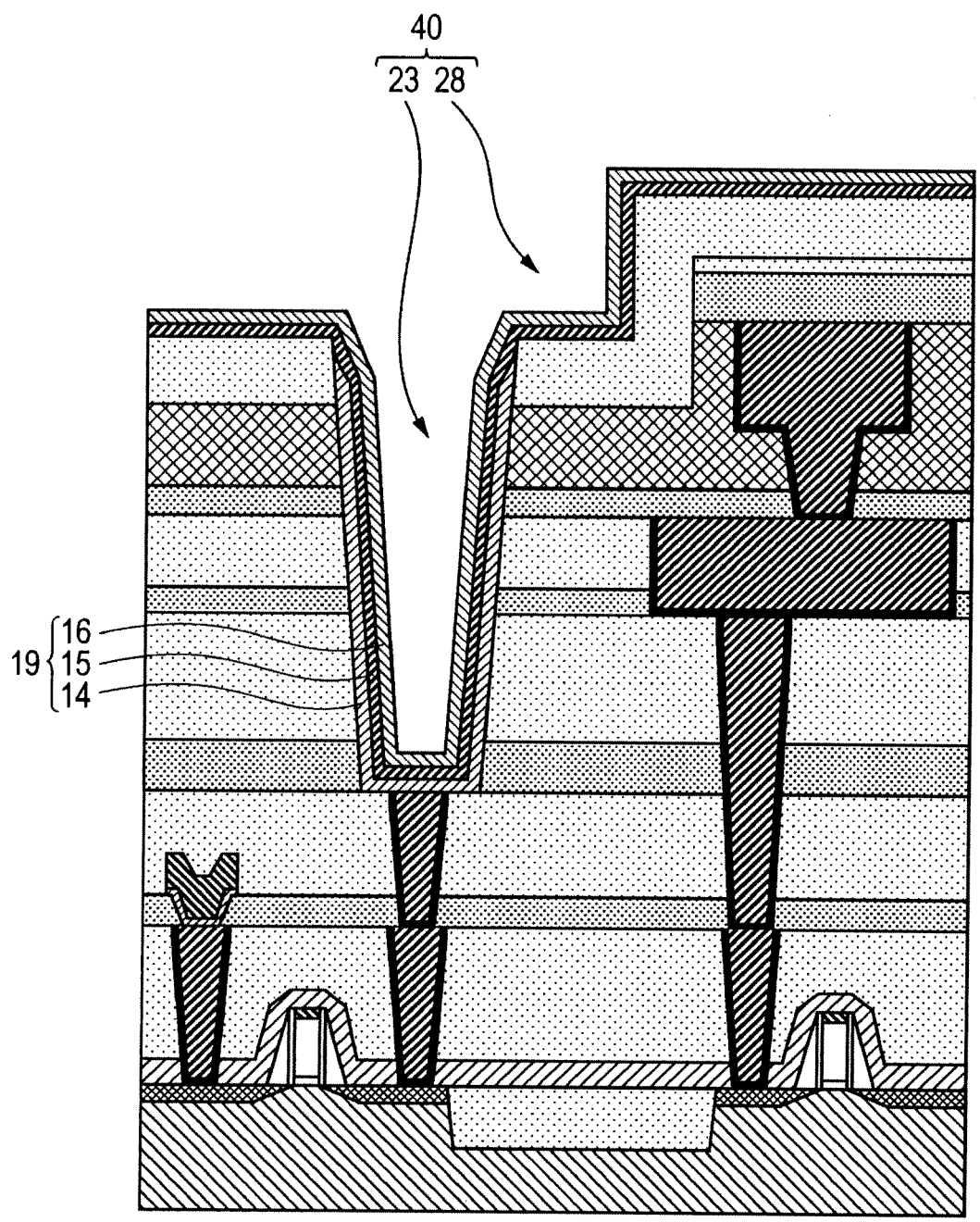
FIG. 14 is a cross-sectional view showing a step of the manufacturing procedure of the semiconductor device according to the first embodiment.

Next, as shown in FIG. 14, an upper electrode 16 is deposited on the capacitor insulating film 15. This means that the upper electrode 16 is formed on at least the hole 23 and the wiring trench 28. At this time, the entire upper surface of the semiconductor substrate 1 may be covered with the upper electrode 16. As the material configuring the upper electrode 16, for example, refractory metals and nitrides thereof such as titanium, nitride of titanium, tantalum, nitride of tantalum, and ruthenium, and stacked structures thereof may be used. The upper electrode 16 may be formed using a method ordinarily employed for the formation of a semiconductor device such as CVD, sputtering, or ALD. According to the manufacturing method of the present embodiment, a TiN film is used as the upper electrode 16. By the steps described above, a capacitor 19 is formed.

Figure 15:
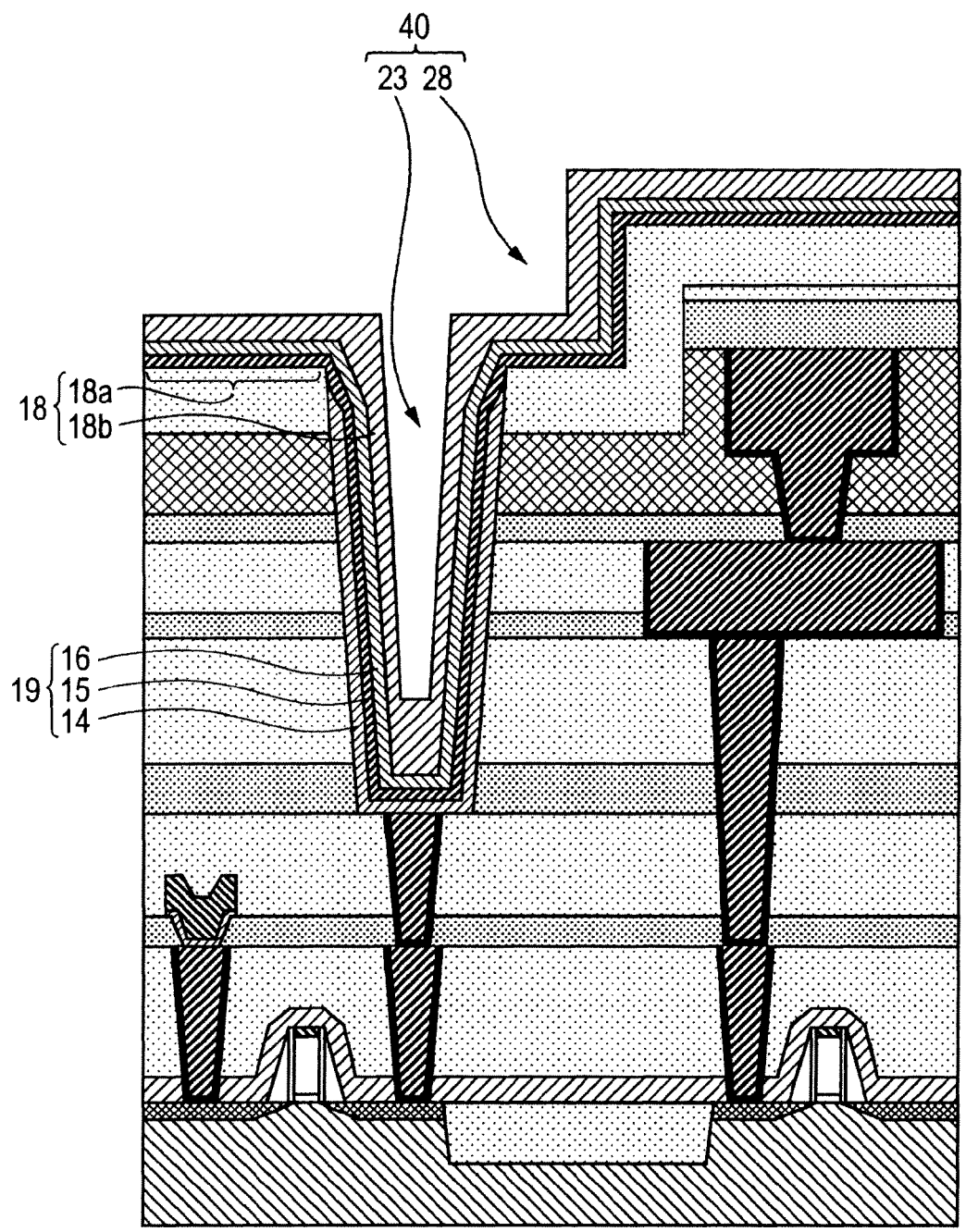
FIG. 15 is a cross-sectional view showing a step of the manufacturing procedure of the semiconductor device according to the first embodiment.

Next, as shown in FIG. 15, an upper coupling wiring 18 is formed on the protective layer 72 located on the bottom portion of the trench 28. This upper coupling wiring 18 (which may also be called "electrode plate") is formed on the upper electrode 16 placed in the hole 23 and on the bottom portion of the trench 28. The upper coupling wiring 18 may be formed by a method ordinarily employed for the formation of a semiconductor device such as CVD, sputtering, or ALD. As the material of the upper coupling wiring 18, for example, a metal material containing W, TiN, Cu, or Al or an alloy having such a metal material as a main component can be used.

Figure 16:
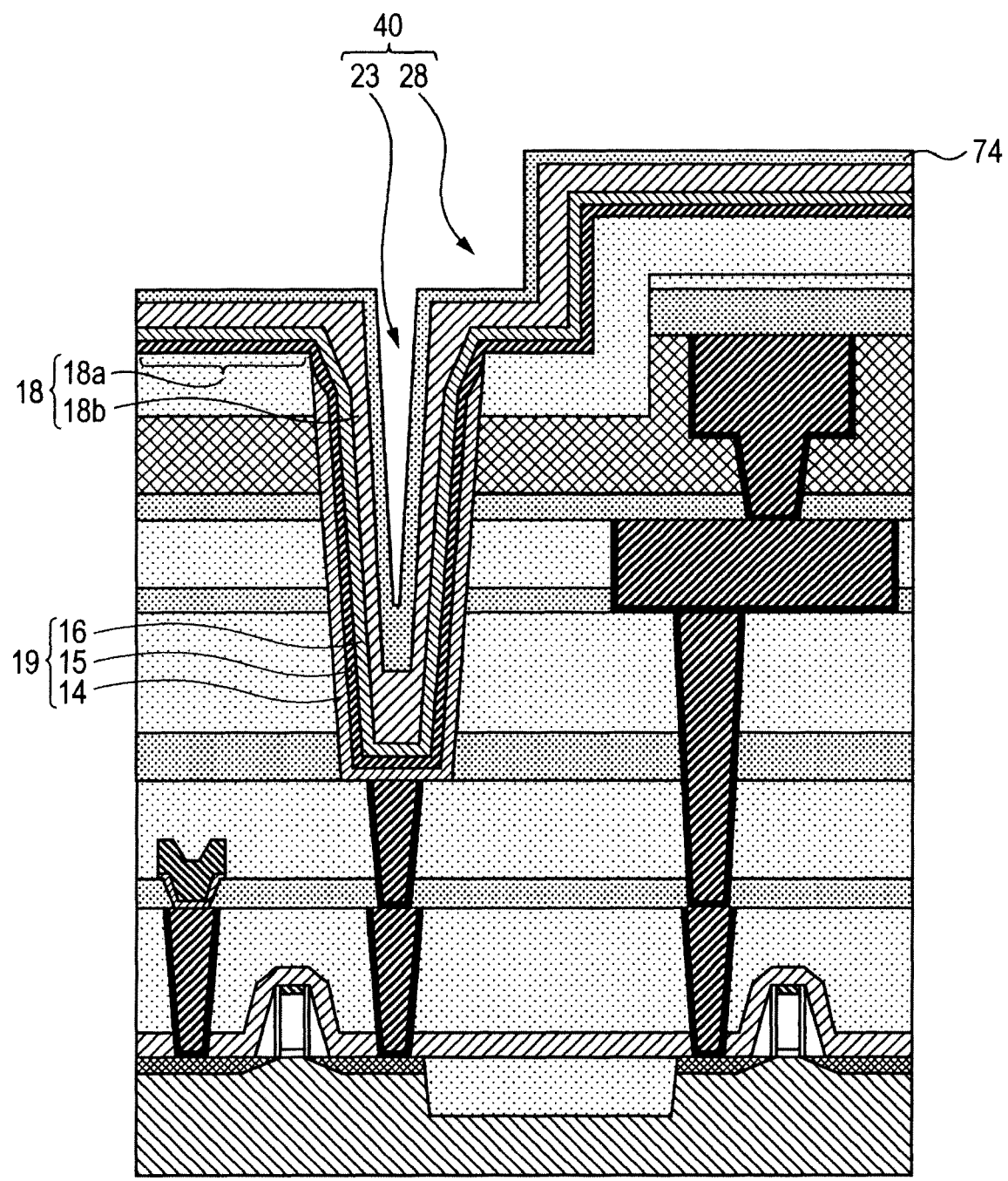
FIG. 16 is a cross-sectional view showing a step of the manufacturing procedure of the semiconductor device according to the first embodiment.

Next, as shown in FIG. 16, a cap layer 74 is formed on the upper surface of the upper coupling wiring 18. The cap layer 74 is formed on an extraction wiring portion 18a placed on the bottom surface of the trench 28 and on a buried electrode 18b placed along the inner surface of the hole 23.

Figure 17:
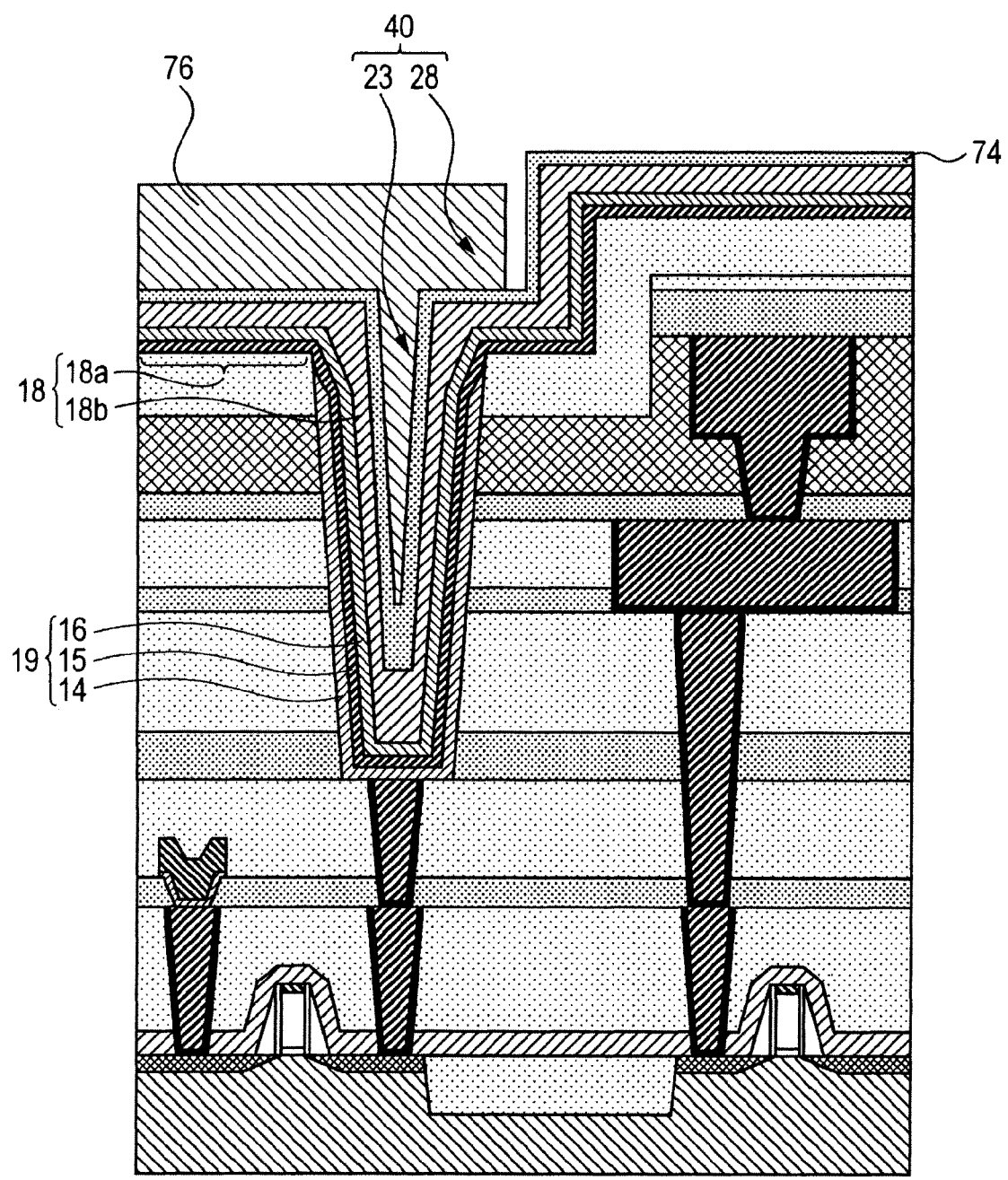
FIG. 17 is a cross-sectional view showing a step of the manufacturing procedure of the semiconductor device according to the first embodiment.

Next, as shown in FIG. 17, a resist 76 is formed on the memory circuit region. The resist 76 is formed on a portion of the cap layer 74 placed on the bottom surface of the trench 28 and on the cap layer 74 placed along the inner surface of the hole 23. The resist 76 is arranged so as to form a space (margin) between the side wall of the resist 76 and the side wall of the cap layer 74 placed on the side wall of the trench 28.

Figure 18:
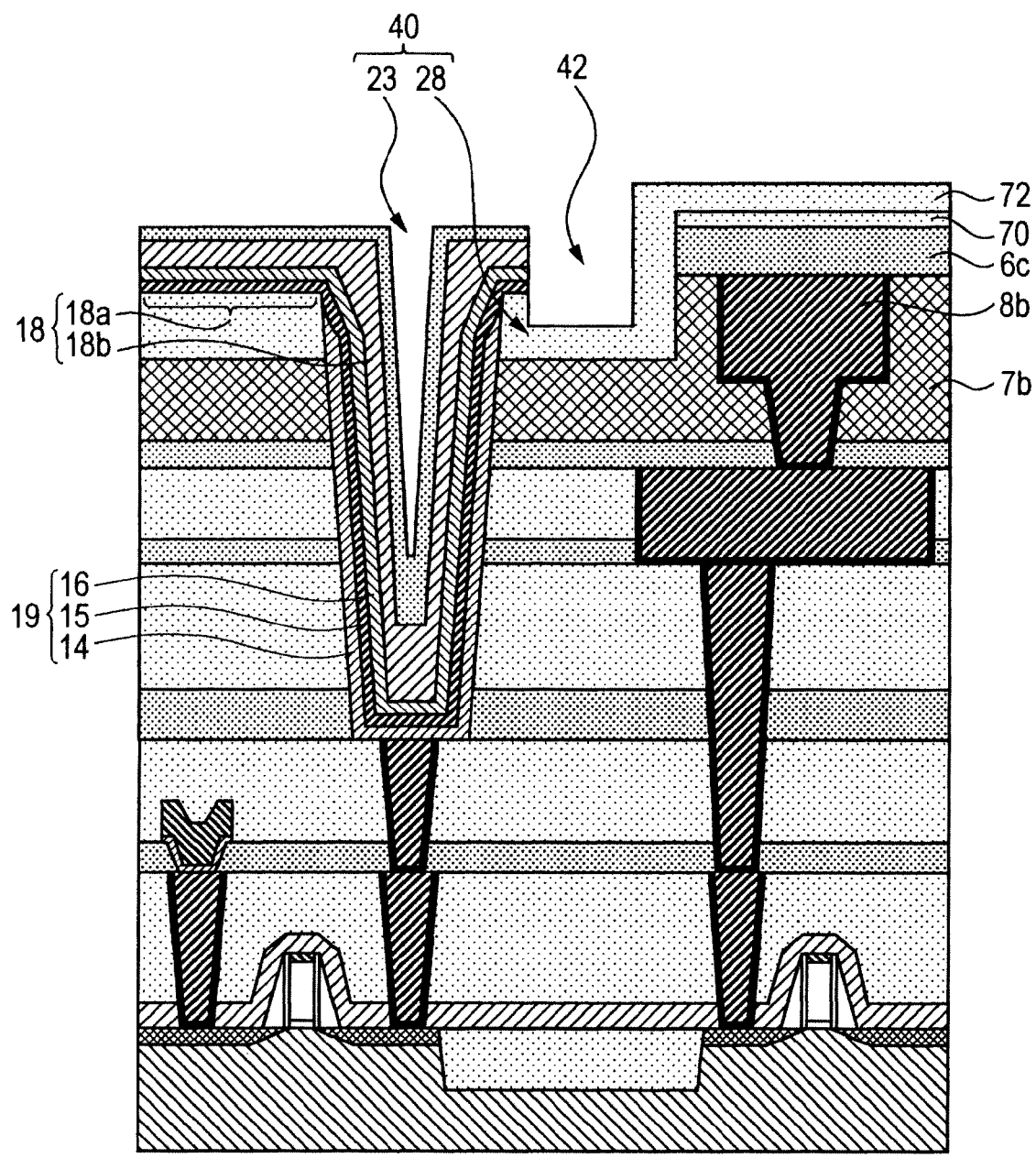
FIG. 18 is a cross-sectional view showing a step of the manufacturing procedure of the semiconductor device according to the first embodiment.

Next, as shown in FIG. 18, the capacitor insulating film 15, the upper electrode 16, the upper coupling wiring 18, and the cap layer 74 formed on the logic circuit region, particularly on the wiring 8b are removed selectively. For removal, for example, dry etching can be employed. By this removal, a portion of the protective layer 72 between the capacitor 19 and the wiring 8b is etched. A recess 42 is formed as a result of etching of the protective layer 72. From the side wall of the recess 42, for example, the respective end portions of the capacitor insulating film 15, the upper electrode 16, the upper coupling wiring 18, and the cap layer 74 are exposed. As a result, the upper coupling wiring 18 becomes smaller than the bottom surface region of the trench 28. The protective layer 72 remains on the interlayer insulating layer 7b and the hard mask 70. After that, the resist 76 is removed by an ordinary method. Thus, the structure shown in FIG. 18 can be obtained. In the present embodiment, for example, by controlling the depth of the trench 28 or film thickness of the cap layer 6c or the protective layer 72, it becomes possible to make the upper surface of the upper coupling wiring 18 flush with the upper surface of the wiring 8b and make the upper surface of the cap layer 74 flush with the upper surface of the cap layer 6c.

Figure 19:
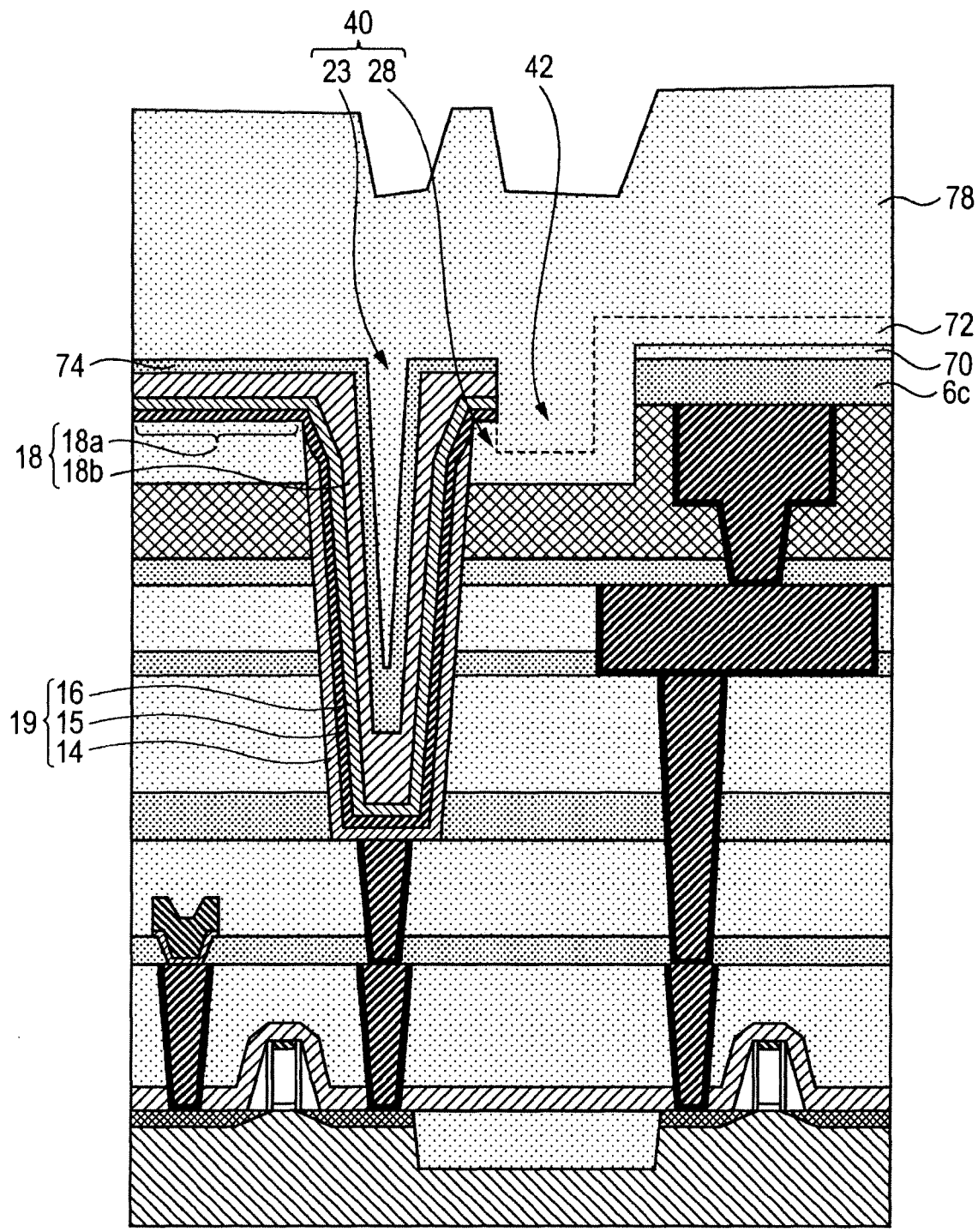
FIG. 19 is a cross-sectional view showing a step of the manufacturing procedure of the semiconductor device according to the first embodiment.

Next, as shown in FIG. 19, a sacrificial film 78 is formed on at least the recess 42. In other words, a step difference generated in the step of removing the capacitor insulating film 15 and the like on the wiring 8b is filled with the sacrificial film 78. The sacrificial film 78 is formed on the cap layer 74 and the protective layer 72. The sacrificial film 78 is also filled in the hole 23. The material of the sacrificial film 78 is preferably of the same kind as that of the protective layer 72. This facilitates removal of the protective layer 72 on the wiring 8b. As the sacrificial film 78, for example, a silicon oxide film can be used.

Figure 20:
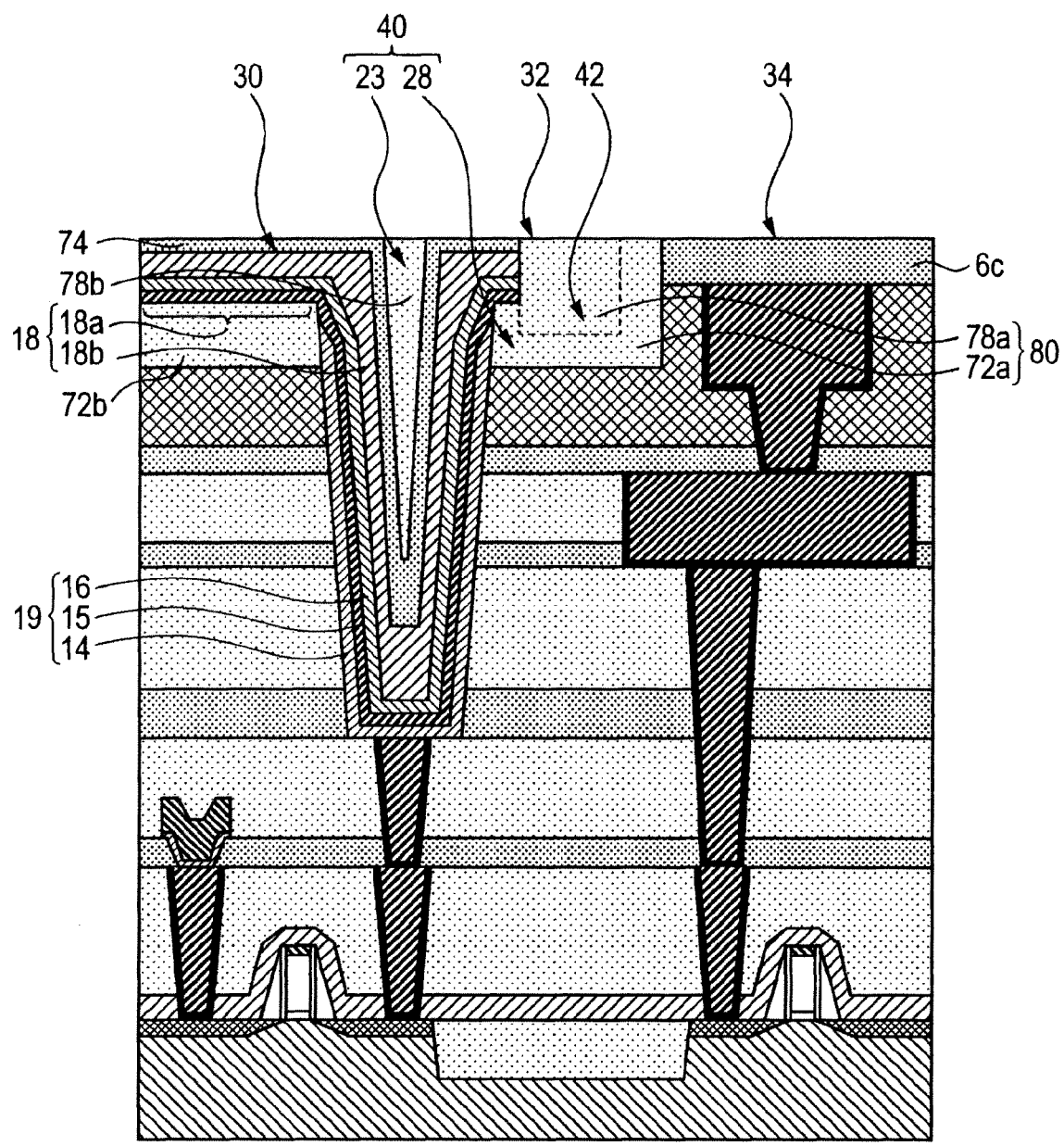
FIG. 20 is a cross-sectional view showing a step of the manufacturing procedure of the semiconductor device according to the first embodiment.

Next, as shown in FIG. 20, the sacrificial film 78 is removed selectively, by which the upper portion of the capacitor 19 and the upper portion of the wiring 8b are planarized. In the present embodiment, the upper surface of the cap layer 74 placed on the capacitor 19, the upper surface of the protective layer 78a and the upper surface of the cap layer 6c can be made flush with each other. At this time, a portion of the sacrificial film 78 (buried insulating member 78b) remains in the hole 23. In addition, a portion of the sacrificial film 78 (protective layer 78a) remains in the recess 42. As a result, after the step of forming the upper coupling wiring 18, a cap layer (cap layer 74) and an insulating member (buried insulating member 78b) can be formed on an upper electrode wiring (buried electrode 18b) in the recess (hole 23).

Figure 21:
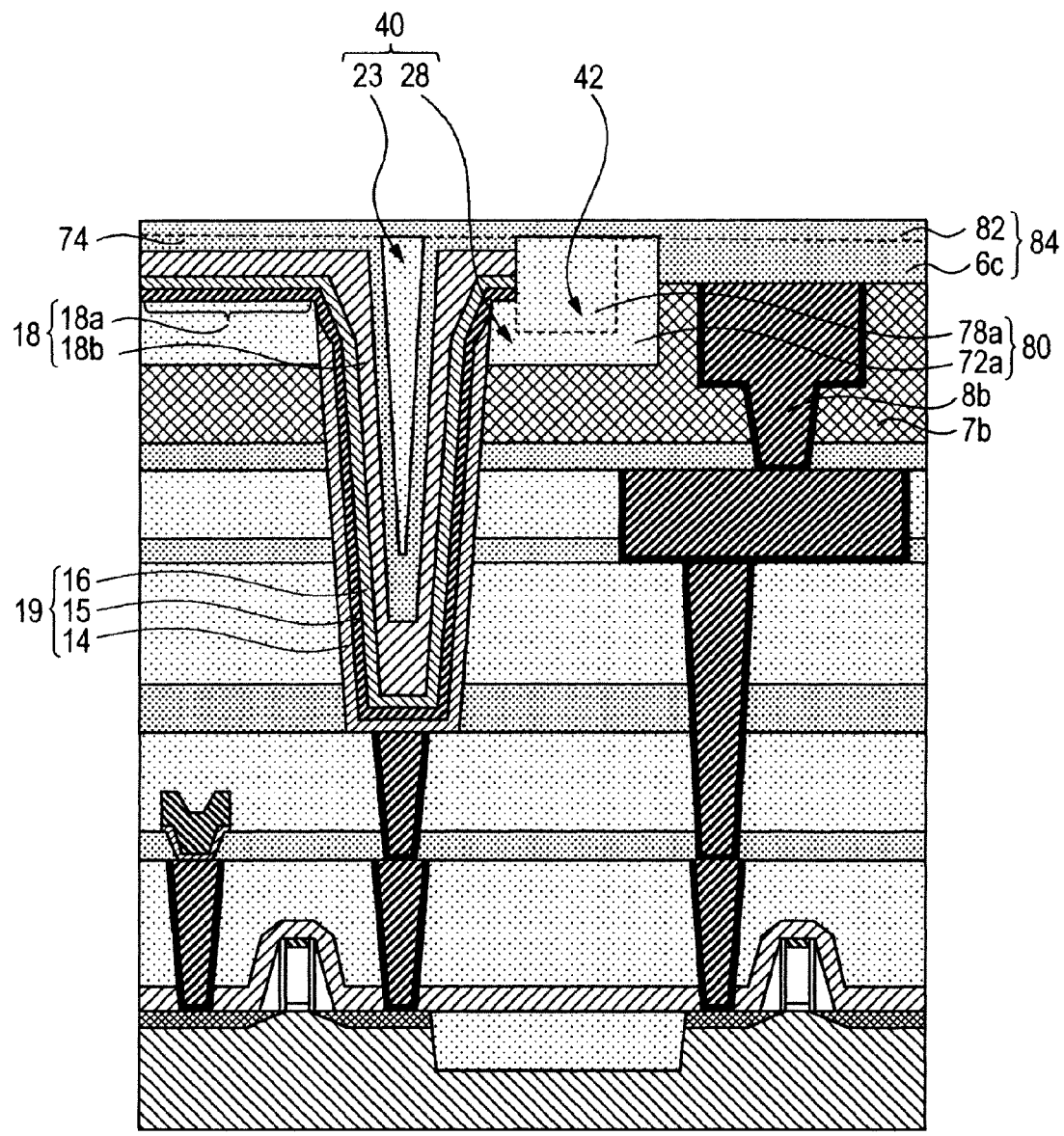
FIG. 21 is a cross-sectional view showing a step of the manufacturing procedure of the semiconductor device according to the first embodiment.

Next, as shown in FIG. 21, a cap layer 82 is formed on the planarized surface. The cap layer 82 is formed on the upper surface of the cap layer 74, the upper surface of the protective layer 78a, and on the upper surface of the cap layer 6c. In other words, the cap layer 82 is formed continuously from the upper portion of the capacitor 19 to the upper portion of the wiring 8b. The cap layer 82 protects the protective layer 72a and the protective layer 78a. If the protective layer 72a and the protective layer 78a have a film quality excellent in moisture absorption resistance, the formation of the cap layer 82 is not required.

In the present embodiment, the capacitor 19 is formed after formation of the wiring 8b, but the formation order is not limited to it and the wiring 8b may be formed after formation of the capacitor 19. Among the wirings formed in the same layer as the capacitor 19, the wiring 8b is an uppermost wiring.

Figure 22:
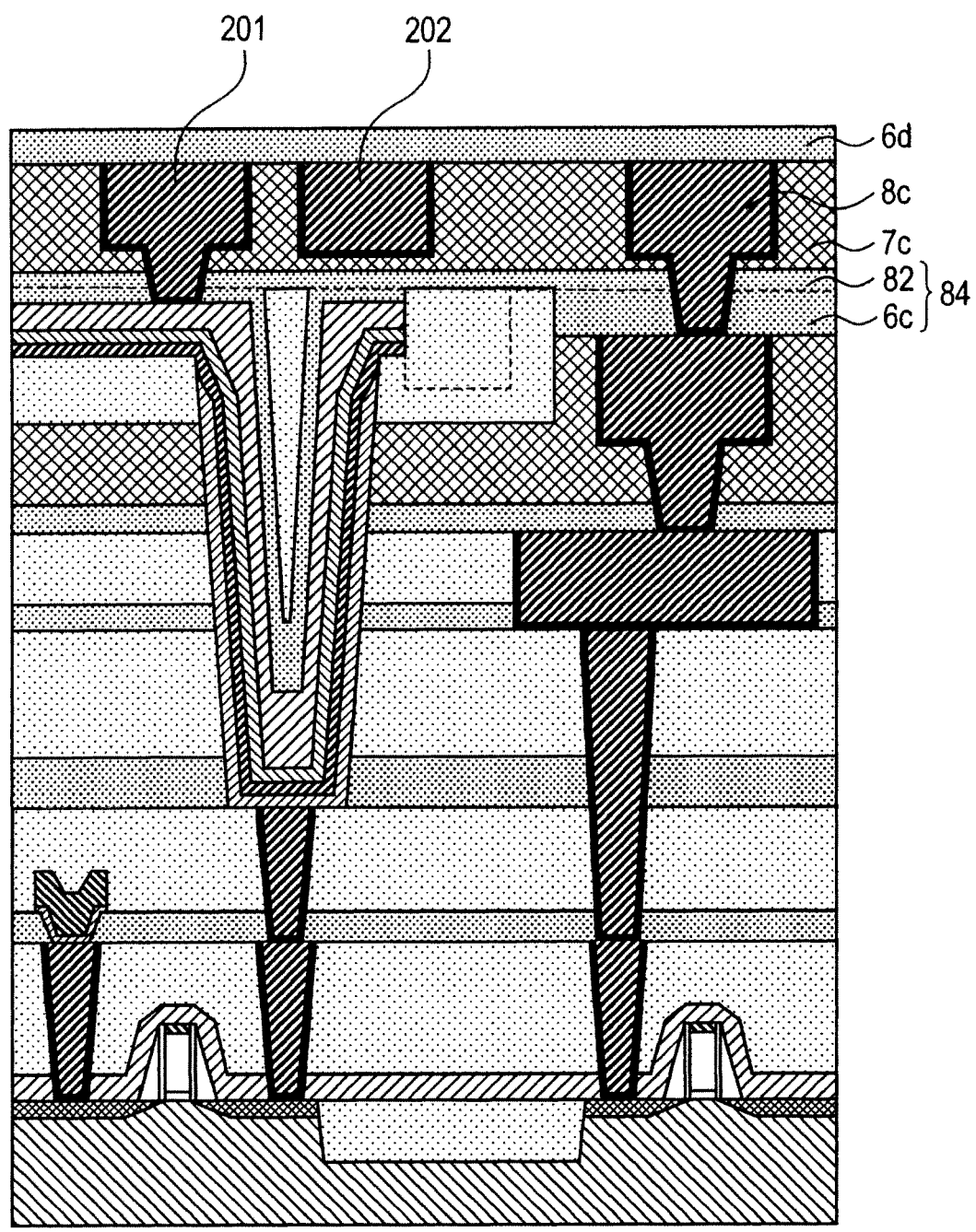
FIG. 22 is a cross-sectional view showing a step of the manufacturing procedure of the semiconductor device according to the first embodiment.

Next, as shown in FIG. 22, an interlayer insulating layer 7c, a wiring 201 having a fixed potential, a signal wiring 202, a wiring 8c, and a cap layer 6d are formed over the capacitor 19 configuring the memory circuit and the wiring 8b placed in the same layer as the upper coupling wiring 19 of the capacitor 19 by using an ordinarily employed manufacturing method of a semiconductor device. By the steps described above, the semiconductor device of the present embodiment can be obtained.

Next, advantages of the first embodiment will be described. The protective layer 80 of the semiconductor device of the present embodiment is made of a material having a high dielectric constant and is therefore a member excellent in mechanical strength. The protective layer 80 protects the periphery of the upper end portion of the capacitor burying recess (hole 23). In other words, the upper end portion of the hole 23 is formed in the protective layer having high mechanical strength. This makes it possible to suppress variation (so-called shoulder loss) at the upper end portion of the opening portion of the hole 23 and suppress variation in the height of the capacitor among recesses or among products. As a result, a semiconductor device having less variation in capacitor characteristics can be realized.

By using a silicon oxide film as the material of the protective layer, a low-dielectric-constant film can be protected sufficiently from process deterioration. As a result, a capacitor can be formed in a wiring layer without deteriorating the performance of the wiring in the logic circuit portion. In addition, by forming a capacitor in the wiring layer, a bypass contact for coupling the wiring layer to the active element can be made smaller and parasitic capacitance and parasitic resistance at the bypass contact portion can be reduced. As a result, a semiconductor device causing less delay during operation and therefore having an improved processing rate and consuming less electricity can be realized. In addition, the present embodiment can reduce a difference in design parameter between the semiconductor device of the present embodiment and a Pure-Logic chip formed using an $SiO_2$ contact interlayer film. In addition, by using a silicon oxide film as a material of the protective film, a semiconductor device can be manufactured at a low cost because it enables utilization of a related-art equipment or shortening in the development period.

Figure 23:
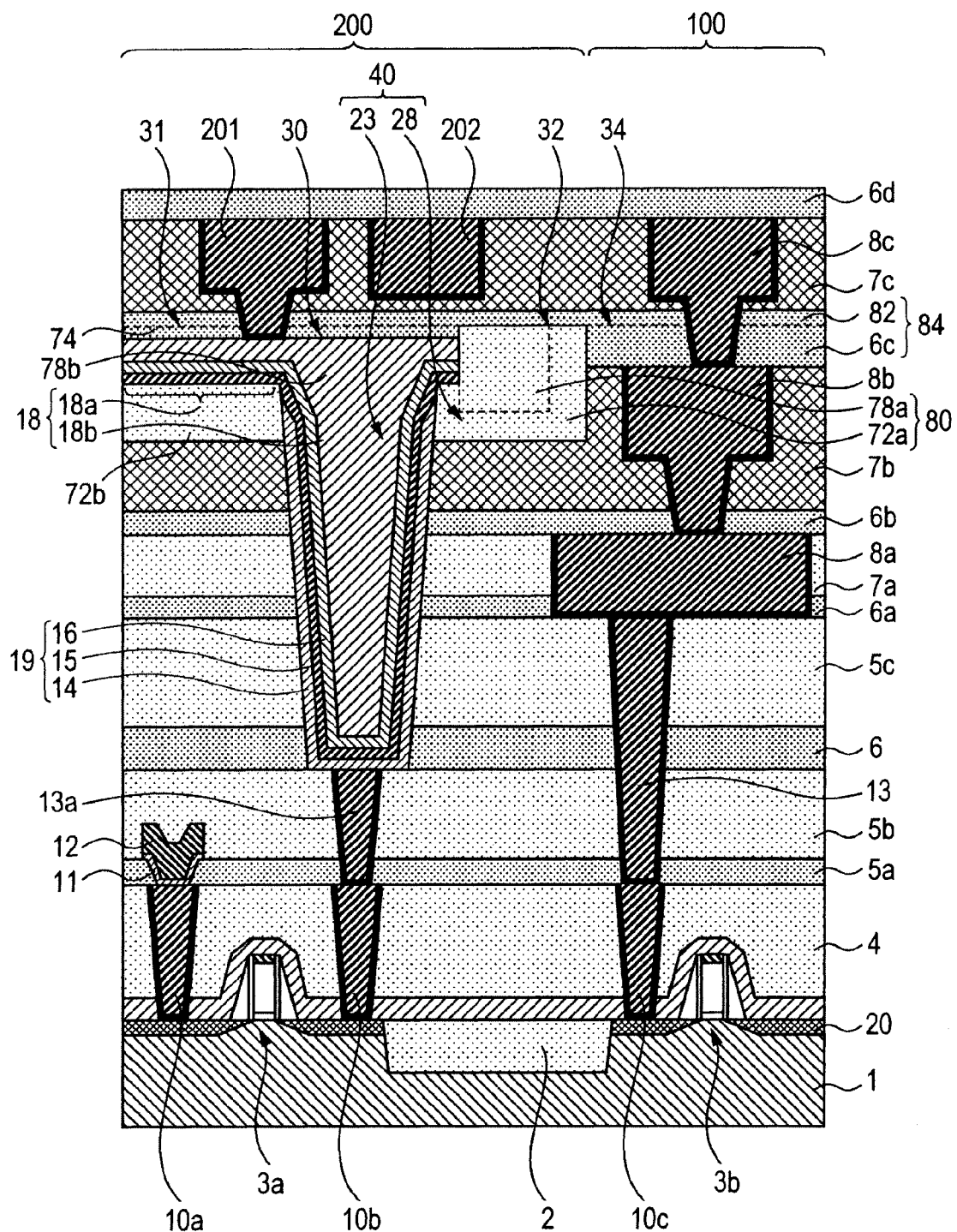
FIG. 23 is a cross-sectional view schematically showing a semiconductor device according to a second embodiment.

(Second Embodiment) Next, a semiconductor device according to a second embodiment will be described referring to drawings. FIG. 23 is a cross-sectional view showing the structure of the semiconductor device of the second embodiment. The second embodiment is different from the first embodiment in that the buried insulating member 78b is not buried in the hole 23. The second embodiment is similar to the first embodiment except it.

The semiconductor device of the second embodiment will next be described in detail. The buried electrode 18b shown in FIG. 23 is buried fully in a space of a recess (hole 23) in which the lower electrode 14, the capacitor insulating film 15, and the upper electrode 16 have not been buried. This buried electrode 18b is placed on the upper electrode 16 in the hole 23. The buried electrode 18b is formed in the same step as that of the extraction wiring portion 18a and they are preferably integrated with each other.

The material of the upper coupling wiring 18 may be the same as or different from, for example, that of the wiring 8c. Examples of the material of the upper coupling wiring 18 include Cu and W. For example, using W excellent in a burying property can increase the yield of a semiconductor device. When a metal material (such as W) excellent in electromigration resistance is used, the capacitor can have enhanced reliability. The second embodiment can produce advantages similar to those of the first embodiment.

Next, a manufacturing method of the semiconductor device according to the second embodiment will be described in detail referring to drawings. FIGS. 24 to 29 are views showing the steps of the manufacturing method of the semiconductor device of the second embodiment. First, similar to the first embodiment, the structure shown in FIG. 14 is obtained. Then, a metal film for upper coupling wiring is buried fully in the space in a recess (hole 23) which has remained after formation of the lower electrode 14, the capacitor insulating film 15, and the upper electrode 16.

Figure 24:
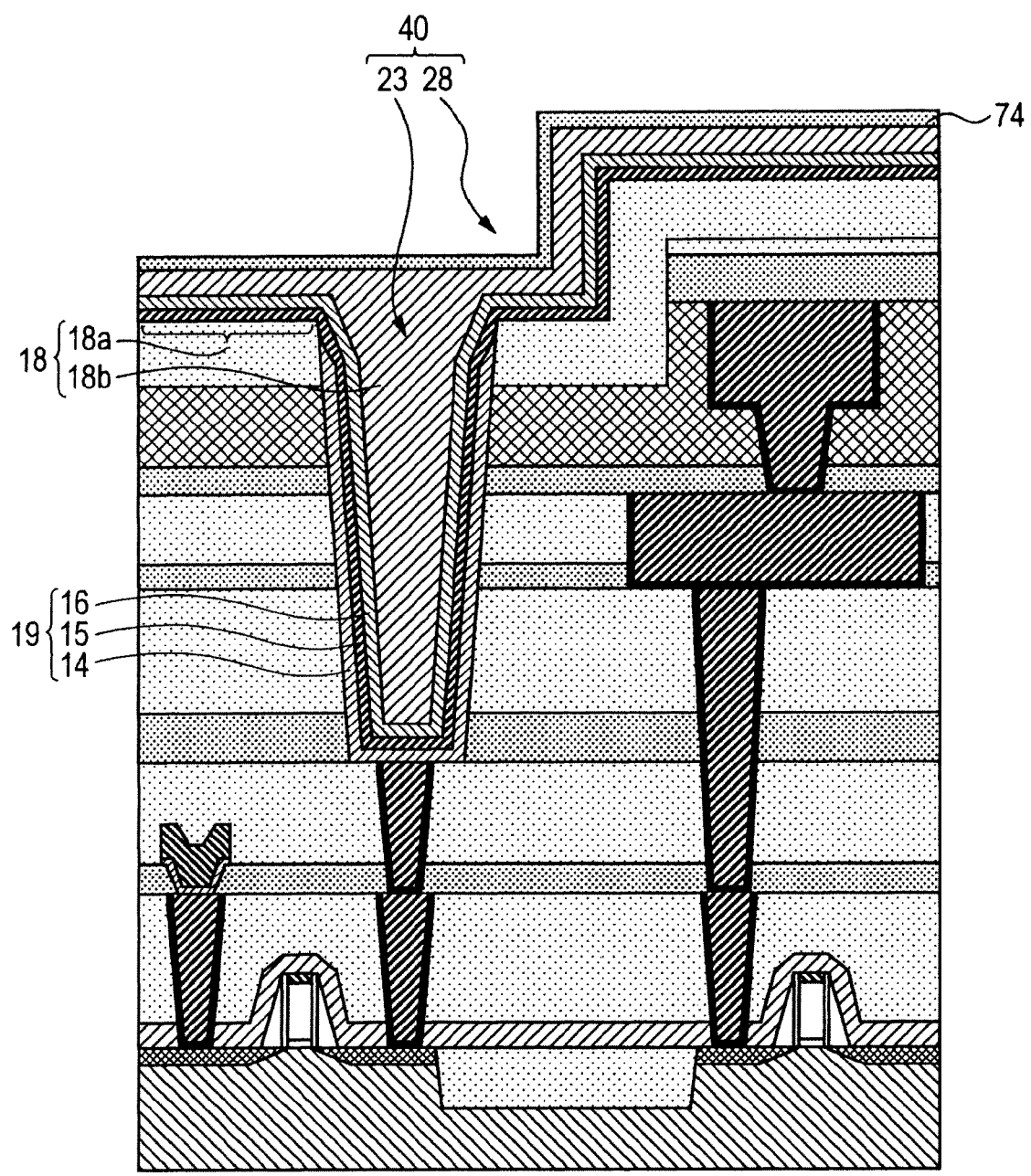
FIG. 24 is a cross-sectional view showing a step of a manufacturing procedure of the semiconductor device according to a second embodiment.
Figure 25:
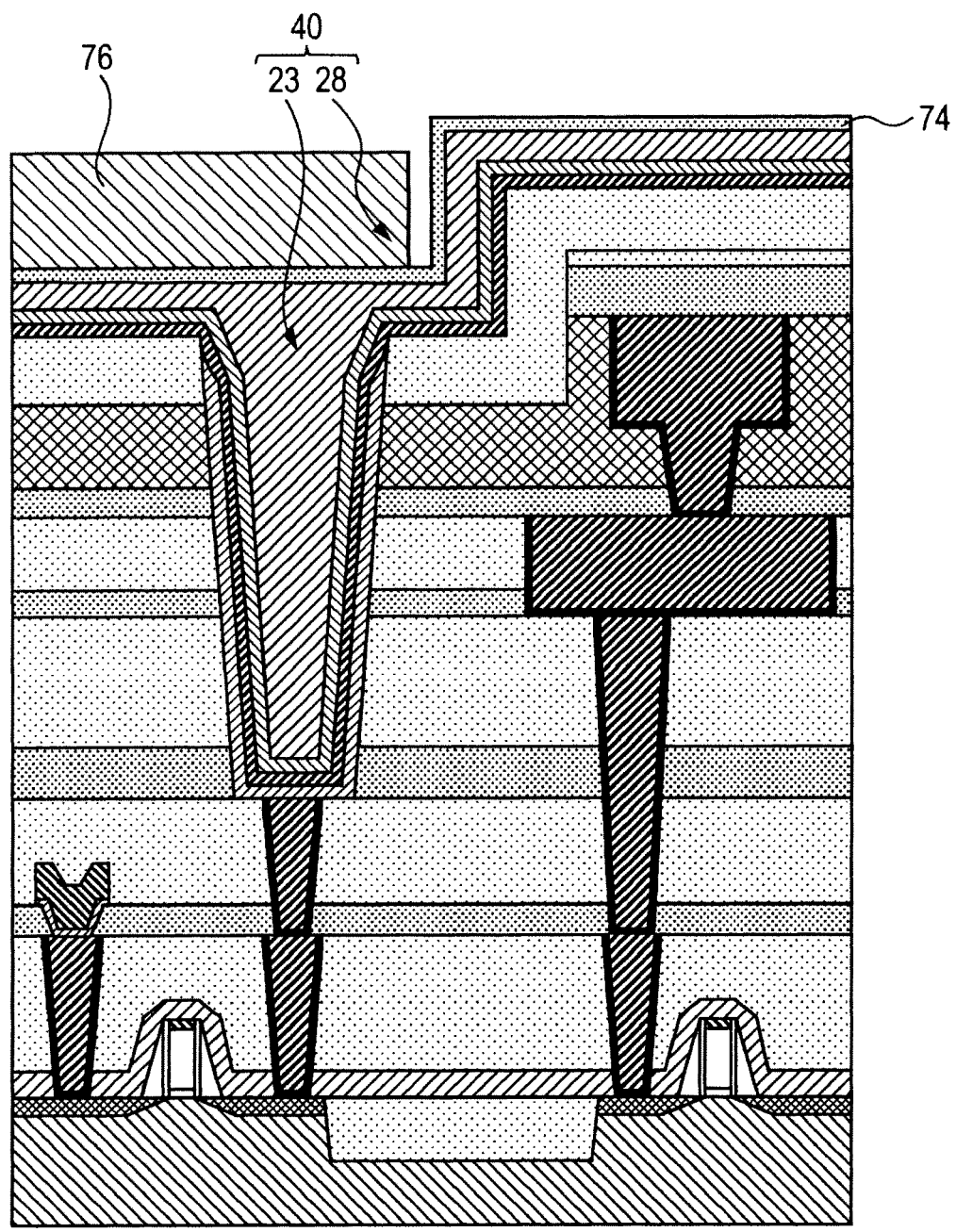
FIG. 25 is a cross-sectional view showing a step of the manufacturing procedure of the semiconductor device according to a second embodiment.

Next, as shown in FIG. 24, a cap layer 74 is formed on the metal film for upper coupling wiring. Then, as shown in FIG. 25, a resist 76 is selectively formed on the upper surface of the cap layer 74 in the memory circuit region, by which the cap layer 74 formed on the wiring in the logic circuit region is exposed.

Figure 26:
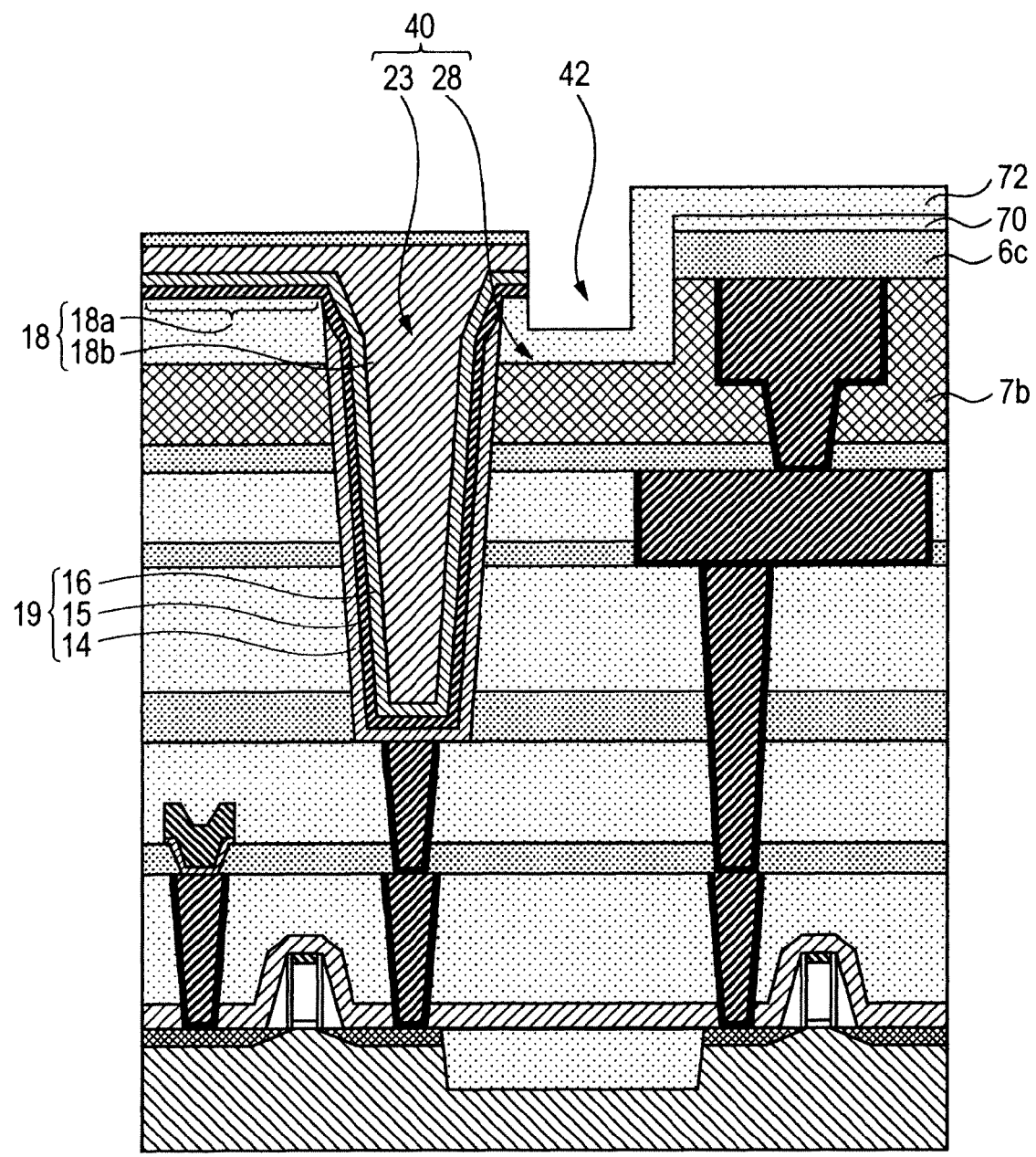
FIG. 26 is a cross-sectional view showing a step of the manufacturing procedure of the semiconductor device according to a second embodiment.

Next, as shown in FIG. 26, with the cap layer 74 in the logic circuit region, the metal film for upper coupling wiring, the upper electrode 16, and the capacitor insulating film 15 are removed selectively. As a result, the upper coupling wiring 18 remains on the memory circuit region. As a selective removal method, etching can be used. By this etching, a portion of the protective layer 72 is removed. A recess 42 is formed in the protective layer 72. In other words, a step difference (recess) is formed between the capacitor 19 and the wiring 8b.

Figure 27:
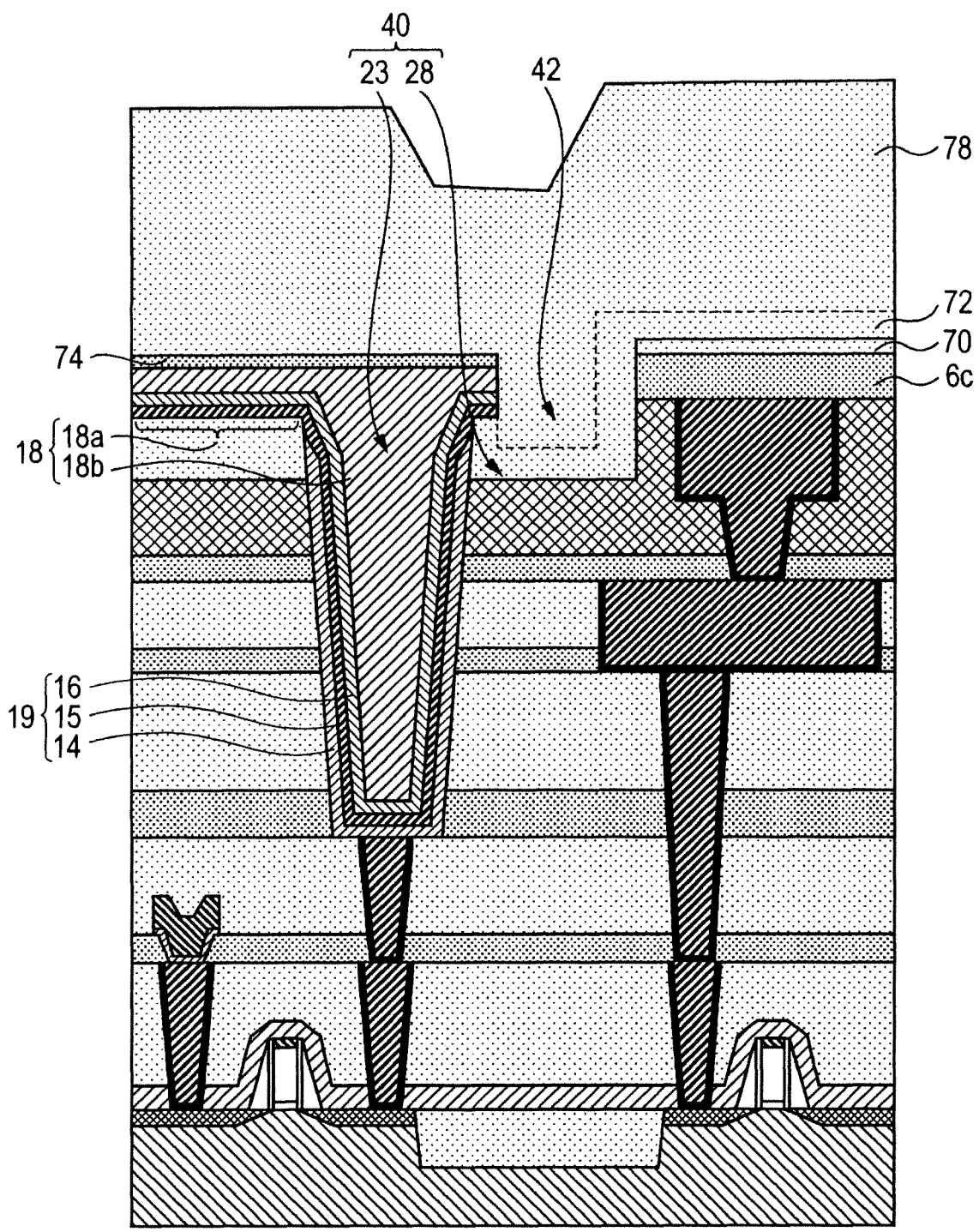
FIG. 27 is a cross-sectional view showing a step of the manufacturing procedure of the semiconductor device according to a second embodiment.

Next, as shown in FIG. 27, a sacrificial film 78 is formed on the recess 42, followed by planarization of this sacrificial film 78. Examples of the planarization method include, as a first method, a method of subjecting all the surplus sacrificial film 78 to CMP treatment and, as a second method, a method of subjecting a portion of the surplus sacrificial film 78 to CMP treatment and dry etching the remaining portion. In the second embodiment, an example using the first method will be described. The first method can simplify the step. In a third embodiment which will be described later, an example using the second method will be described.

The sacrificial film 78 is preferably a film of the same kind as the protective layer 72. This makes it possible to carry out the planarization step of the sacrificial film 78 while grinding the sacrificial film 78 and the protective layer 72 formed in the logic circuit region in the same step. In addition, the hard mask 70 is preferably a film of the same kind as the sacrificial film 78. This makes it possible to grind the sacrificial film 78, the protective layer 72, and the hard mask 70 formed in the logic circuit region in one step. Thus, the planarization step can be simplified.

Prior to the planarization of the sacrificial film 78, the cap layer 74 may be formed on the upper coupling wiring 18 in the memory circuit region, but it may not be formed. As the cap layer 74, a film more etch-resistant than the sacrificial film 78 can be used. During the planarization treatment of the sacrificial film 78, the cap layer 74 can protect the upper surface of the upper coupling wiring 18 and therefore can suppress variation in height of the upper coupling wiring 18. It is therefore possible to keep a structure in which the upper surface of the upper coupling wiring 18 is made flush with the upper surface of the wiring configuring the logic circuit. Thus, excessive etching or insufficient etching on the upper surface of the upper coupling wiring can be suppressed. In addition, since the upper coupling wiring and the buried electrode are made of the same material and integrated with each other, etch back of the buried electrode for securing a space for forming the upper coupling wiring is not necessary when the upper coupling wiring is formed. The excessive etching of the buried electrode is therefore suppressed. As a result, a semiconductor device excellent in yield can be realized.

Figure 28:
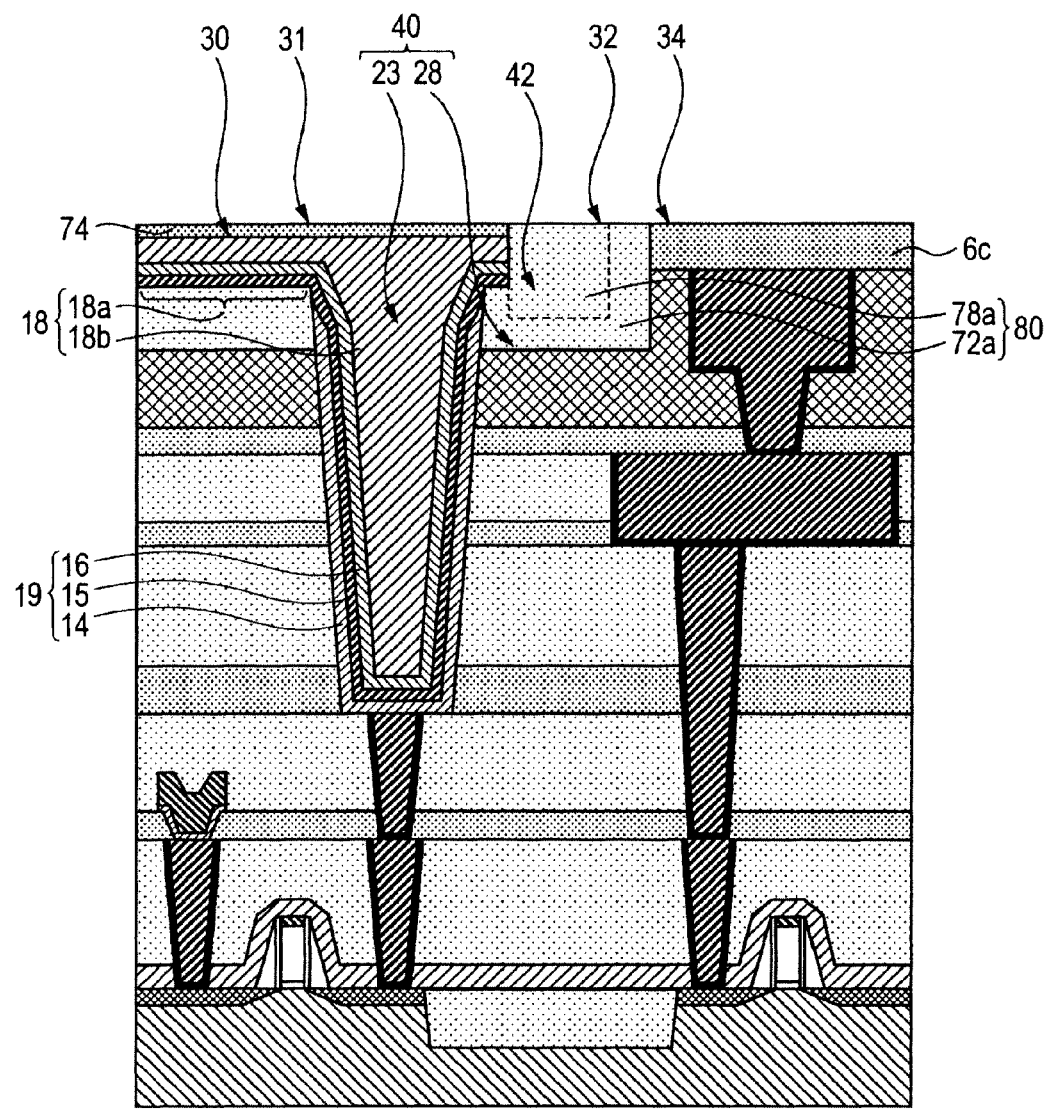
FIG. 28 is a cross-sectional view showing a step of the manufacturing procedure of the semiconductor device according to a second embodiment.

Next, as shown in FIG. 28, the sacrificial film 78 is planarized. The upper surface 31 of the cap layer 74, the upper surface 32 of the protective layer 80, and the upper surface 34 of the cap layer 6c can be made flush with each other. In addition, the upper surface 30 of the extraction wiring portion 18a and the upper surface of the wiring 8b may be made flush with each other, but a difference in height between these upper surfaces not greater than 30 nm or less is permitted. This makes it possible to suppress generation of excess or deficiency of an etching amount on the upper surface of the upper coupling wiring 18.

Figure 29:
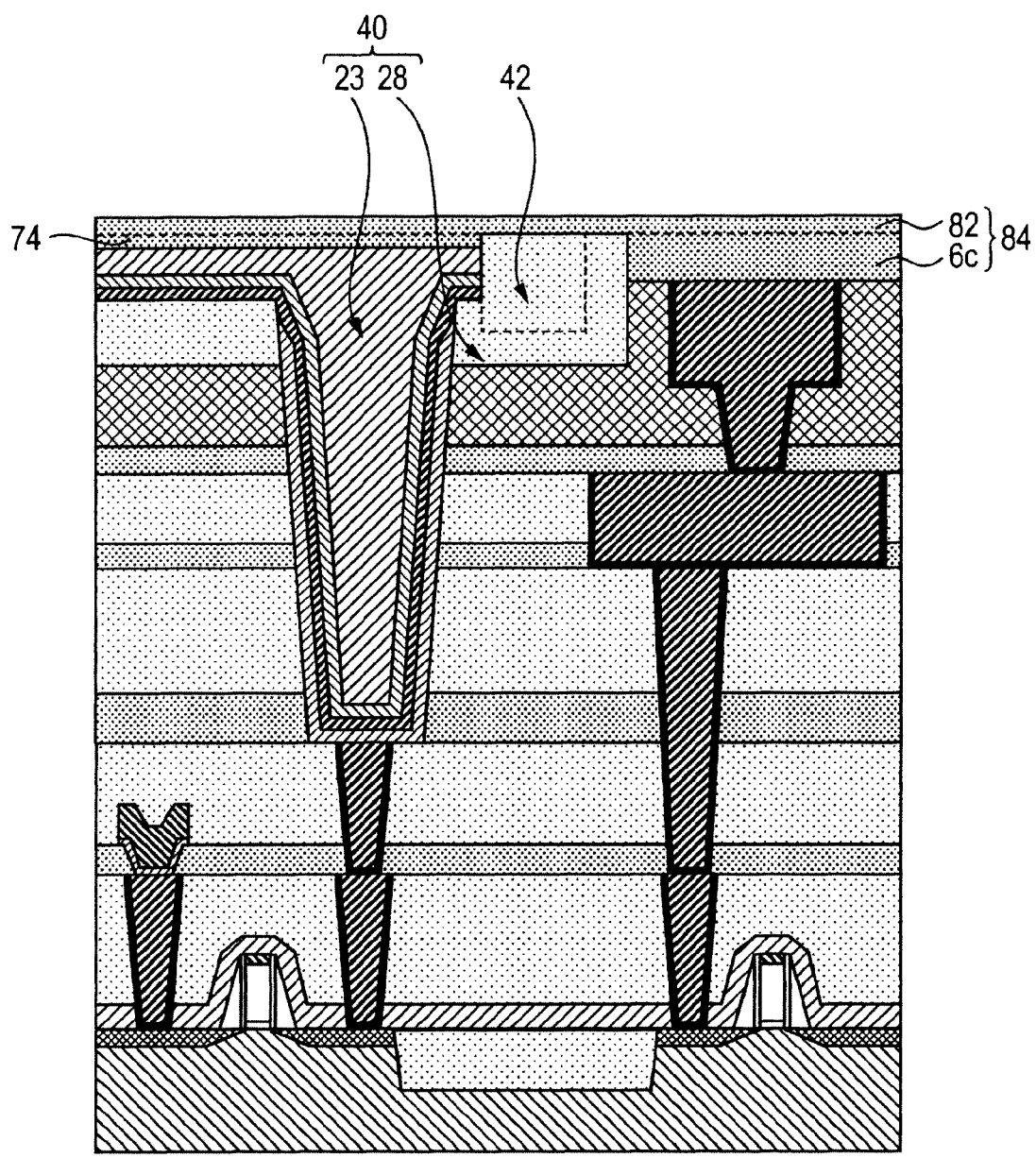
FIG. 29 is a cross-sectional view showing a step of the manufacturing procedure of the semiconductor device according to a second embodiment.

Next, as shown in FIG. 29, a cap layer 82 is formed on the upper surfaces 31, 32, and 34. Then, steps similar to those of the first embodiment are conducted to obtain the semiconductor device of the second embodiment.

(Third Embodiment) A semiconductor device of a third embodiment will next be described referring to drawings.

Figure 30:
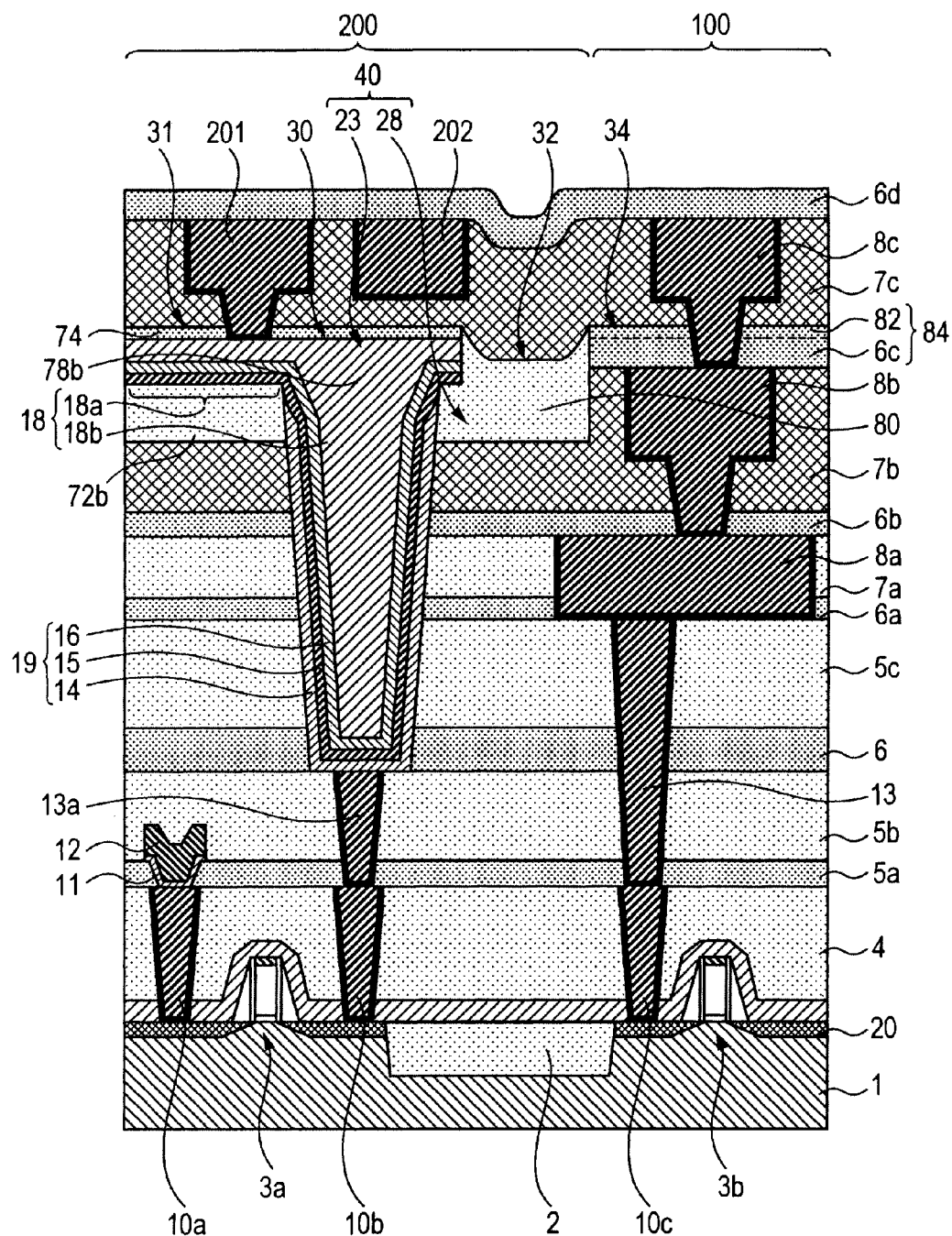
FIG. 30 is a cross-sectional view schematically showing a semiconductor device according to a third embodiment.

FIG. 30 is a cross-sectional view showing the structure of the semiconductor device of the third embodiment. The semiconductor device of the third embodiment is the same as that of the first embodiment except that a recess is formed in the upper surface of the protective layer 80 and no cap layer 82 is formed.

The height of the upper surface of the protective layer 80 is partially lower than the upper surface of the cap layer 74 or the upper surface of the cap layer 6c. This means that a recess is formed by etching in the upper surface of the protective layer 80. An interlayer insulating layer 7c is buried in this recess.

The protective layer 80 is made of a silicon oxide film having a film quality excellent in moisture absorption resistance. It is therefore not necessary to form a cap layer 74 on the protective layer 80. This makes it possible to reduce the number of steps and reduce the manufacturing cost. The third embodiment can produce similar advantages to those of the first embodiment.

Figure 31:
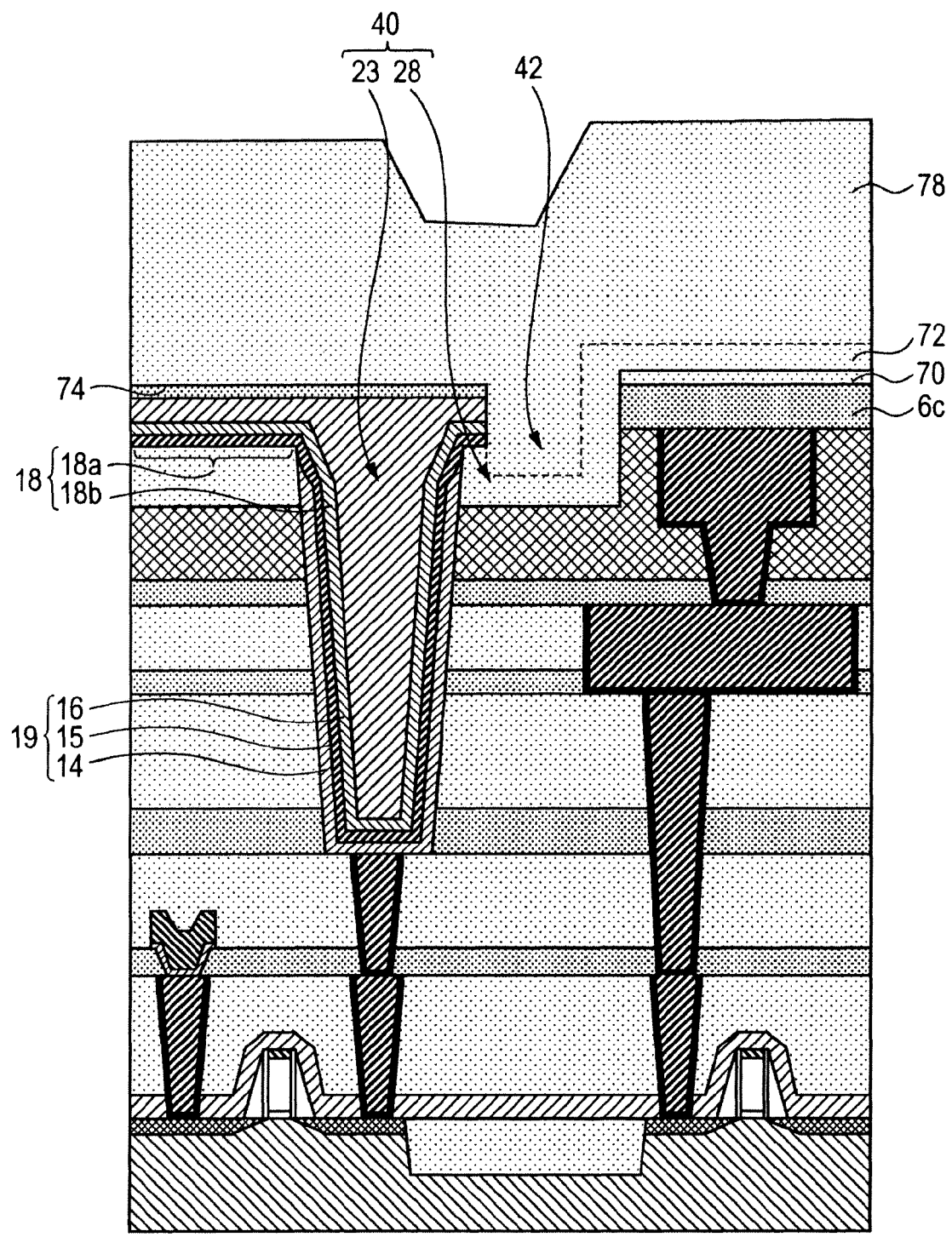
FIG. 31 is a cross-sectional view showing a step of a manufacturing procedure of the semiconductor device according to a third embodiment.

Next, a manufacturing method of the semiconductor device of the third embodiment will be described in detail referring to drawings. FIGS. 31 to 34 are views showing steps of the manufacturing method of the semiconductor device of the third embodiment. First, similar to the second embodiment, the structure shown in FIG. 31 is manufactured. This means that the sacrificial film 78 is buried in the recess 42. Then, the sacrificial film 78 is planarized. In the present embodiment, the sacrificial film 78 is planarized using the above-described second method. The manufacturing method will hereinafter be described.

Figure 32:
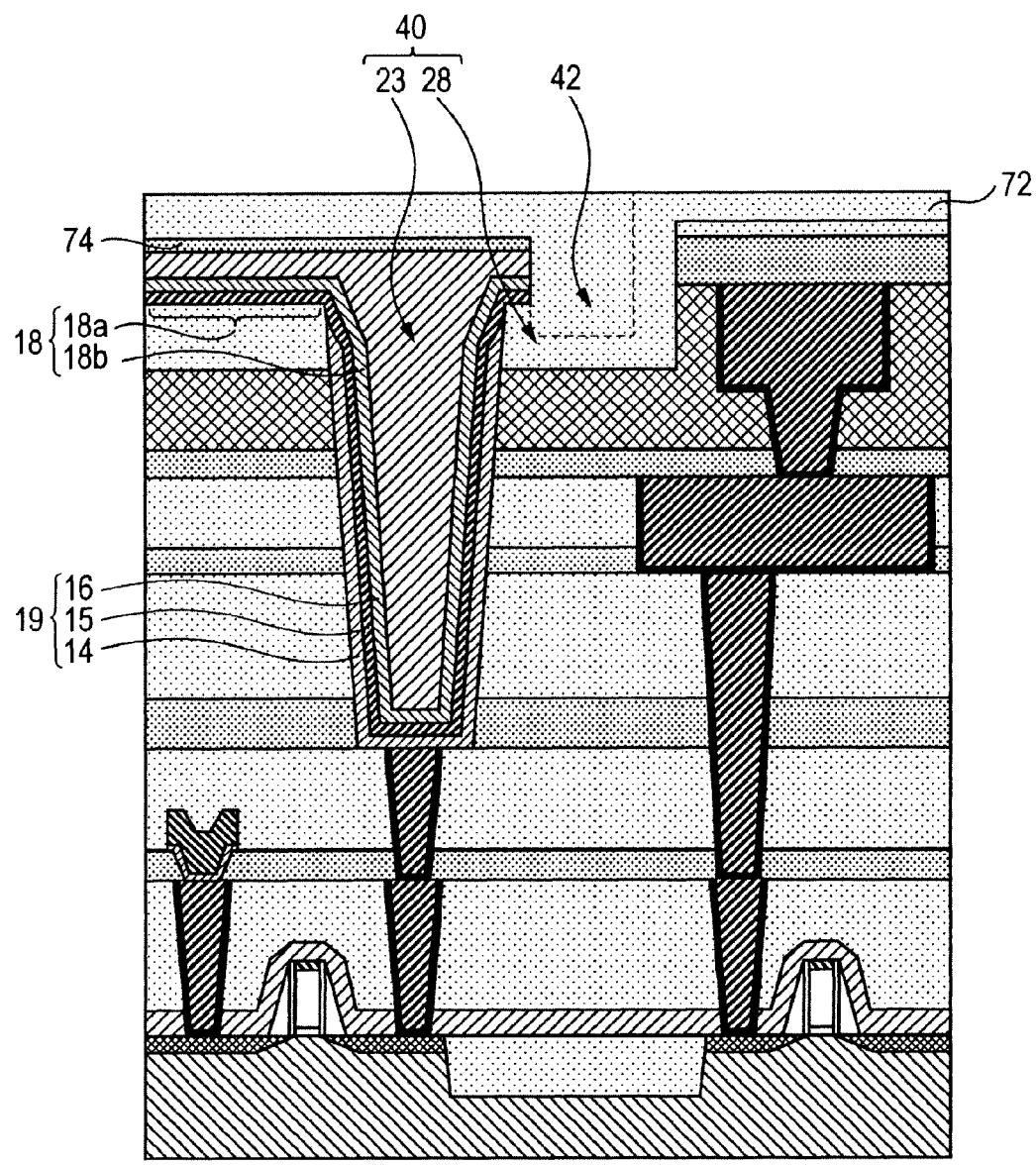
FIG. 32 is a cross-sectional view showing a step of the manufacturing procedure of the semiconductor device according to a third embodiment.

As shown in FIG. 32, a portion of the sacrificial film 78 is removed by chemical mechanical polishing (CMP). This means that CMP is terminated so as to leave the sacrificial film 78 corresponding to a predetermined film thickness. At this time, the sacrificial film 78 or the protective layer 72 remains to some extent on the cap layer 6c.

Figure 33:
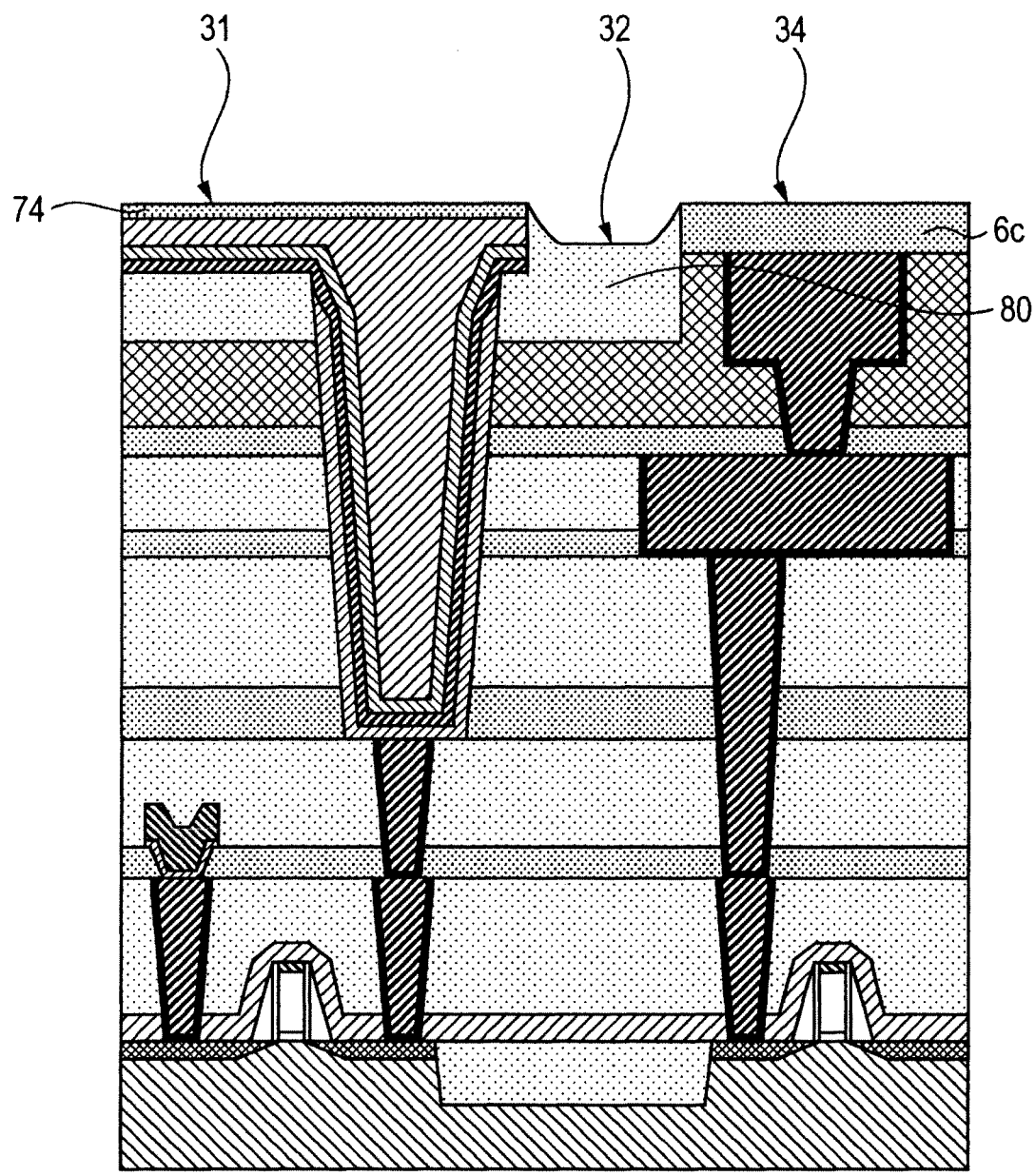
FIG. 33 is a cross-sectional view showing a step of the manufacturing procedure of the semiconductor device according to a third embodiment.

Then, as shown in FIG. 33, the remaining sacrificial film 78 and a surplus protective layer 72 are removed by dry etching. By this etching, a recess is formed in the upper surface 32 of the protective layer 80. The depth of the recess is preferably 30 nm or less. As the depth of the recess, either the maximum depth or average depth may be used.

At the time of completion of CMP, the sacrificial film 78 or the protective layer 72 unavoidably remains on the cap layer 6c. Penetration of water or the like into the interlayer insulating layer 7b after removal of the cap layer 6c during CMP can therefore be prevented. Such penetration of water is likely to occur when the cap layer 6c is very thin. The present embodiment makes it possible to prevent deterioration of the reliability of a semiconductor device which will otherwise occur due to such penetration of water.

Figure 34:
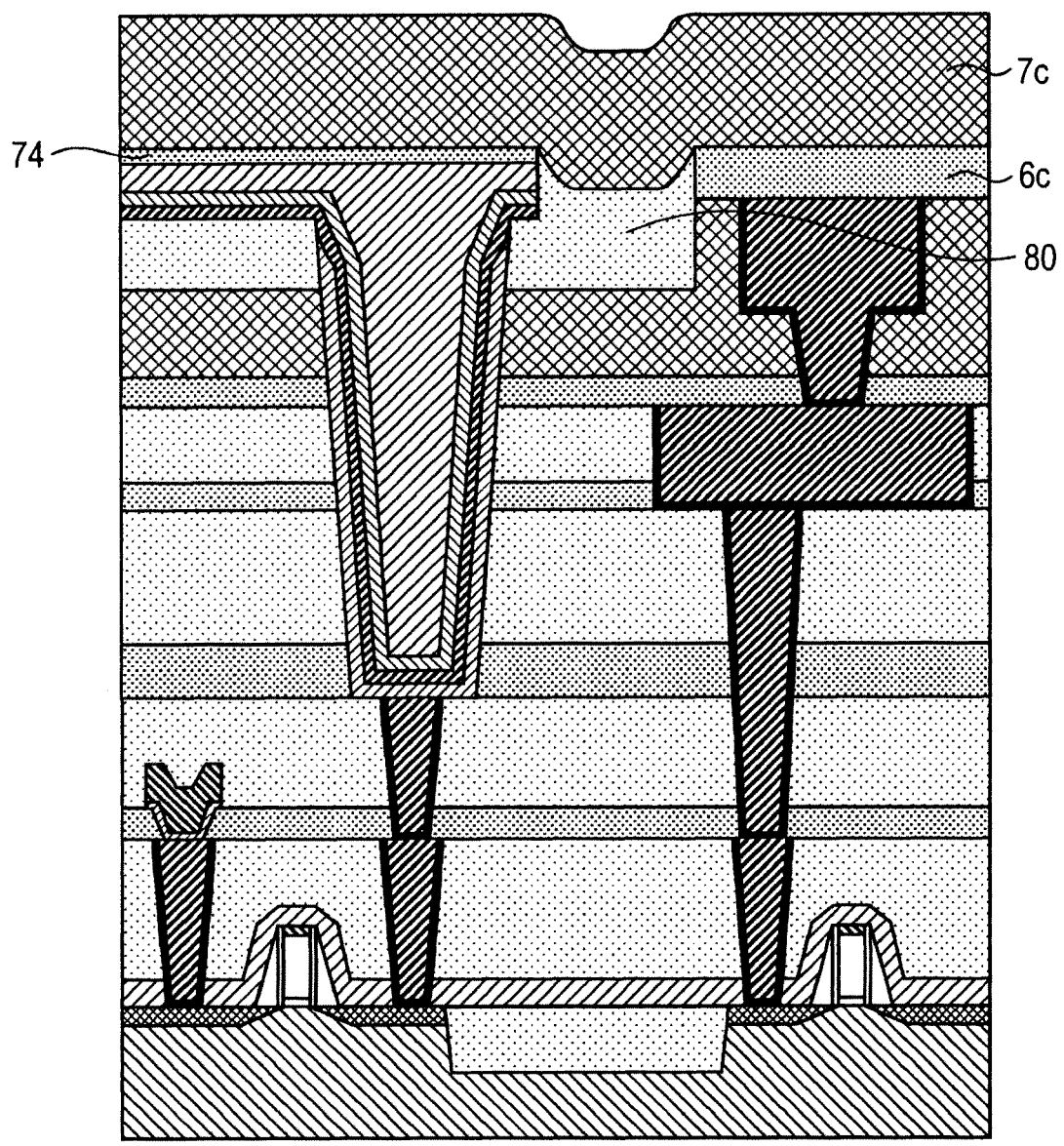
FIG. 34 is a cross-sectional view showing a step of the manufacturing procedure of the semiconductor device according to a third embodiment.

Next, as shown in FIG. 34, an interlayer insulating layer 7c is formed on the upper surface of the protective layer 80. Steps thereafter are conducted as in the second embodiment. Thus, the semiconductor device of the third embodiment can be obtained.

Figure 35:
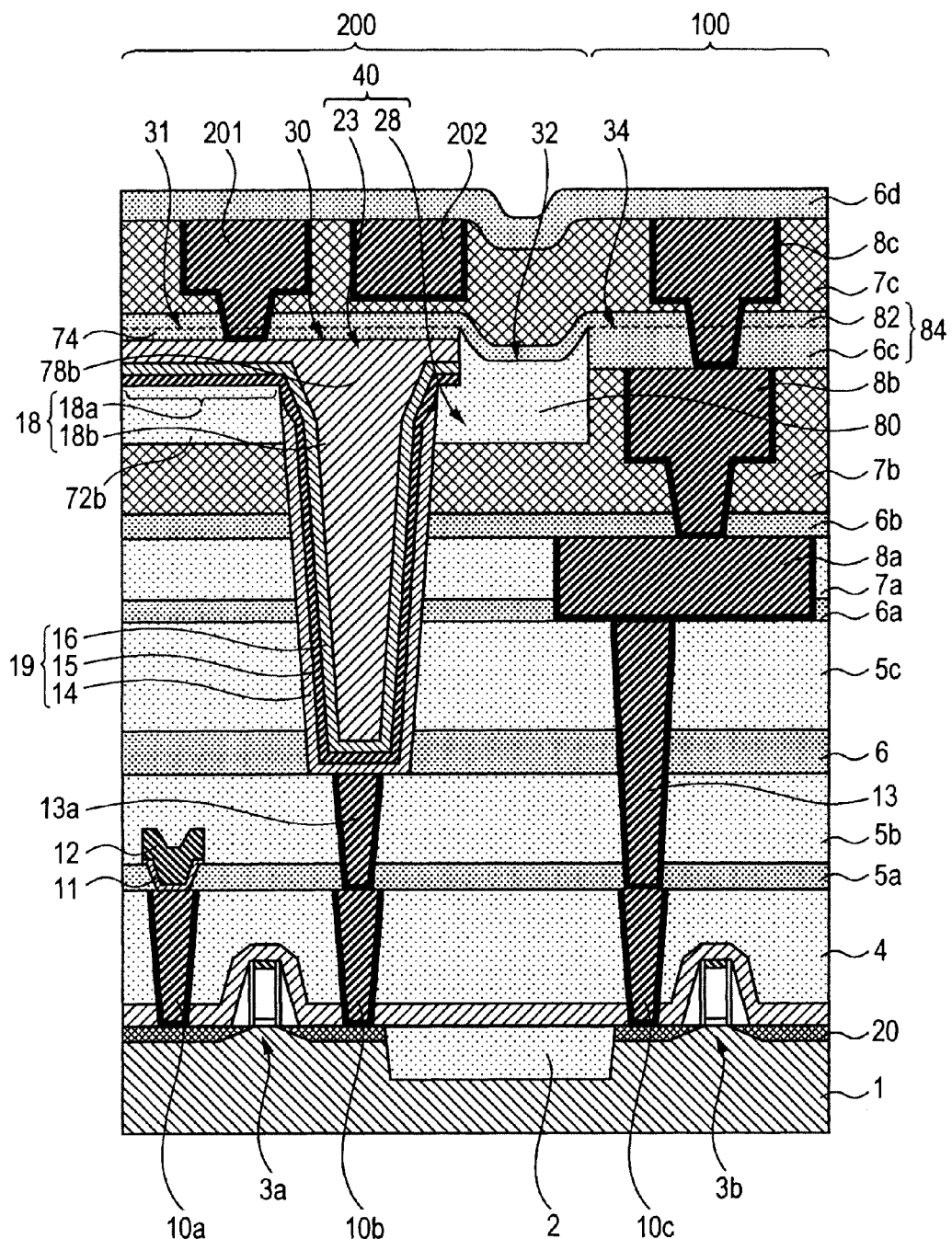
FIG. 35 is a cross-sectional view schematically showing a semiconductor device according to a fourth embodiment.
Figure 36:
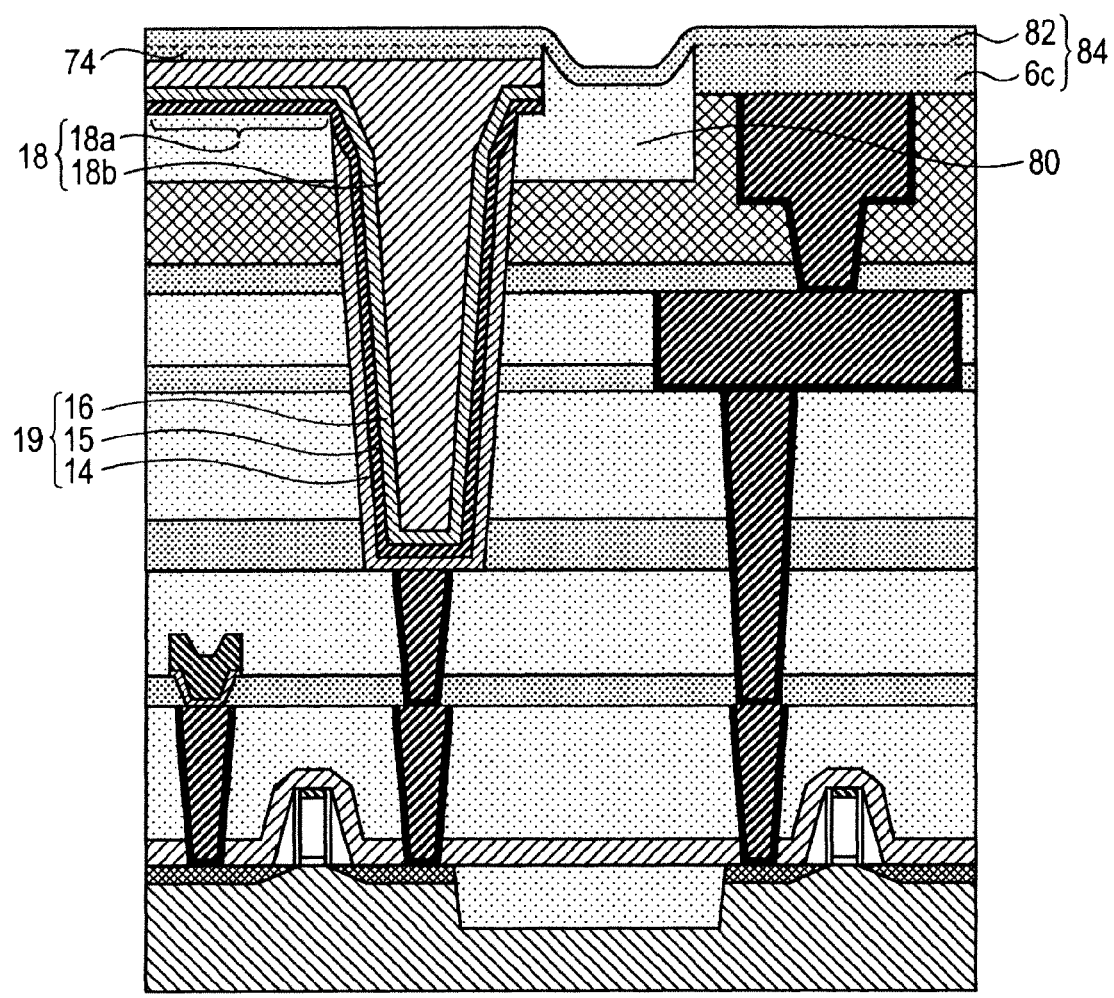
FIG. 36 is a cross-sectional view showing a step of a manufacturing procedure of the semiconductor device according to the fourth embodiment.

(Fourth Embodiment) Next, a semiconductor device of a fourth embodiment will be described referring to drawings. FIG. 35 is a cross-sectional view showing the structure of the semiconductor device of the fourth embodiment. FIG. 36 is a view showing the step of a manufacturing method of the semiconductor device of the fourth embodiment. The semiconductor device of the fourth embodiment is similar to that of the third embodiment except that a cap layer 82 is formed between the protective layer 80 and the interlayer insulating layer 7c. A recess is formed in the upper surface 32 of the protective layer 80. The cap layer 82 extends across the upper surface 31 of the cap layer 74, the upper surface 32 of the protective layer 80, and the upper surface 34 of the cap layer 6c. The fourth embodiment produces advantages similar to those of the third embodiment.

Figure 37:
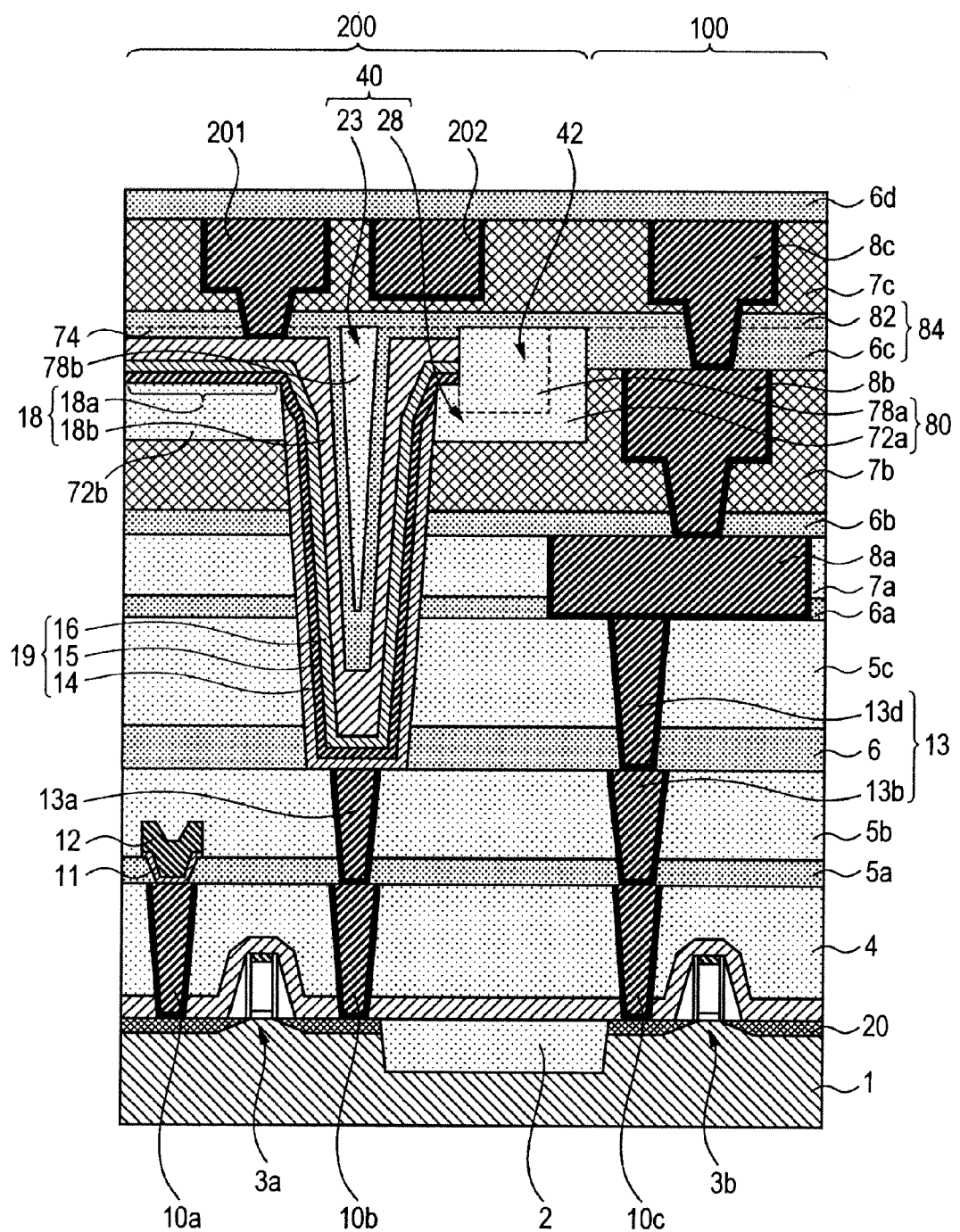
FIG. 37 is a cross-sectional view schematically showing a semiconductor device according to a fifth embodiment.

(Fifth Embodiment) Next, a semiconductor device of a fifth embodiment will be described referring to a drawing. FIG. 37 is a cross-sectional view showing the structure of the semiconductor device of the fifth embodiment. The semiconductor device of the fifth embodiment is similar to that of the first embodiment except that the coupling contact 13 is a two-stage contact. The coupling contact 13 has a coupling contact 13d and a coupling contact 13b. The coupling contact 13d is continuously coupled to the coupling contact 13b in the film thickness direction. This structure reduces an aspect ratio of each of these contacts, making it possible to provide a semiconductor device having improved manufacturing stability. In addition, a decrease in the length of the coupling contact 13 leads to reduction in contact resistance of the coupling contact 13. As a result, a semiconductor device having an improved operation rate can be obtained. In addition, the fifth embodiment can produce advantages similar to those of the first embodiment.

Figure 38:
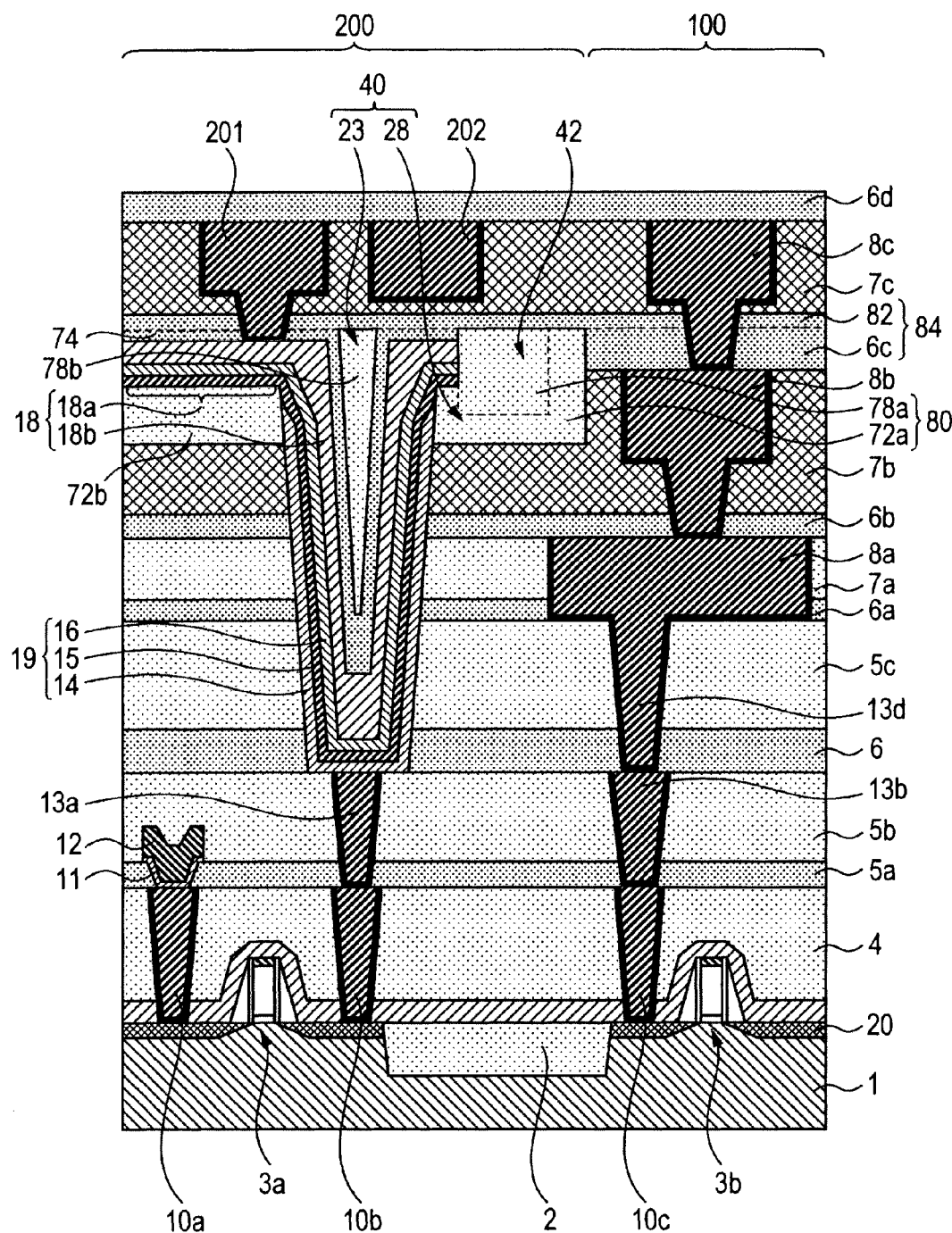
FIG. 38 is cross-sectional view schematically showing a semiconductor device according to a sixth embodiment.

(Sixth Embodiment) Next, a semiconductor device of a sixth embodiment will be described referring to drawings. FIG. 38 is a cross-sectional view showing the structure of the semiconductor device of the sixth embodiment. The semiconductor device of the sixth embodiment is similar to that of the first embodiment except that the wiring 8a (first wiring) which is the bottom wiring layer has a damascene structure. The wiring 8a configures a single damascene structure or a dual damascene structure with the coupling contact 13d, preferably a dual damascene structure. The wiring 8a is buried in the interlayer insulating layer 7a. The coupling contact 13d is buried in the contact interlayer insulating layer 5c. These interlayer insulating layer 7a and contact interlayer insulating layer 5c are preferably a low-dielectric-constant film. Since the wiring 8a has a dual damascene structure, the resulting semiconductor device can have an improved operation rate. In addition, the coupling contact 13d is not the same contact as the coupling contact 13b. Further, as the material of the coupling contact 13d, a metal containing Cu can be used. Cu is a material having lower resistance than W. The aspect ratio therefore decreases, leading to a decrease in contact resistance. Compared with the first embodiment, the present embodiment can provide a semiconductor device having considerably improved manufacturing stability and at the same time having an increased operation rate.

The capacitor 19 extends across a plurality of wiring layers. All the wirings formed in the same layer as the capacitor 19 may have a dual damascene structure. In addition, for the insulating layer formed in the same layer as the capacitor 19, a low-dielectric-constant film can be used. As a result, the resulting semiconductor device can have a further increased operation rate.

In addition, the sixth embodiment produces advantages similar to those of the first embodiment. The sixth embodiment can reduce the parasitic capacitance and parasitic resistance greatly compared with the first embodiment. Moreover, a difference in design parameter between a Pure Logic chip and a logic portion of a mixed DRAM can be decreased. This makes it possible to reduce the number of steps necessary for re-designing when IP designed with a pure logic product is used in a mixed DRAM. In addition, by using a low-k film as the bit line layer, thereby reducing the parasitic capacitance of the bit line and widening a signal voltage margin during DRAM reading, the sixth embodiment also has an advantage of improving the reliability of the operation.

Figure 39:
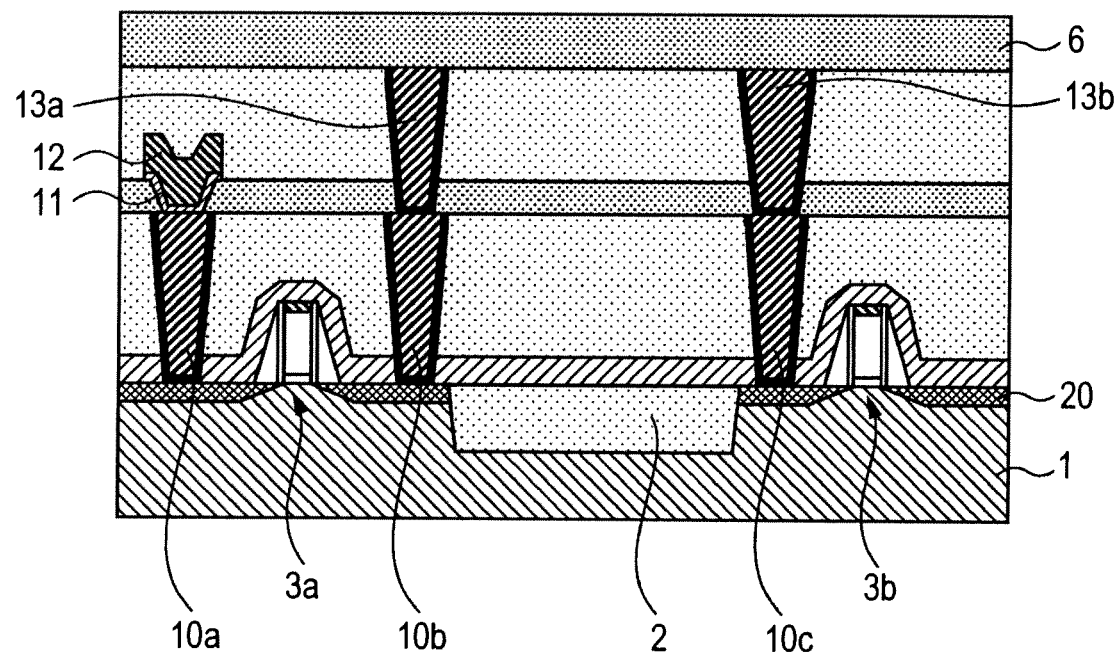
FIG. 39 is a cross-sectional view showing a step of a manufacturing procedure of the semiconductor device according to the sixth embodiment.

A manufacturing method of the semiconductor device of the sixth embodiment will next be described in detail referring to drawings. FIGS. 39 to 45 are views showing the steps of the manufacturing method of the semiconductor device of the sixth embodiment. First, similar to the first embodiment, the structure shown in FIG. 39 is manufactured.

Figure 40:
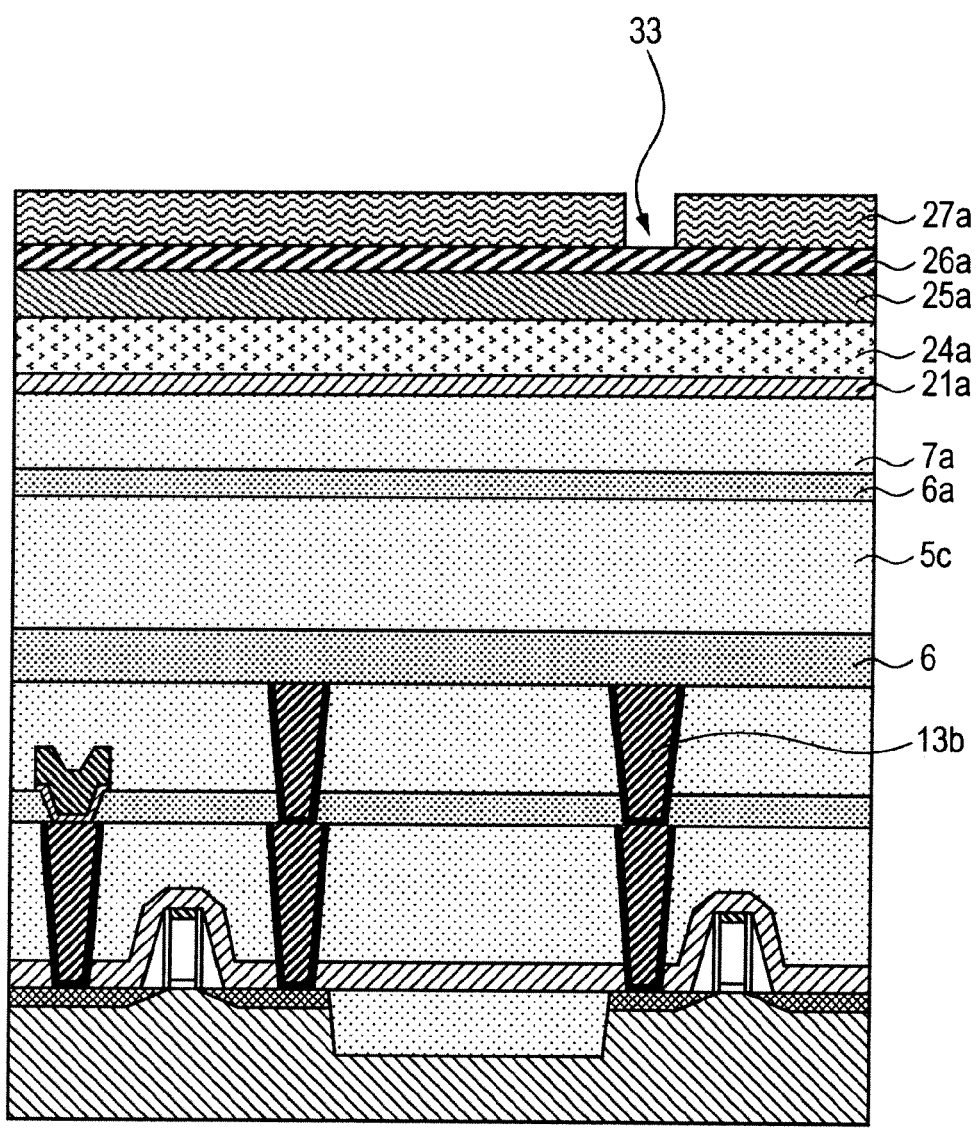
FIG. 40 is a cross-sectional view showing a step of the manufacturing procedure of the semiconductor device according to the sixth embodiment.

Next, as shown in FIG. 40, a contact interlayer insulating layer 5c, a cap layer 6a, an interlayer insulating layer 7a, and a hard mask 21a are deposited on the cap layer 6. Next, a multilayer resist layer composed of a bottom resist 24a (flat film), a low-temperature oxide film 25a, an antireflection film 26a, and a photoresist 27a is formed on the hard mask 21a. The photoresist 27a is formed, for example, by the method of application and a desired via pattern of a logic circuit is transferred by photolithography to form an opening portion 33.

Figure 41:
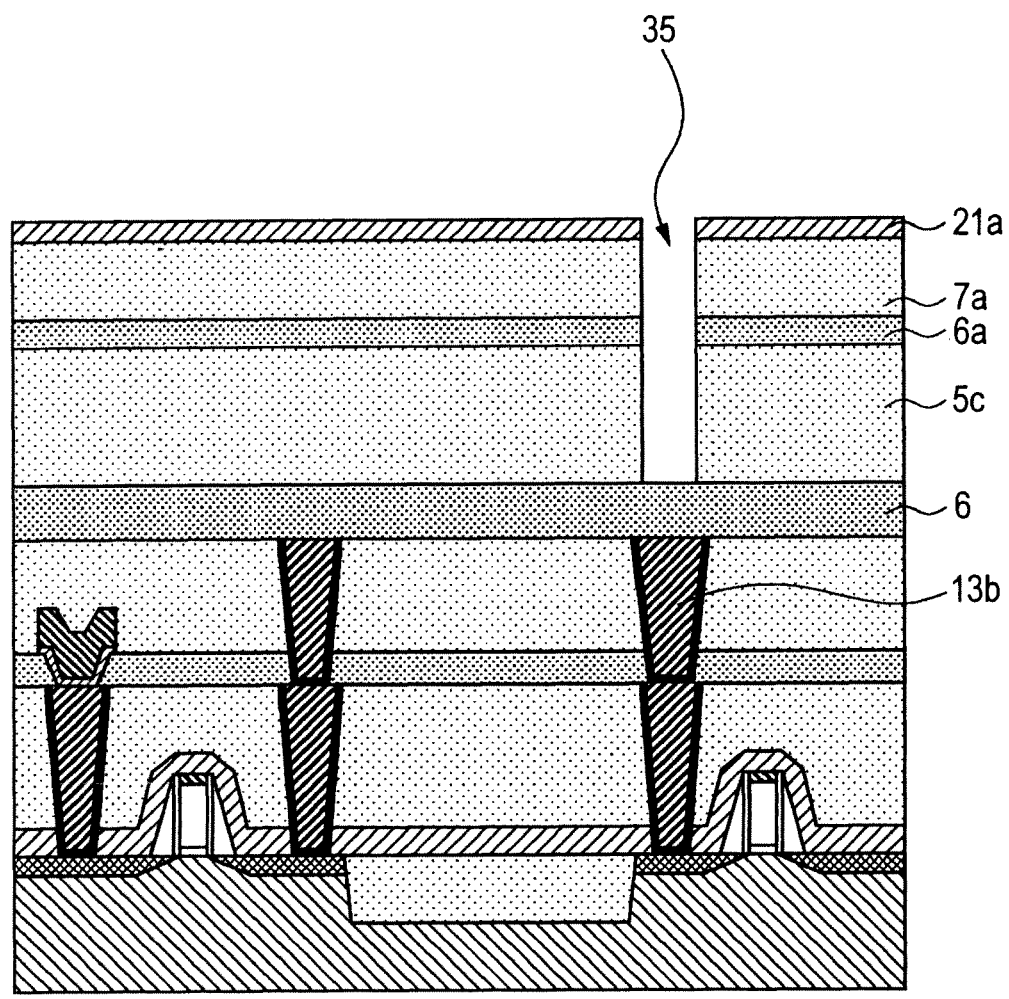
FIG. 41 is a cross-sectional view showing a step of the manufacturing procedure of the semiconductor device according to the sixth embodiment.

Next, as shown in FIG. 41, with the photoresist 27a as a mask, reactive ion etching or the like method is conducted to form an opening portion 35 of a via and remove these multilayer resist layers. For example, after removal of the photoresist 27a by ashing, the hard mask 21a is left on the interlayer insulating layer 7a.

Figure 42:
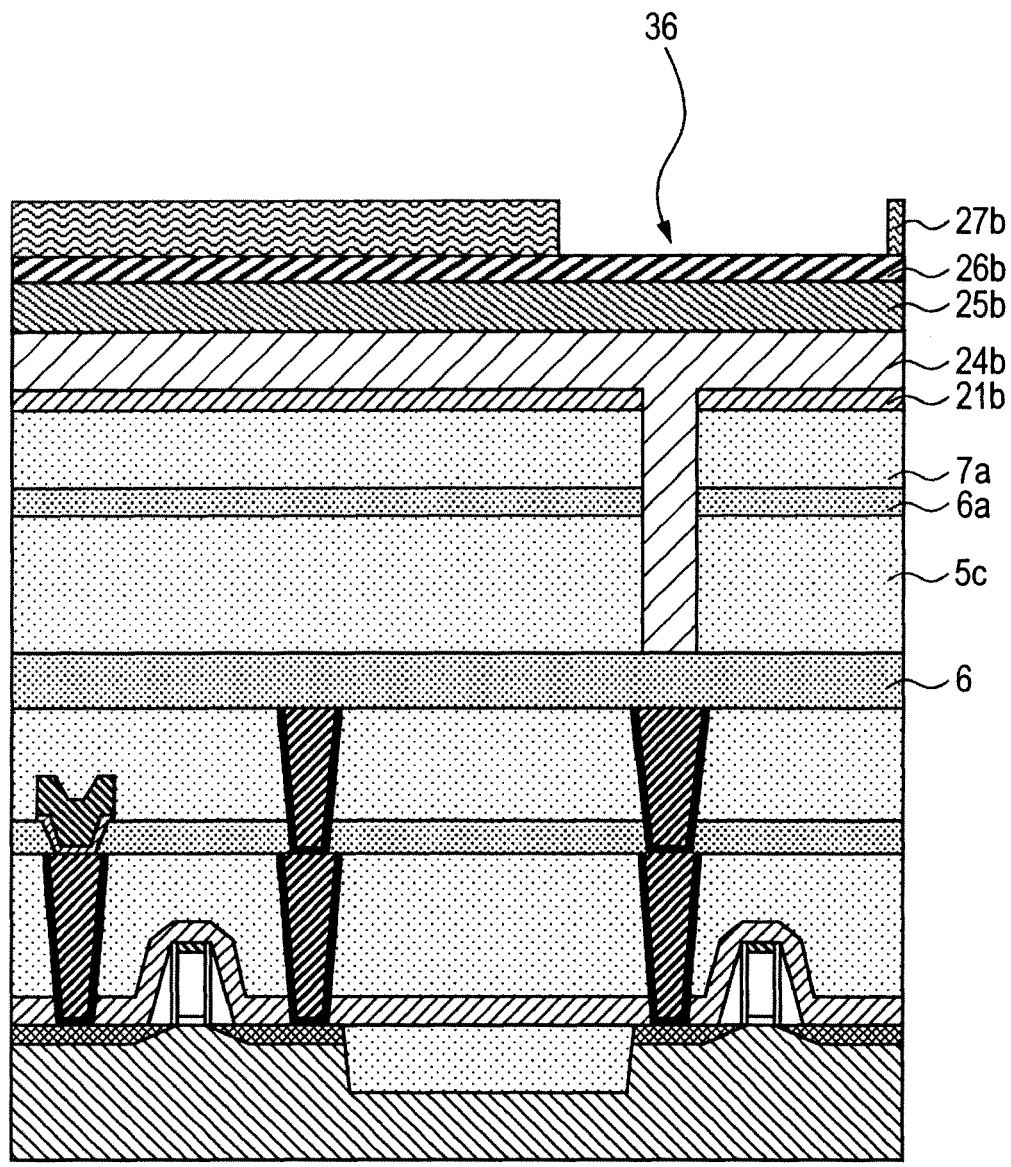
FIG. 42 is a cross-sectional view showing a step of the manufacturing procedure of the semiconductor device according to the sixth embodiment.

Next, as shown in FIG. 42, a multilayer resist layer composed of a bottom resist 24b (flat film), a low-temperature oxide film 25b, an antireflection film 26b, and a photoresist 27b is formed on the hard mask 21a. In this photoresist 27b, an opening portion 36 of a desired circuit pattern is formed by photolithography.

Figure 43:
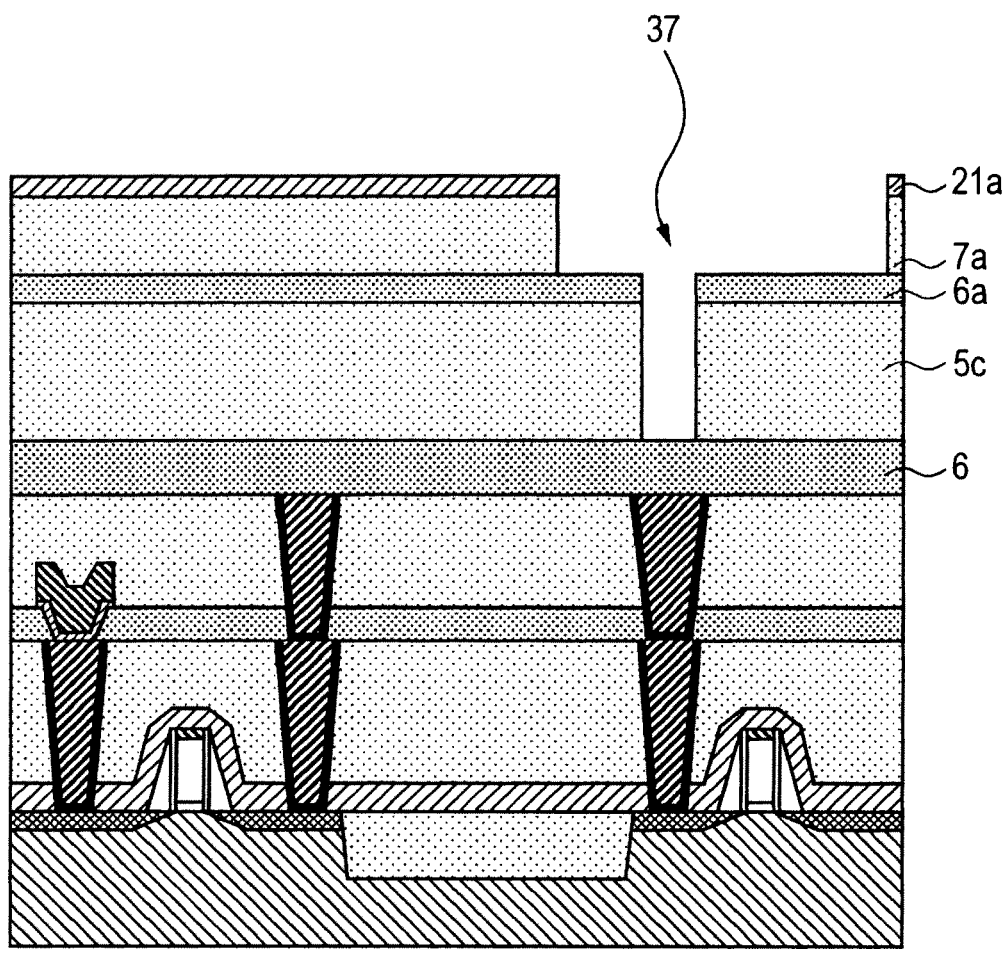
FIG. 43 is a cross-sectional view showing a step of the manufacturing procedure of the semiconductor device according to the sixth embodiment.

Next, as shown in FIG. 43, with the photoresist 27b as a mask, reactive ion etching or the like method is conducted to form an opening portion 37 of a wiring. After formation of the opening portion 37 of a wiring, the cap layer 6a is etched under conditions in which an etch rate to the cap layer 6a is higher than an etch rate to the interlayer insulating layer 7a to form a coupling opening portion to the coupling contact 13b of the logic circuit. Then, the multilayer resist layer is removed. Although not illustrated, after formation of the opening portion 37 of a wiring, reactive ion etching may be conducted to remove the hard mask 21a.

Figure 44:
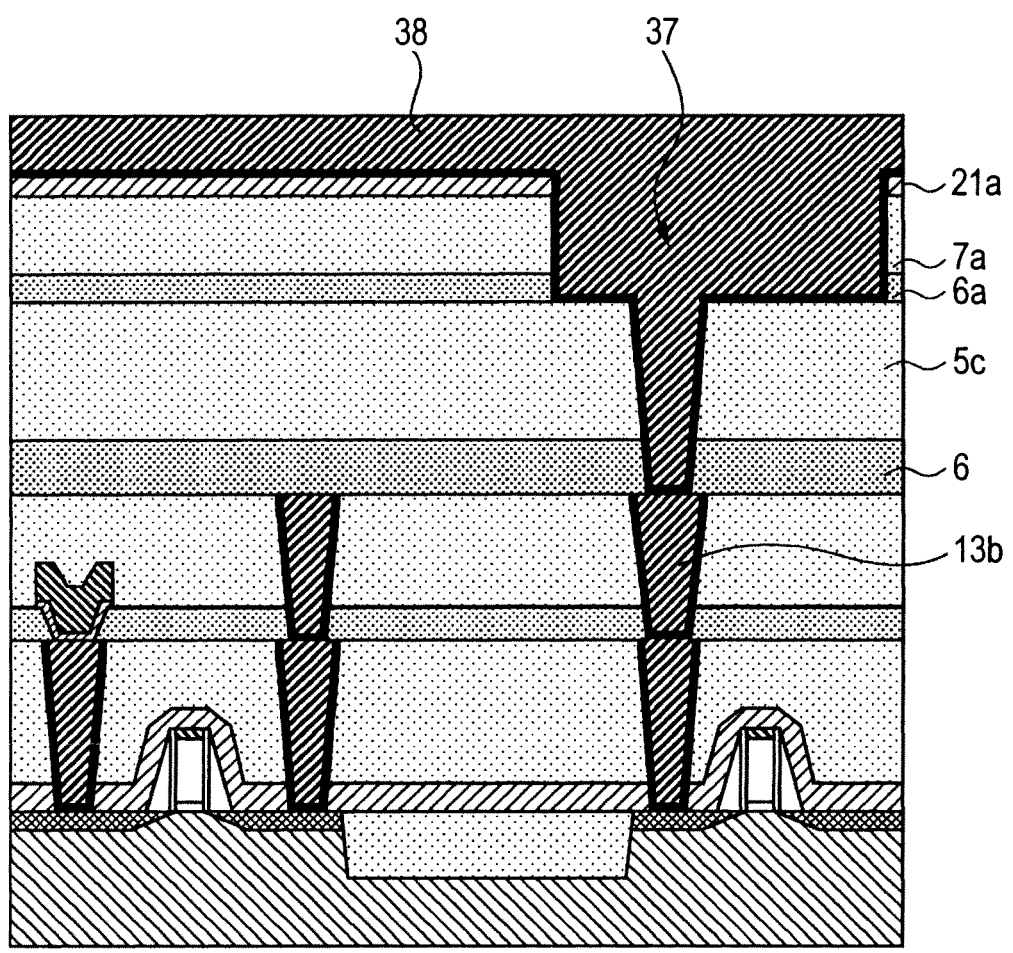
FIG. 44 is a cross-sectional view showing a step of the manufacturing procedure of the semiconductor device according to the sixth embodiment.

Next as shown in FIG. 44, a barrier metal film (not illustrated) and a conductive film 38 are buried simultaneously in the opening portion 37 of the wiring of the logic circuit. As the material configuring the barrier metal film, titanium, tantalum, or ruthenium, or nitride thereof, of a film stack thereof may be used. The barrier metal film has preferably a configuration not permitting diffusion of the conductive film 38. As the conductive film 38, a material ordinarily used for forming a wiring of a semiconductor device such as copper or an alloy having copper as a main component may be used.

Figure 45:
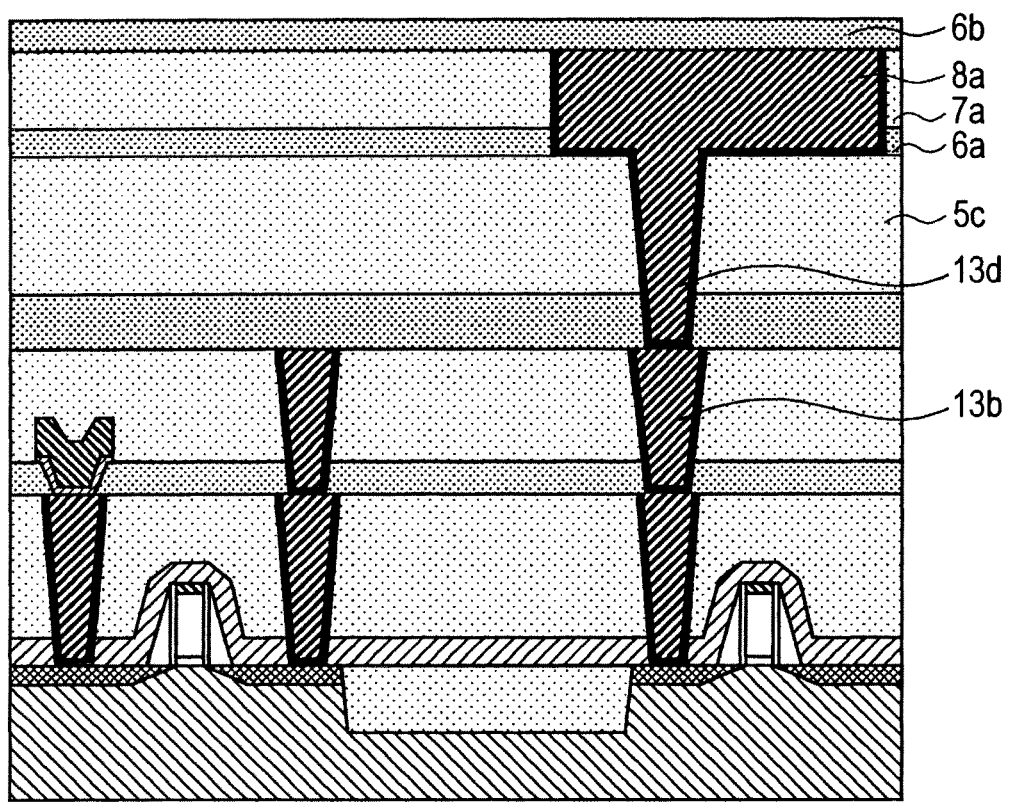
FIG. 45 is a cross-sectional view showing a step of the manufacturing procedure of the semiconductor device according to the sixth embodiment.

Next, as shown in FIG. 45, CMP or the like method is conducted to remove the conductive film 38, the barrier metal film, and the hard mask 21a to form a wiring 8a and a coupling contact 13d configuring the logic circuit. Then, a cap layer 6b is formed on the wiring 8a. Steps similar to those employed in the first embodiment are conducted thereafter to obtain the semiconductor device of the sixth embodiment.

Figure 46:
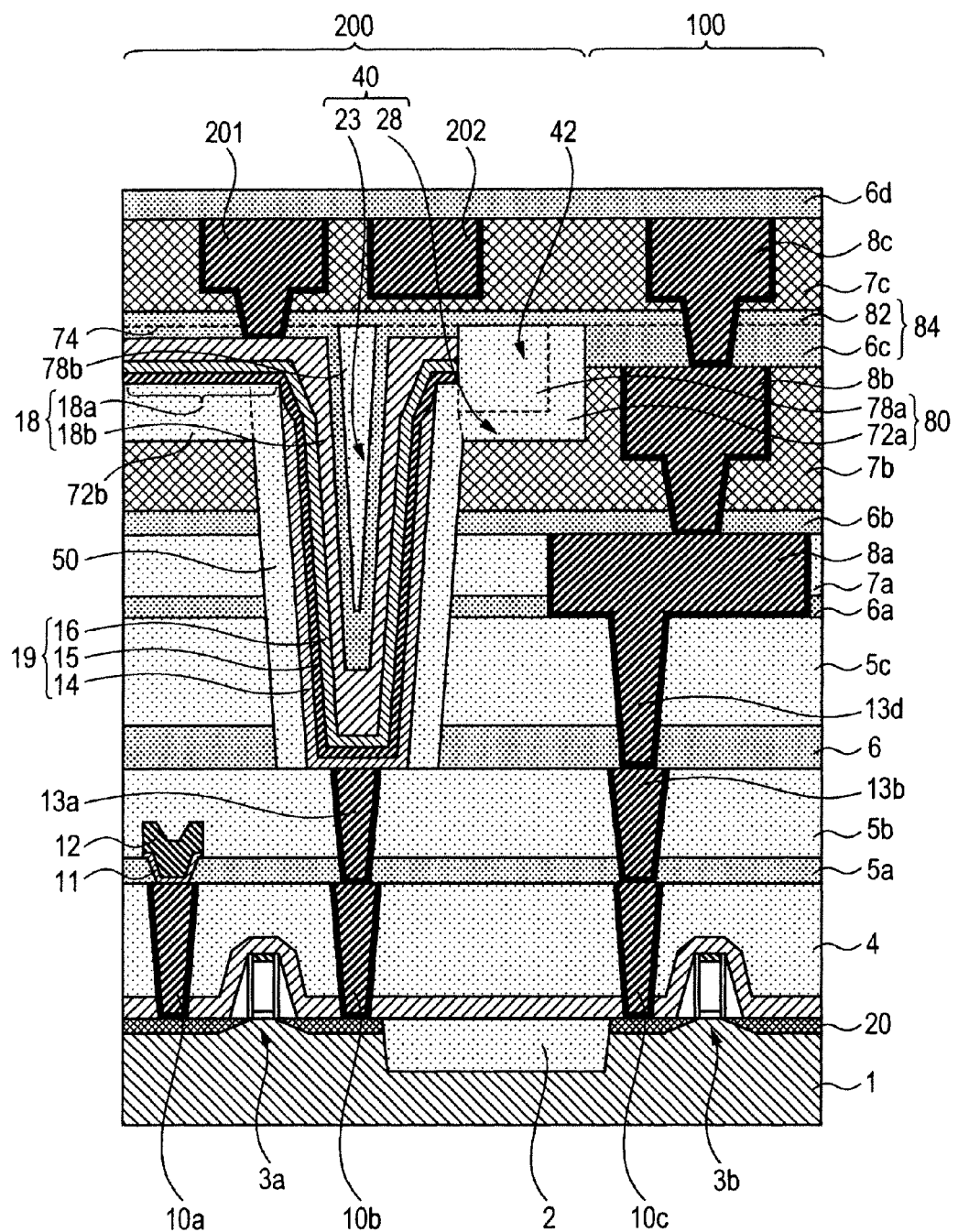
FIG. 46 is a cross-sectional view schematically showing a semiconductor device according to a seventh embodiment.

(Seventh Embodiment) Next, a semiconductor device of a seventh embodiment will be described referring to drawings. FIG. 46 is a cross-sectional view showing the structure of the semiconductor device of the seventh embodiment. The seventh embodiment is similar to the sixth embodiment except that a sidewall protective film 50 is provided between the lower electrode 14 and the interlayer insulating layer. In the present embodiment, any of the contact interlayer insulating layer 5c, the interlayer insulating layer 7a, and the interlayer insulating layer 7b (interlayer insulating layers in which the capacitor 19 has been formed) is preferably a low-dielectric-constant film.

The sidewall protective film 50 is formed on the side walls of the hole 23. The sidewall protective film 50 preferably covers the entire side walls of the lower electrode 14 so as to prevent the lower electrode 14 from being brought into contact with an interlayer insulating layer between capacitors. In recently developed miniaturized semiconductor devices, a so-called porous film, which is a film having minute pores therein, is sometimes used inside the interlayer insulating layer 7a and 7b in order to reduce a relative dielectric constant between wirings. As shown in the present embodiment, forming the sidewall protective film 50 between two adjacent capacitors 19 makes it possible to prevent invasion of the lower electrode 14 into the interlayer insulating layers 7a and 7b in a region between them. The lower electrode 14 can therefore be formed stably, which is effective for reducing a leakage current between the lower electrodes 14 of two adjacent capacitors 19 and improving the long-term insulation reliability.

As the sidewall protective film 50, for example, a barrier insulating film containing an organosilica compound such as divinylsiloxane benzocyclobutene described as a barrier insulating film in International Patent Publication No. 2004/107434 may be used. Alternatively, a silicon nitride (SiN), silicon carbide (SiC), silicon carbonitride (SiCN), or silicon oxycarbide film may be used as the sidewall protective film 50. In the present embodiment, the density of the sidewall protective film 50 (deposited layer) may be made greater than that of the insulating layers (interlayer insulating layers 7a and 7b) adjacent thereto. The material of the sidewall protective film 50 may be of the same kind as that of the protective layer 80. This improves the adhesion between the sidewall protective film 50 and the protective layer 80 and heightens manufacturing stability. In addition, the seventh embodiment produces advantages similar to those of the sixth embodiment.

Figure 47:
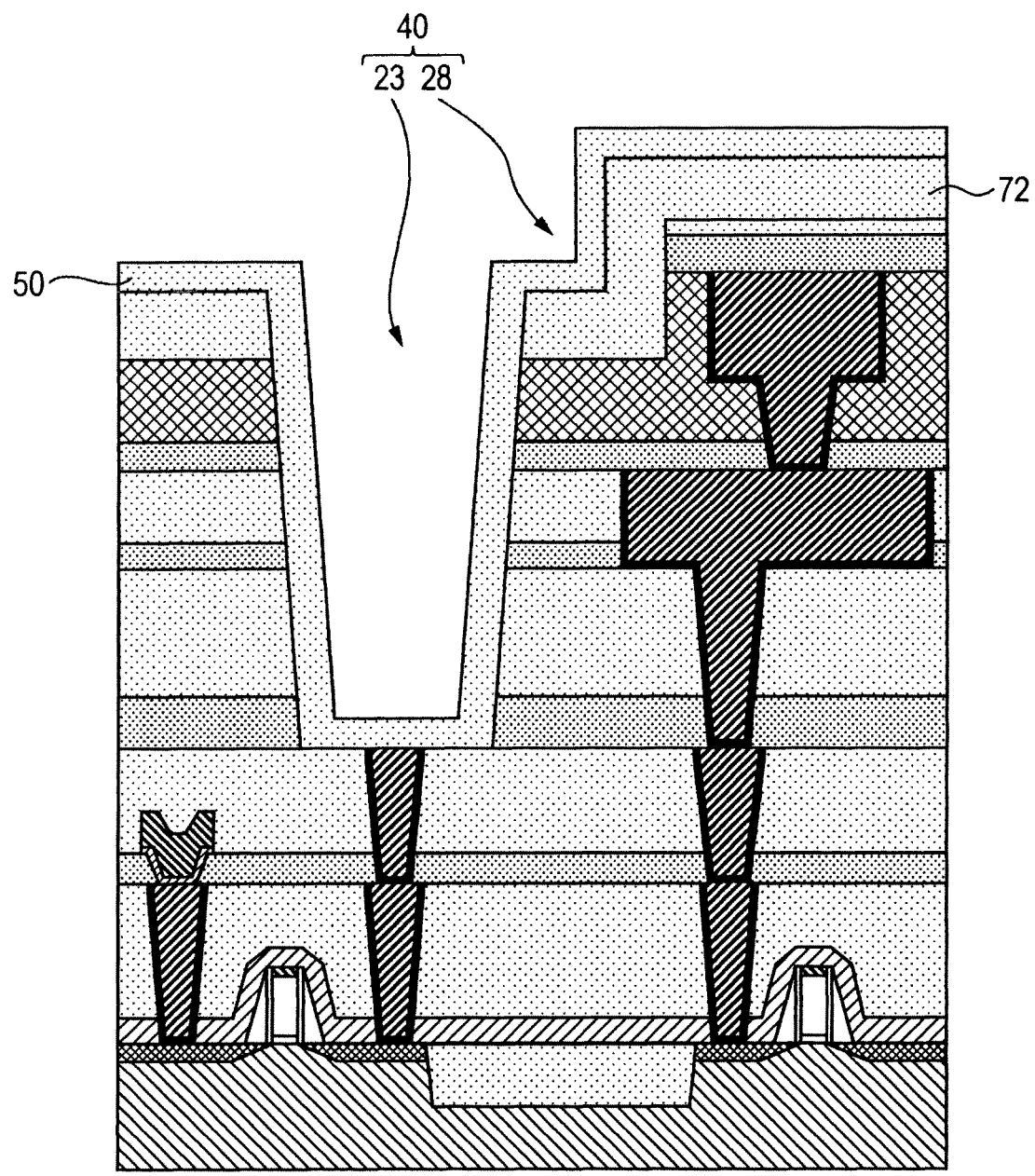
FIG. 47 is a cross-sectional view showing a step of a manufacturing procedure of the semiconductor device according to the seventh embodiment.
Figure 48:
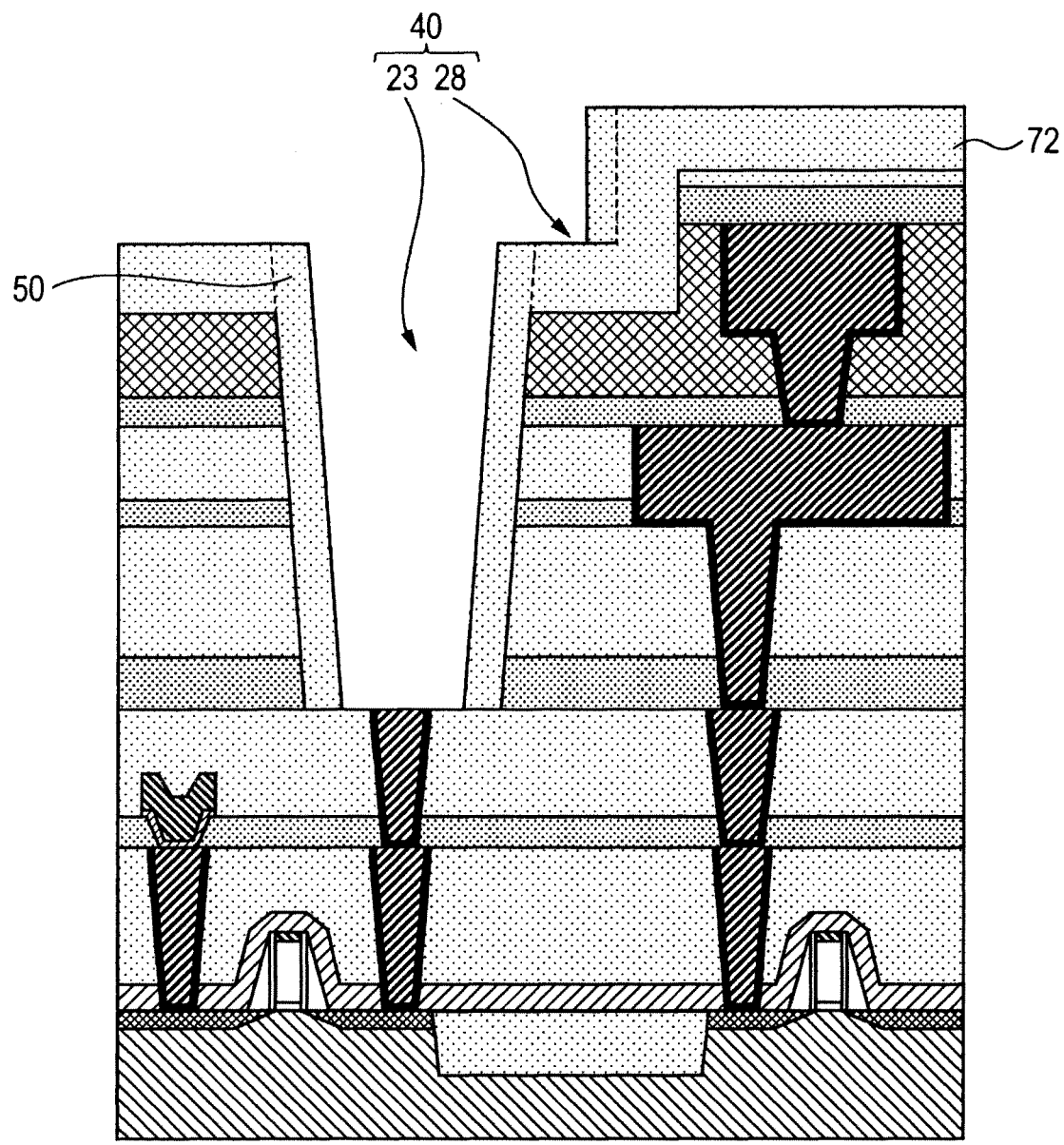
FIG. 48 is a cross-sectional view showing a step of the manufacturing procedure of the semiconductor device according to the seventh embodiment.

A manufacturing method of the semiconductor device of the seventh embodiment will next be described in detail referring to drawings. FIGS. 47 to 48 are views showing steps of the manufacturing method of the semiconductor device of the seventh embodiment. In a similar manner to that of the first embodiment, the structure shown in FIG. 9 is obtained. In the semiconductor device of the seventh embodiment, however, the wiring 8a having a dual damascene structure is formed by reference to the sixth embodiment. Next, as shown in FIG. 47, the sidewall protective film 50 is formed on at least the side walls of the hole 23. The sidewall protective film 50 is formed on the bottom surface of the hole 23 and also on the upper surface of the protective layer 72 placed on the bottom surface of the trench 28. The sidewall protective film 50 can be formed, for example, by ALD or CVD.

The sidewall protective film 50 (deposited layer) is preferably an insulating film containing at least a silicon atom. For example, an insulating film formed using chemical vapor deposition such as silicon oxide ($SiO_2$), silicon carbide (SiC), silicon nitride (SiN), or silicon carbonitride (SiCN) film, an insulating film containing silicon, oxygen and carbon, which film is usually called "low-dielectric-constant film", or a film formed by plasma polymerization such as benzocyclobutene may be used. In short, in order to produce the advantage of the present embodiment, an insulating film capable of blocking pore portions formed on the side wall of the interlayer insulating layers 7a and 7b is used.

Next, as shown in FIG. 48, at least the sidewall protective film 50 on the bottom surface of the opening portion 23 is etched back, for example, by reactive ion etching or RF sputtering. This means that the sidewall protective film 50 other than that formed on the side wall can be removed by highly anisotropic entire-surface etch back. This sidewall protective film 50 is particularly effective when a porous insulating film made of continuous pores is used as the interlayer insulating layer. The porous insulating film made of continuous pores is formed by decomposing a low-temperature heat-decomposable organic matter present in the film and thereby forming pores by heating the substrate while exposing to ultraviolet light. The low-temperature heat-decomposable organic matter is introduced by causing an interlayer insulating layer to grow by using a mixed gas of a low-temperature heat-decomposable organic matter gas and a source gas for forming the interlayer insulating layer or by using a source molecule of the interlayer insulating layer bound with a low-temperature heat-decomposable organic matter. At least a porous insulating film obtained by, after a step of causing an interlayer insulating layer to grow, carrying out a step of decomposing the organic matter by exposing to ultraviolet light while heating the substrate can be used. Then, steps similar to those employed in the first embodiment are conducted to obtain the semiconductor device of the seventh embodiment.

Figure 49:
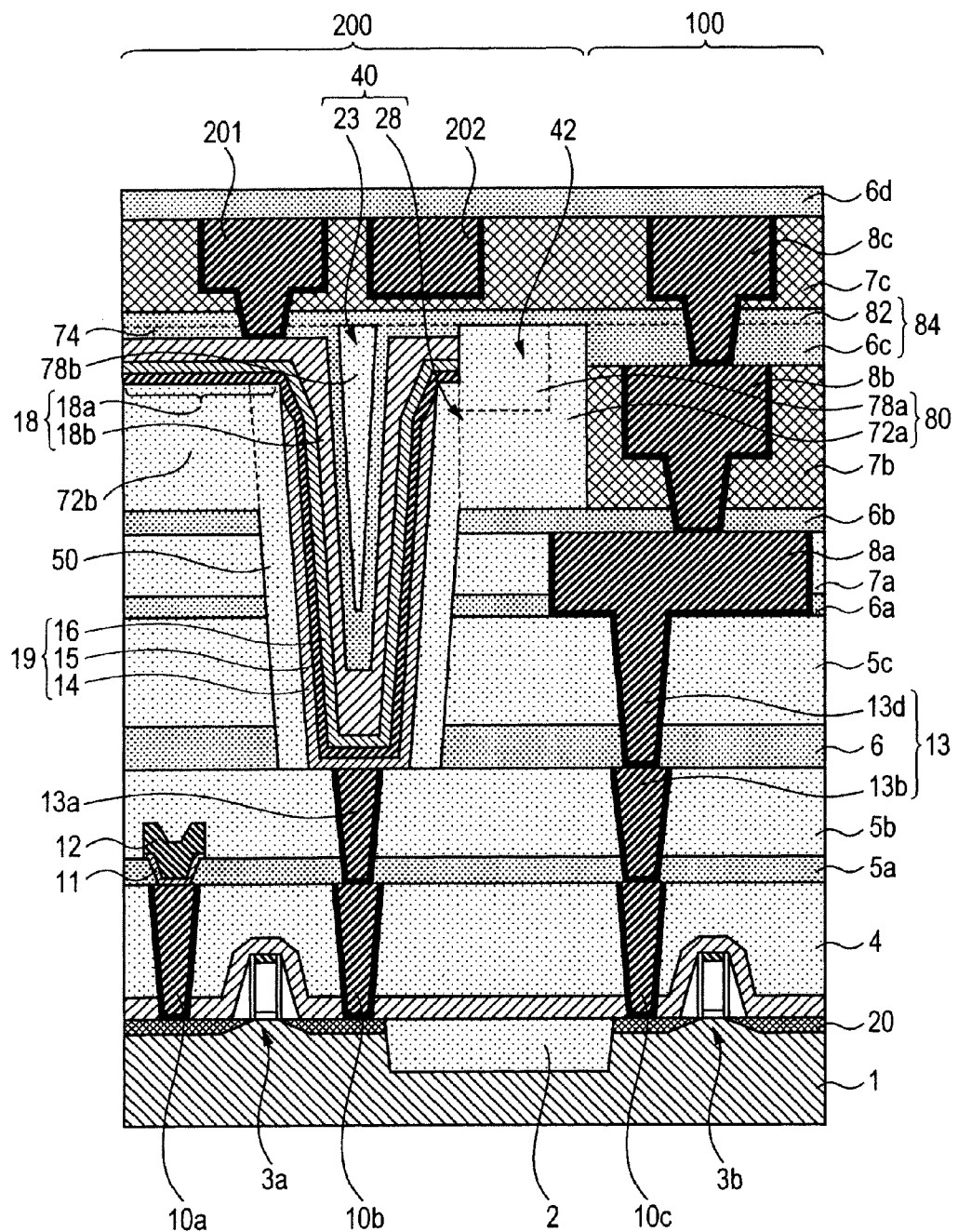
FIG. 49 is a cross-sectional view schematically showing a semiconductor device according to an eighth embodiment.

(Eighth Embodiment) Next, a semiconductor device of an eighth embodiment will be described referring to drawings. FIG. 49 is a cross-sectional view showing the structure of the semiconductor device of the eighth embodiment. The eighth embodiment is similar to the seventh embodiment except that the protective layer 80 extends completely over the side wall of the interlayer insulating layer 7b. The protective layer 80 is in contact with the cap layer 6b. In other words, the interlayer insulating layer 7b at the periphery of the capacitor 19 has been substituted with the protective layer 80. This interlayer insulating layer 7b is placed in the same layer as the protective layer 80 or the upper coupling wiring 18. The protective layer 72b has a film thickness equal to that of the interlayer insulating layer 7b. The protective layer 72b is filled fully in the uppermost layer in the space portion between the capacitors 19. The uppermost layer corresponds to the interlayer insulating layer configuring the uppermost wiring layer of the multilayer wiring layer in which the capacitor 19 has been buried. The protective layer 78a and the protective layer 72b may have a film thickness greater than that of the interlayer insulating layer 7b which is in the same layer as these layers.

As described above, the protective layer 80 is placed all over the side wall of one insulating layer (interlayer insulating layer 7b). This insulating layer is placed in the same layer as the upper coupling wiring 18 and configures one wiring layer of the multilayer wiring layer placed in the logic circuit region. The bottom surface of the protective layer 80 is in contact with the upper surface of the cap layer 6b without the interlayer insulating layer 7b therebetween. This means that since the etched interlayer insulating layer 7b is not present between the protective layer 80 and the cap layer 6b, variation in the film thickness of the protective layer 80 among products can be prevented. This means that etching can be conducted to the cap layer 6b without stopping it in the interlayer insulating layer 7b. As a result, control of the remaining film thickness of the interlayer insulating layer 7b becomes unnecessary. Variation in height of the hole 23 formed in the protective layer 80 can also be suppressed so that variation in the capacitance of the capacitor can be reduced. The eighth embodiment can produce advantages similar to those of the seventh embodiment.

Figure 50:
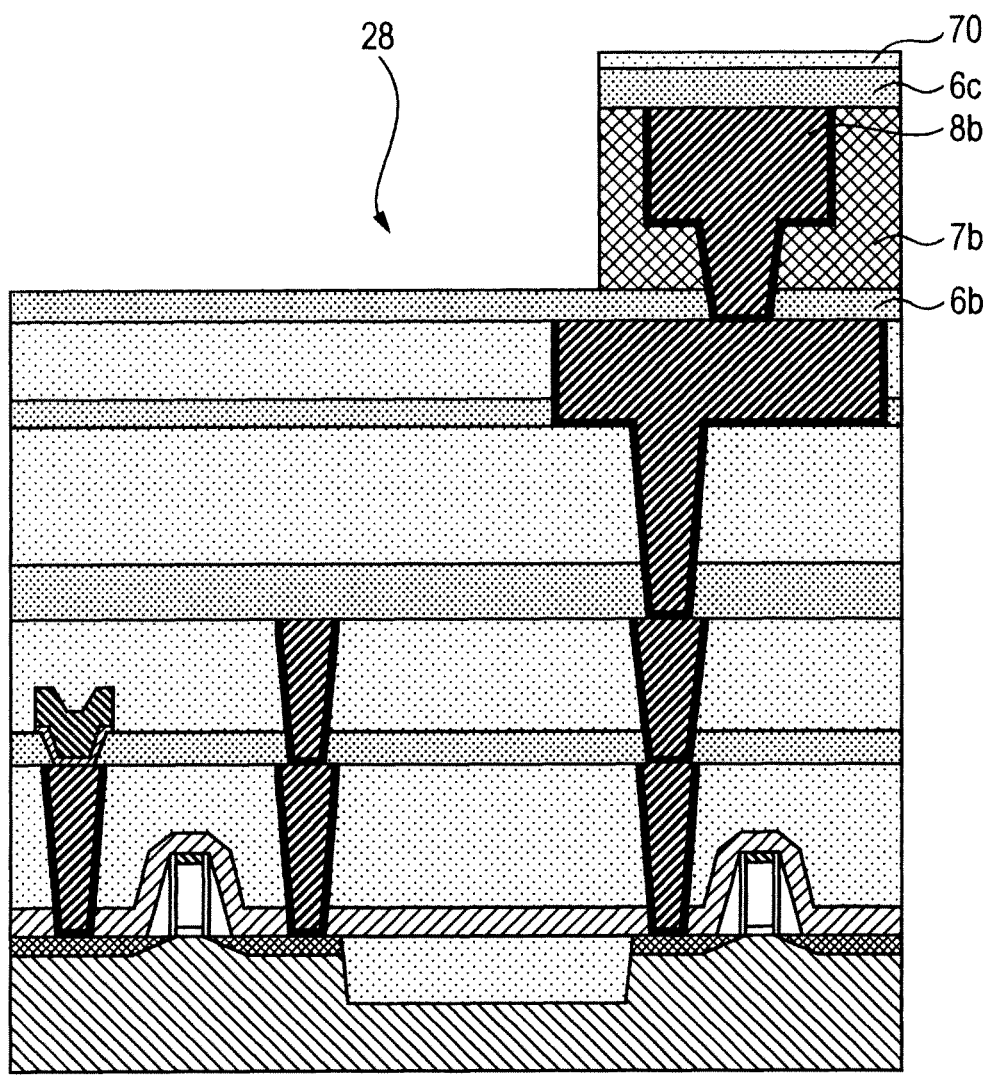
FIG. 50 is a cross-sectional view showing a step of a manufacturing procedure of the semiconductor device according to the eighth embodiment.
Figure 51:
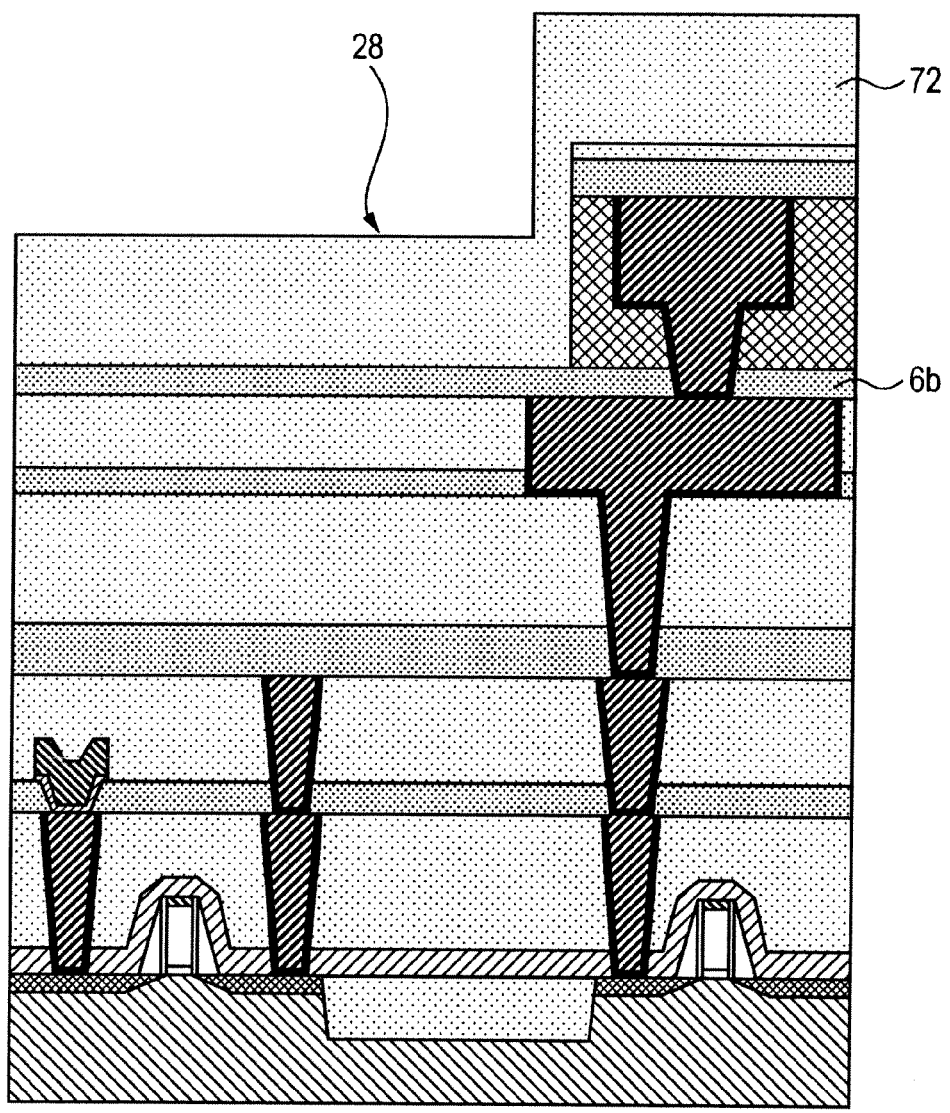
FIG. 51 is a cross-sectional view showing a step of the manufacturing procedure of the semiconductor device according to the eighth embodiment.
Figure 52:
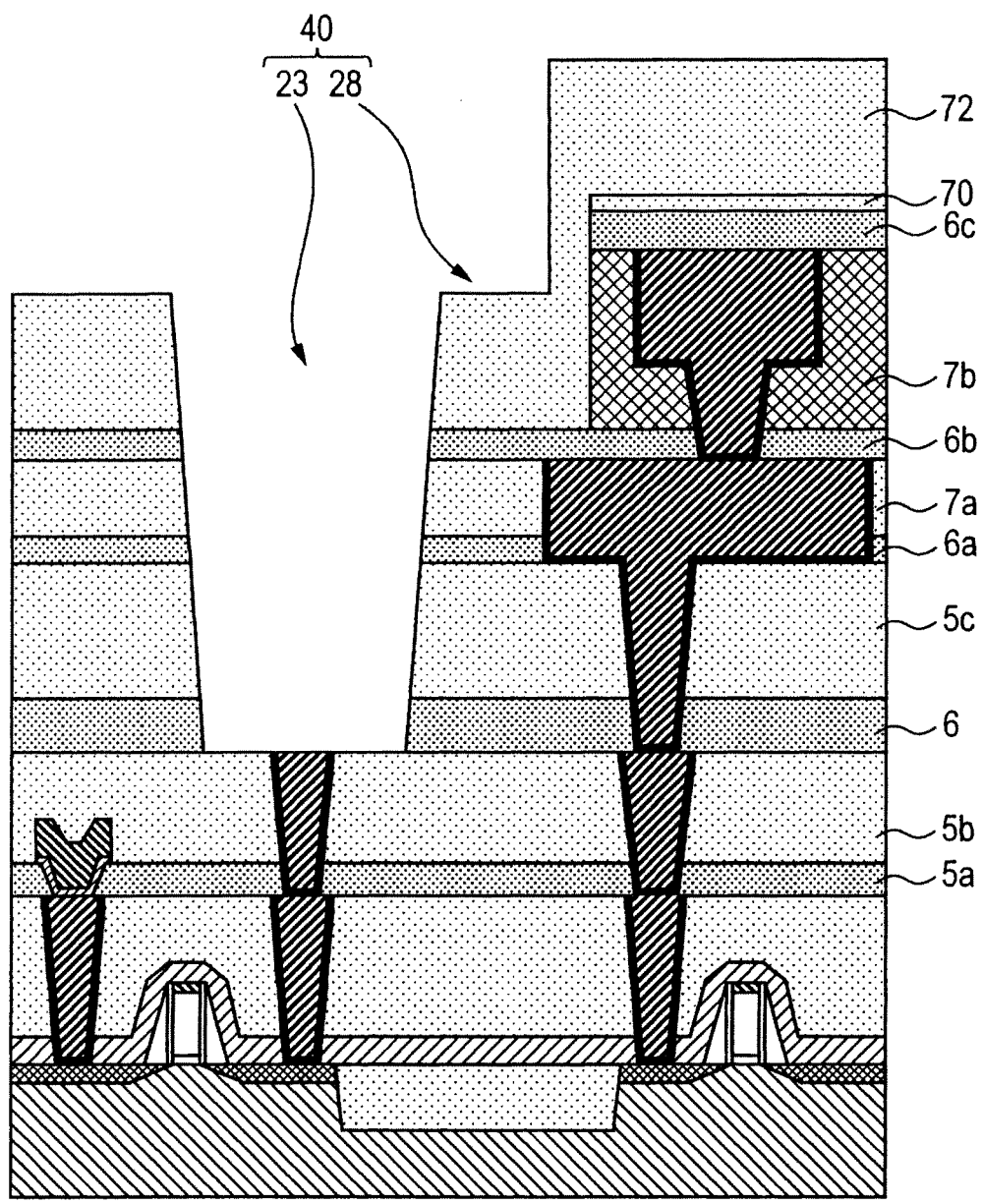
FIG. 52 is a cross-sectional view showing a step of the manufacturing procedure of the semiconductor device according to the eighth embodiment.

Next, a manufacturing method of the semiconductor device according to the eighth embodiment will be described referring to drawings. FIGS. 50 to 52 are views showing the manufacturing method of the semiconductor device of the eighth embodiment. First, as in the first embodiment, the structure shown in FIG. 6 is manufactured. In this semiconductor device, however, a wiring having a dual damascene structure is formed as the wiring 8a based on the sixth embodiment. Then, as shown in FIG. 50, the interlayer insulating layer 7b placed in the memory circuit region is removed completely. As a result, the upper surface of the cap layer 6b is exposed from the bottom surface of the trench 28. Then, as shown in FIG. 51, a protective layer 72 is formed in the trench 28. The protective layer 72 is formed on the cap layer 6b. In addition, the protective layer 72 is formed all over the side wall of the interlayer insulating layer 7b. Then, as shown in FIG. 52, a hole 23 is formed selectively in the protective layer 72 placed on the cap layer 6b. Then, steps similar to those employed in the seventh embodiment are conducted to obtain the semiconductor device of the eighth embodiment.

Figure 53:
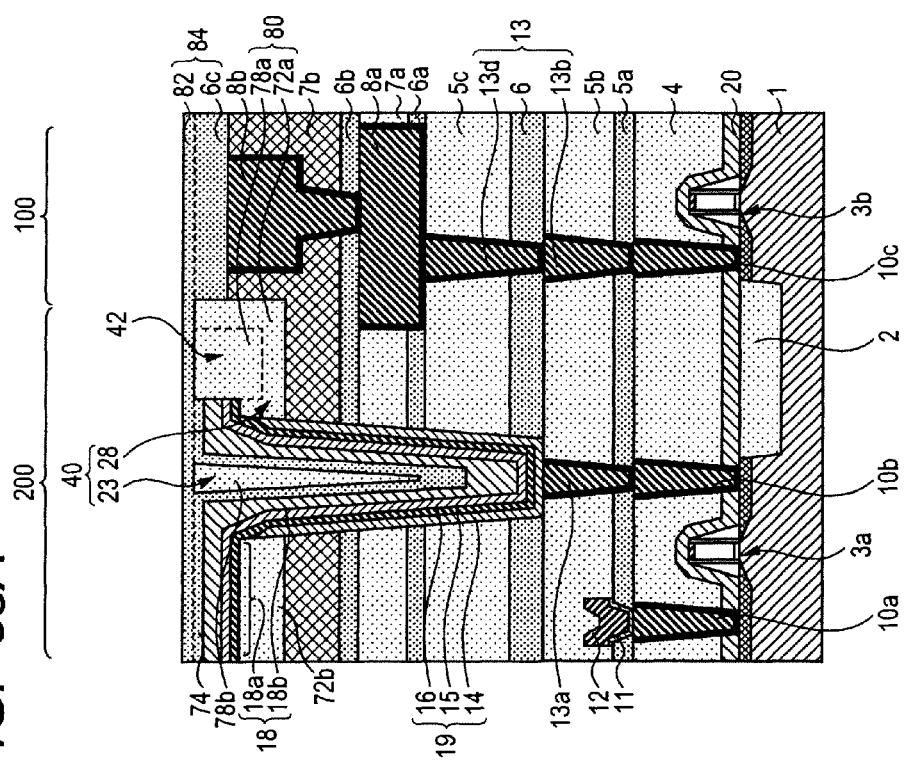
FIG. 53 is a view for describing the advantage of the semiconductor device of the present embodiment compared with that of Comparative Example.

Next, the advantage of the semiconductor device of the present embodiment will be described compared with Comparative Example. FIG. 53(a) shows the configuration of the semiconductor device of the first embodiment. On the other hand, FIG. 53(b) shows the configuration of a semiconductor device of Comparative example. Comparative Example is different from the first embodiment in that it has none of the memory circuit 200, the contact interlayer insulating layer 5a, and the contact interlayer insulating layer 5b. In short, Comparative Example has only circuit corresponding to the pure logic circuit of the first embodiment. By comparing the first embodiment with Comparative Example, influence of combining of a capacitor such as delay of circuit can be calculated.

Figure 54:
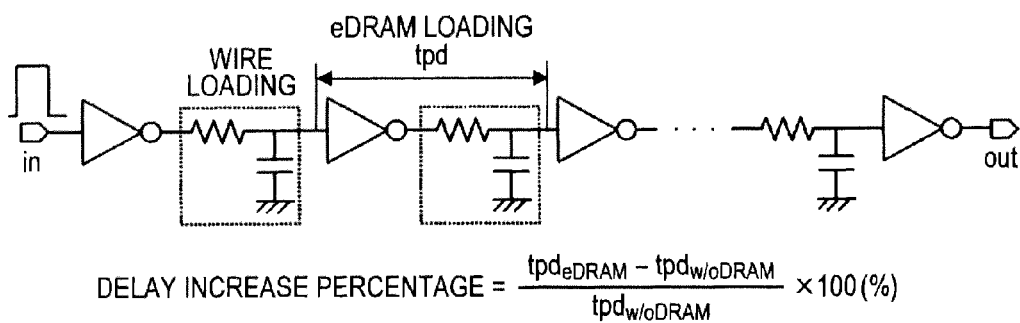
FIG. 54 is a view for describing a calculation method of a delay increase percentage.

FIG. 54 is a view for describing the calculation method of a delay increase percentage. Delay time per phase is calculated by inputting a pulse wave in a 10-phase inverter. As shown in FIG. 54, a wire load is added even without eDRAM. The delay increase percentage is therefore determined using an equation shown in the drawing.

Figure 55A:
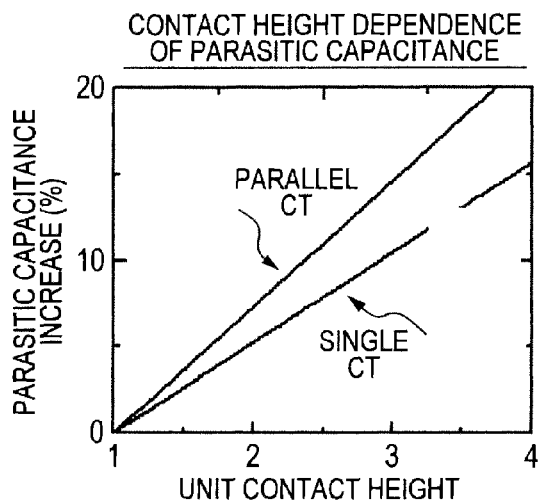
FIG. 55(a) is a graph for describing a parasitic capacitance increase percentage and FIG. 55(b) is a graph for describing a delay increase percentage.
Figure 55B:
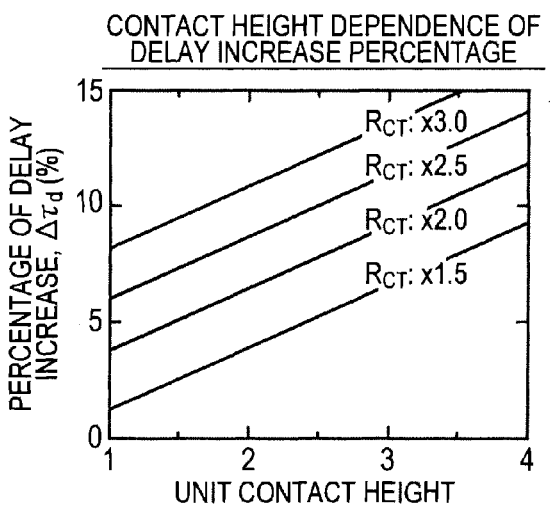

A parasitic capacitance increase is estimated using a capacitance simulator and delay is calculated using a circuit simulator. FIG. 55(a) is a view for describing a parasitic capacitance increase as calculated at a 28 nm node. Calculation results of the delay increase percentage based on the results obtained in FIG. 55(a) are shown in FIG. 55(b). FIG. 55(b) suggests that by increasing the contact height by twice or less, the delay increase can be suppressed to about 5% and by increasing the contact height by three times or less, the delay increase can be suppressed to about 10%.

Figure 56:
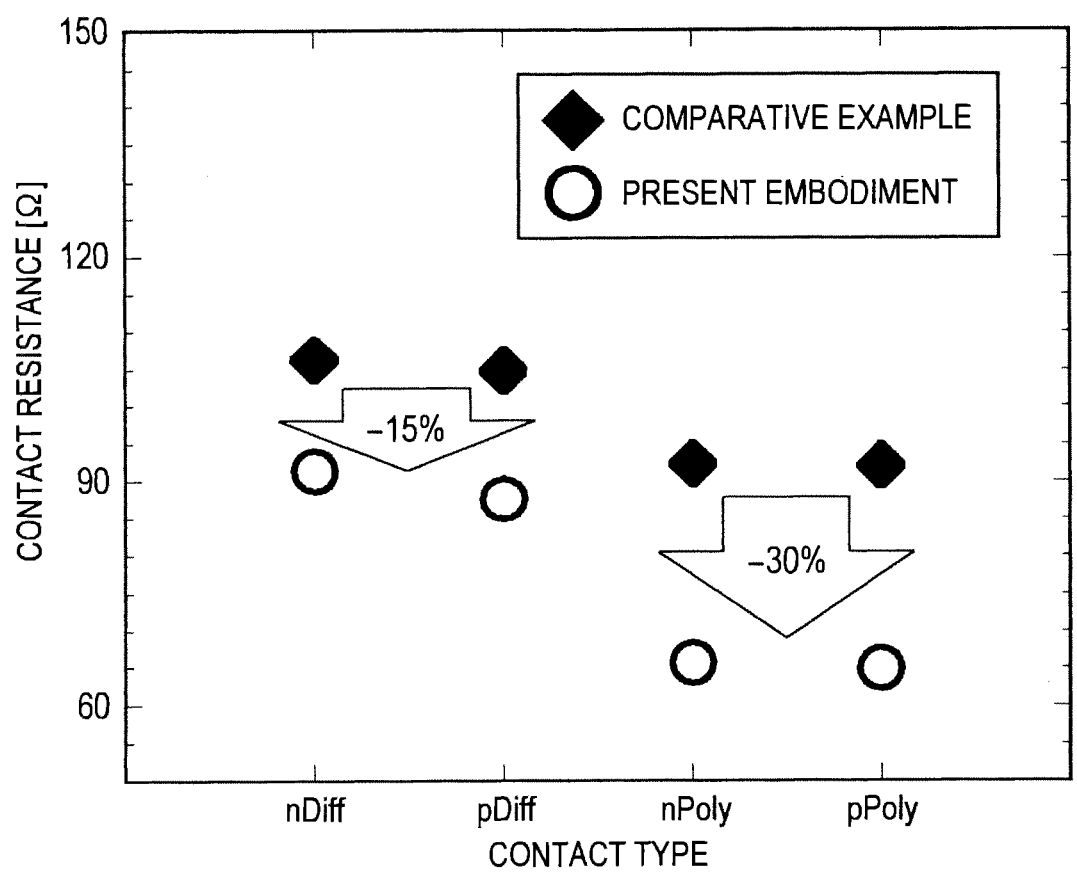
FIG. 56 is a graph for describing contact resistance.

FIG. 56 is a view for describing the contact resistance. It is measured at a 40 nm node. A cylinder (capacitor burying recess) is formed in a wiring layer to shorten a bypass contact. As a result, the contact resistance in the first embodiment decreases. FIG. 56 shows one example of it.

Figure 57:
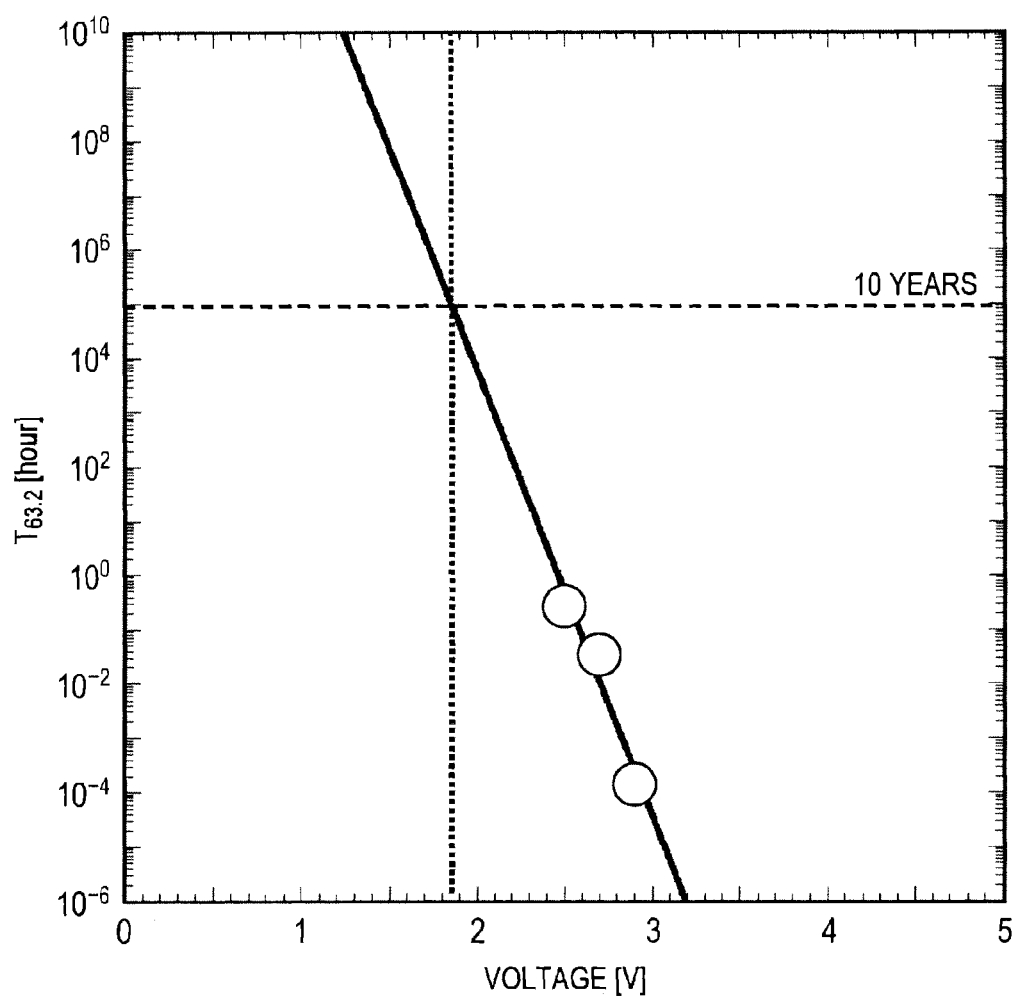
FIG. 57 is a graph for describing the lifetime of a MIM capacitor.

FIG. 57 is a view for describing the lifetime of an MIM capacitor. It shows that with regard to the lifetime of the MIM of the first embodiment, it does not break down for 10 years under the using environment of about 2V.

Figure 58:
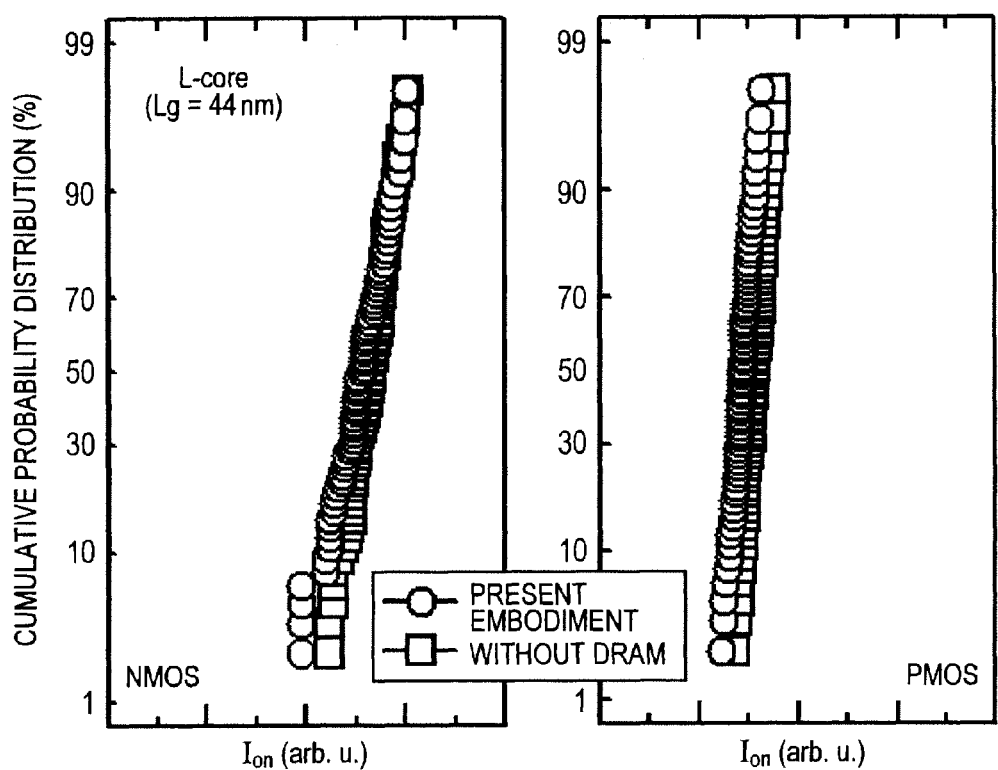
FIG. 58 is a graph for describing transistor characteristics.

FIG. 58 is a view for describing transistor characteristics. Measurement is conducted at 40 nm node. Even application of the first embodiment does not have an adverse effect on transistor characteristics. The transistor characteristics are equivalent to those of the logic circuit (w/o DRAM) of Comparative Example.

Figure 59:
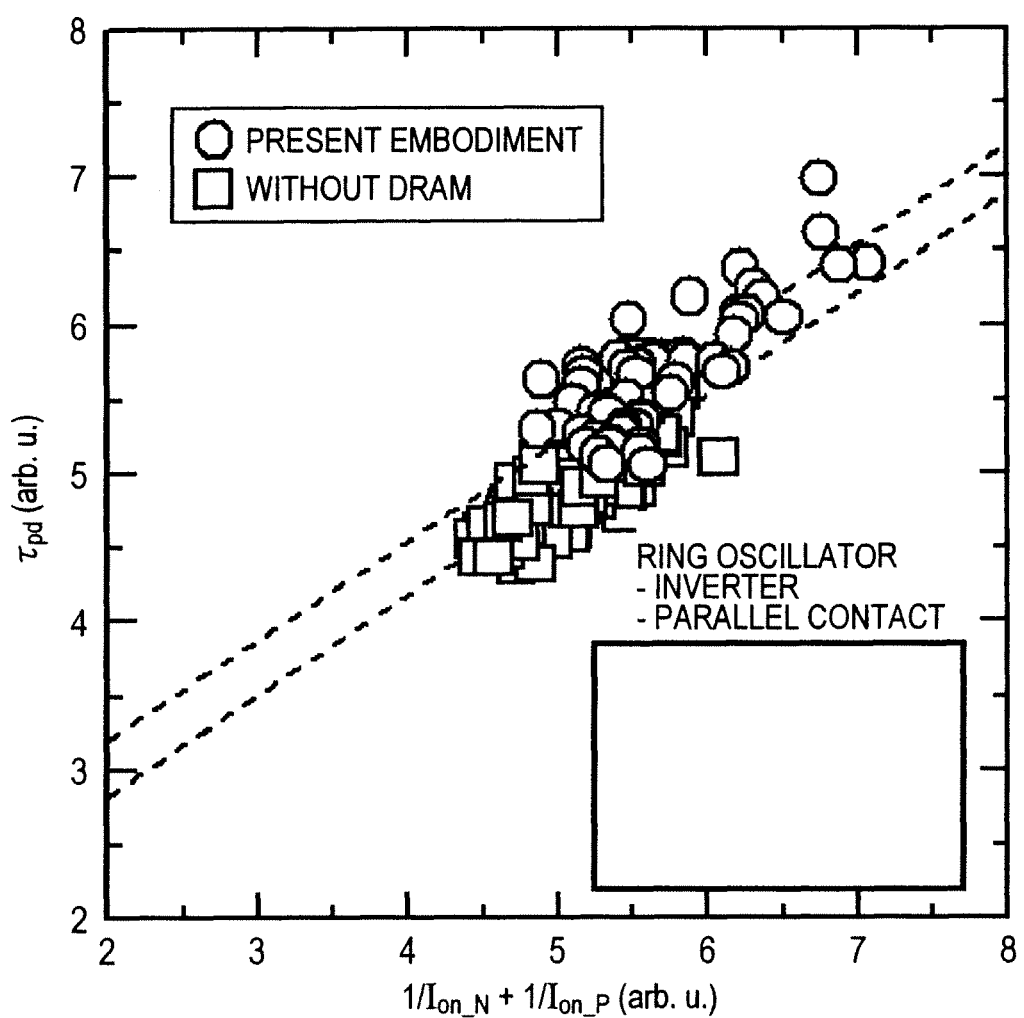
FIG. 59 is a graph for describing a delay increase percentage.

FIG. 59 is a view for describing a delay increase percentage. It is measured at a 40 nm node. The delay increase percentage in the first embodiment is about 5%, based on Comparative Example.

Figure 60:
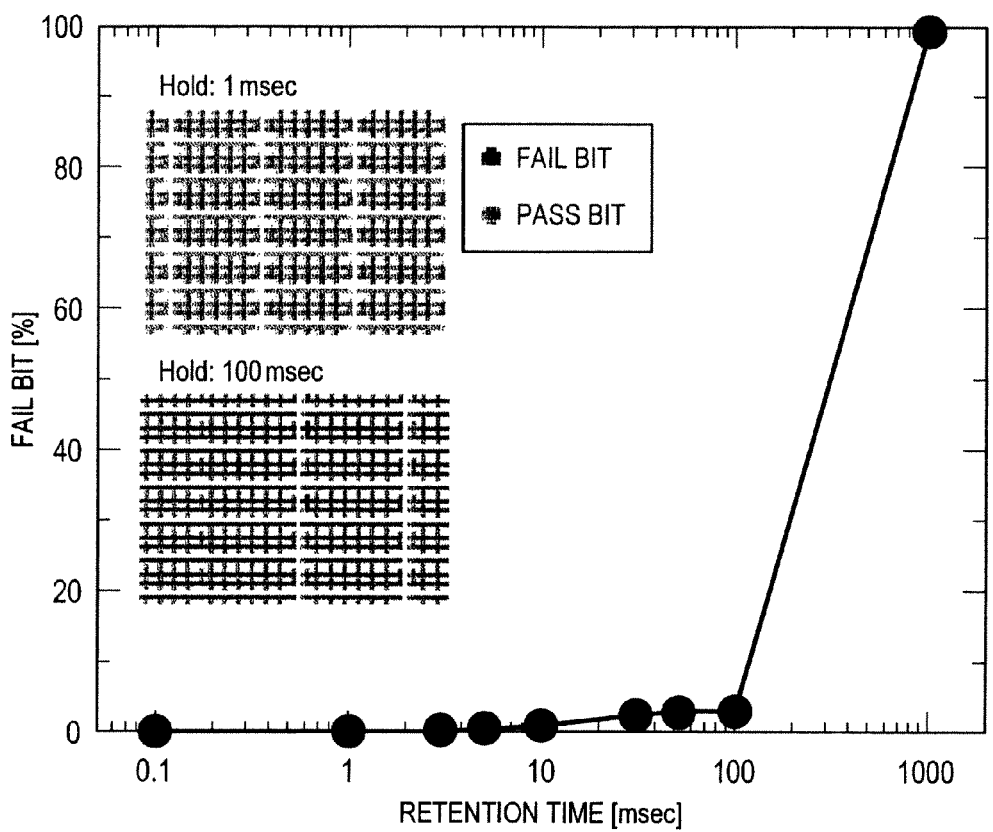
FIG. 60 is a graph for describing transistor characteristics.

FIG. 60 is a view for describing transistor characteristics as measured at 40 nm node. Circuit verification enables DRAM operation in msec order.

Modification examples of the semiconductor device of the present embodiment will next be described. FIGS. 61 to 73 are cross-sectional views showing the structure of modification examples of the semiconductor device according to the present embodiment. The semiconductor device of the modification examples has a protective layer formed at the periphery of the upper end portion of a recess in which a capacitor 19 has been buried. Each of the modification examples will hereinafter be described.

MODIFICATION EXAMPLE 1

Figure 61:
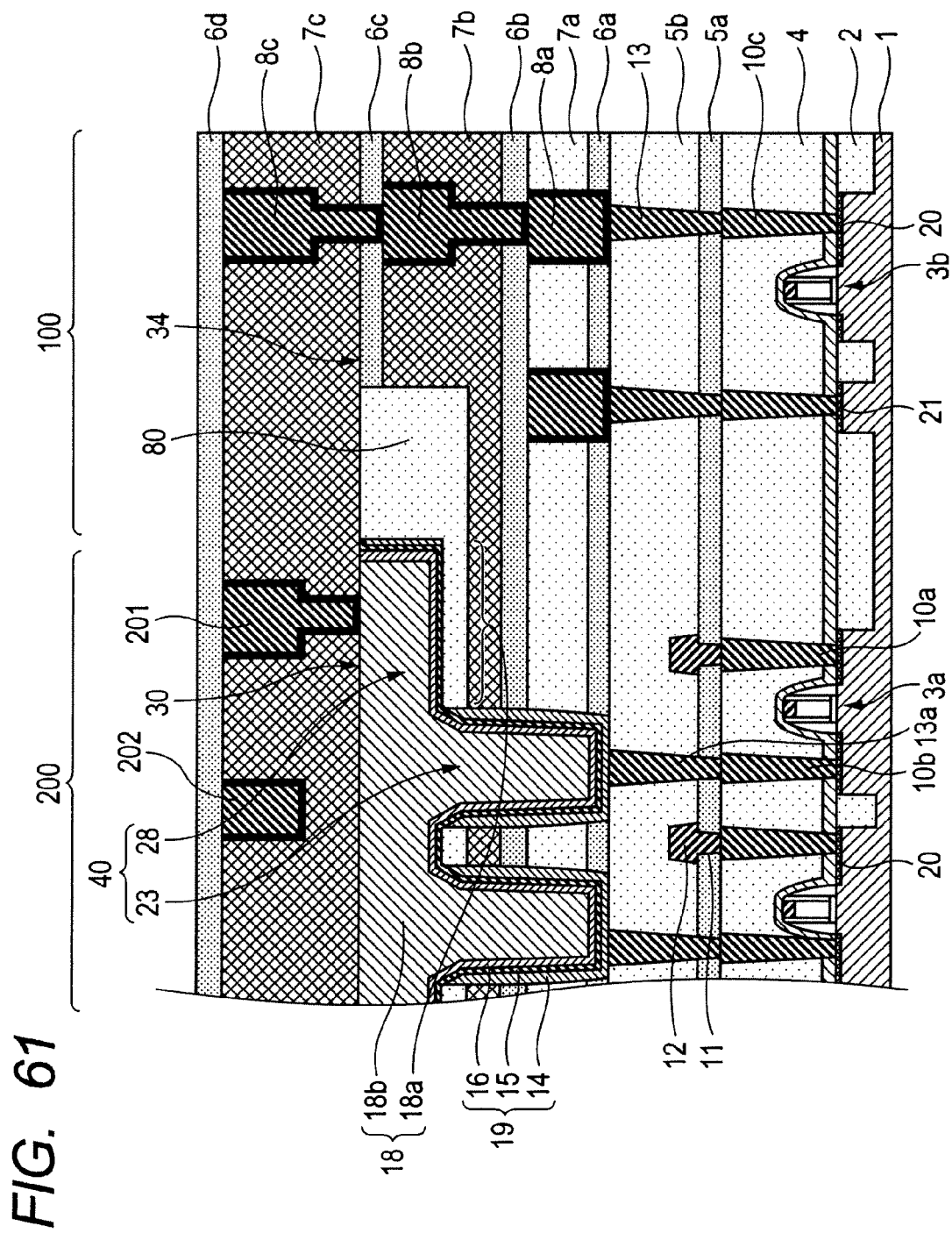
FIG. 61 is a cross-sectional view schematically showing a modification example of the semiconductor device of the present embodiment.

FIG. 61 shows the configuration of a semiconductor device of Modification Example 1. In the semiconductor device of Modification Example 1, the upper surface 30 of the upper coupling wiring 18 is made flush with the upper surface 34 of the cap layer 6c. The cap layer 6c (second cap layer) is provided so as to be brought into contact with the upper surface of the wiring 8b. The wiring 8b is placed in a logic circuit region and configures a wiring layer provided in the uppermost layer of a multilayer wiring layer in which a capacitor 19 has been buried. The upper coupling wiring 18 has thereon no cap layer. The protective layer 80 is formed at the periphery of the upper coupling wiring 18 and at the periphery of the upper end portion of the capacitor 19. The upper surface of the protective layer 80 may be made flush with the upper surface 30 of the upper coupling wiring 18.

In Modification Example 1, the upper surface 30 of the upper coupling wiring 18 formed in the memory circuit 200 is made flush with the upper surface 34 of the cap layer 6c provided in the logic circuit region so as to be brought into contact with the upper surface of the wiring 8b so that compared with the related-art technology described, for example, in Patent Document 1, the height of the recess 40 can be made higher by the thickness of the cap layer. The height of the capacitor 19 buried in the recess 40 can therefore be made higher. According to the present embodiment, the capacitance of the capacitor 19 can be made greater than that of the related-art technology. In addition, Modification Example 1 produces similar advantages to those of the first embodiment.

The logic circuit 100 has an active element 3b, a cell contact 10c, a coupling contact 13, and a wiring 8a. The cell contact 10c and the coupling contact 13 electrically couple the active element 3b to the wiring 8a. This means that the wiring 8a which is in the bottom layer is coupled to the transistor via a two-stage contact. Compared with the embodiment in which a three-stage contact is employed, the contact layer can be reduced by one layer so that the present modification example is excellent in high-speed operation.

A manufacturing method of Modification Example 1 includes a step of forming the following upper coupling wiring. First, a metal film for upper coupling wiring is buried fully in the space of the recess (capacitor burying recess) which has remained after formation of a lower electrode, a capacitor insulating film, and an upper electrode. Then, the metal film for upper coupling wiring is ground to form an upper coupling wiring 18. In the present modification example, the capacitor burying recess (hole 23) is protected at the periphery of the upper end portion thereof with a protective layer 80. This protective layer 80 has excellent mechanical strength so that dishing of the metal film for upper coupling wiring is suppressed. As a result, variation in device characteristics among products can be suppressed.

As a result of the investigation, the present inventors have found that since the metal film for upper coupling wiring extends across a plurality of capacitor burying recesses, the upper surface of the metal film has a large area and is susceptible to dishing. This dishing is likely to occur when the mechanical strength at the periphery of the capacitor burying recess is weak. As described above, generation of dishing can therefore be suppressed by protecting the periphery of the capacitor burying recess with the protective layer having high mechanical strength.

Figure 62:
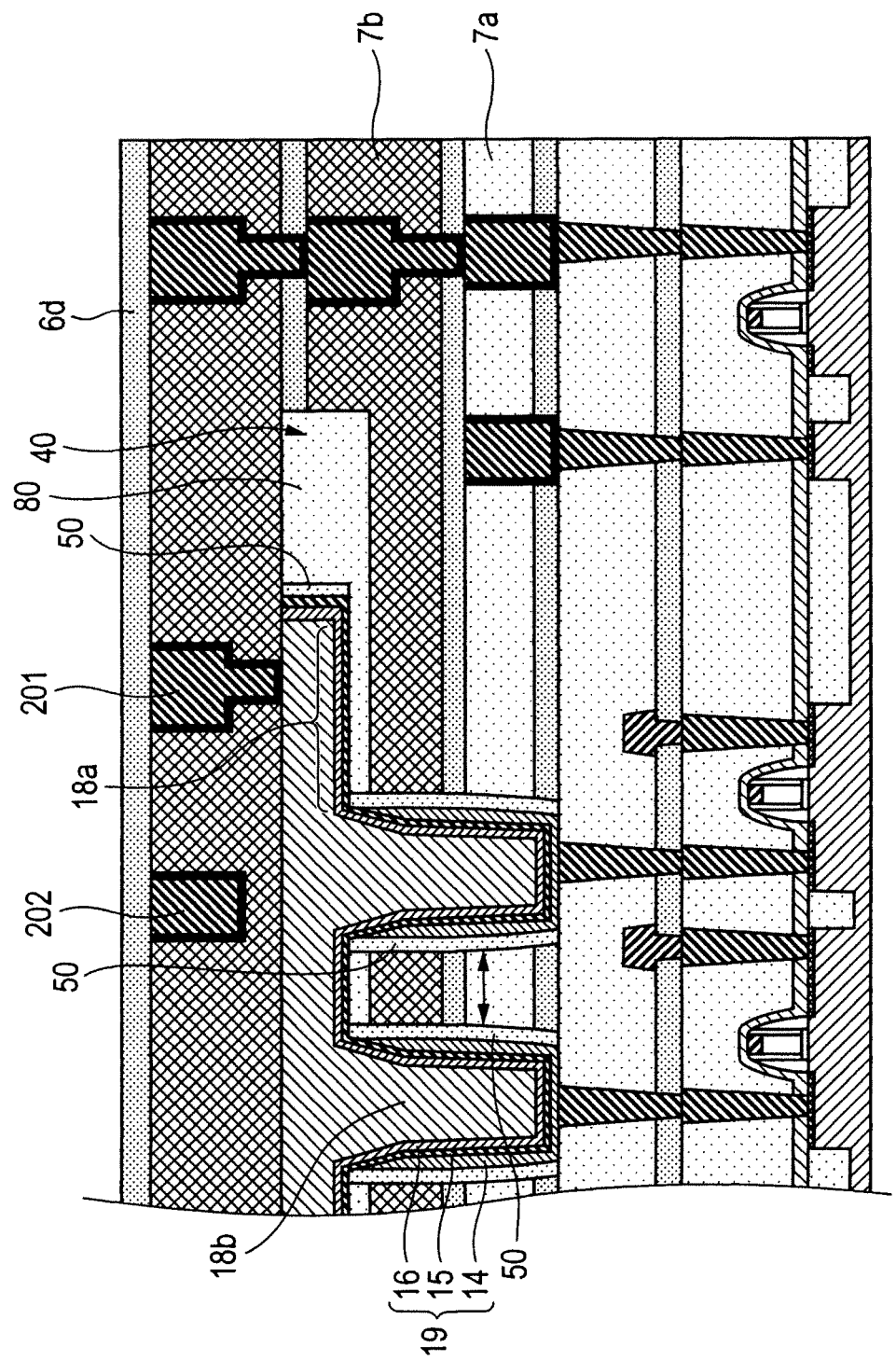
FIG. 62 is a cross-sectional view schematically showing the modification example of the semiconductor device of the present embodiment.
Figure 63:
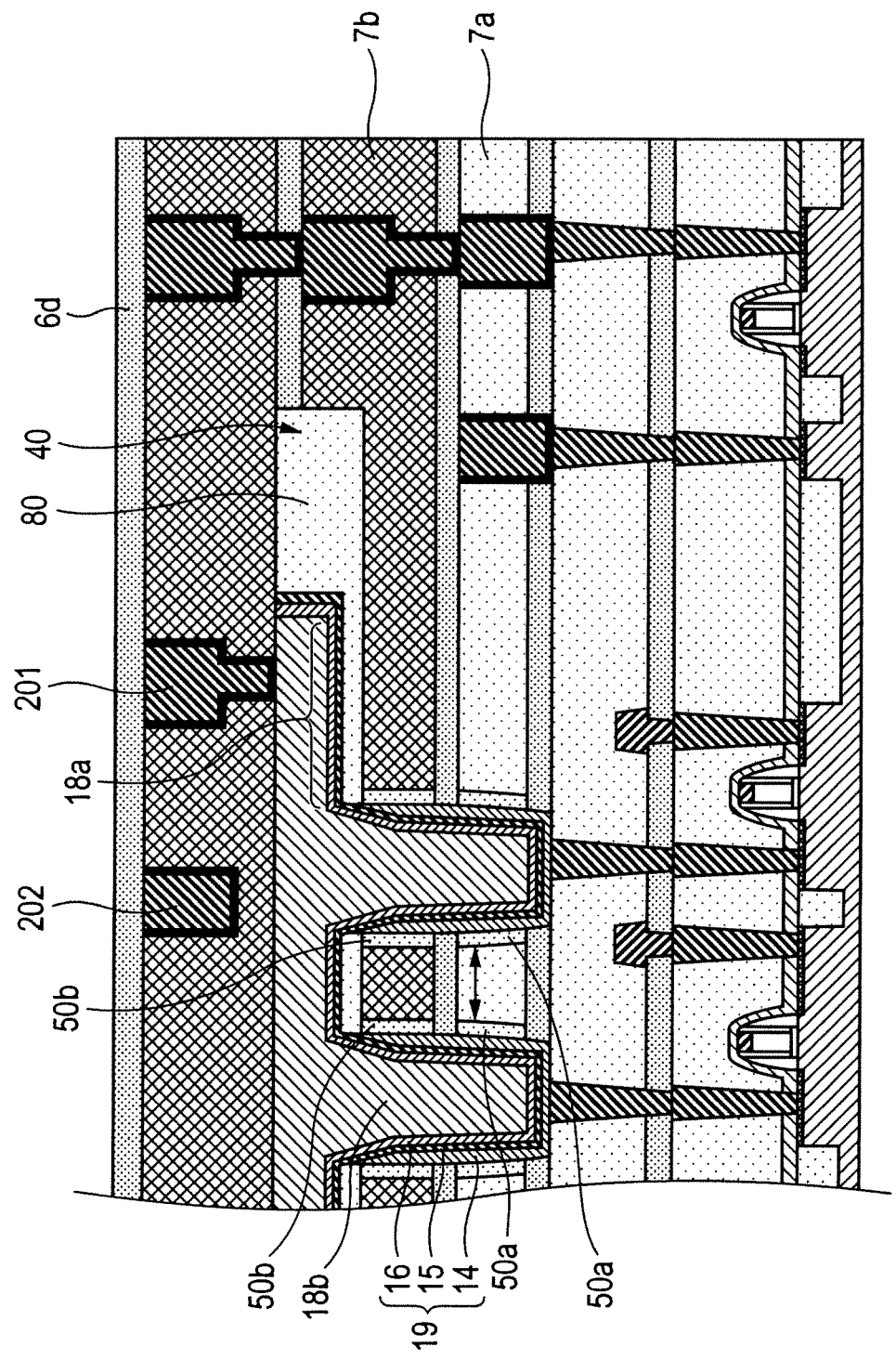
FIG. 63 is a cross-sectional view schematically showing the modification example of the semiconductor device of the present embodiment.

As shown in FIGS. 62 and 63, the semiconductor device of Modification Example 1 is equipped further with sidewall protective films 50, 50a, and 50b placed on the outer wall of the capacitor 19.

The sidewall protective films 50a and 50b are formed at least on the surface layers of the interlayer insulating layers 7a and 7b contiguous to the lower electrode 14. As such sidewall protective films 50a and 50b, for example, it is possible to form a layer obtained by modifying the surface layers of the interlayer insulating layers 7a and 7b to decrease the carbon amount per unit deposition and increase the number of oxygen atoms compared with those in the interlayer insulating layers 7a and 7b, respectively, as disclosed in International Patent Publication No. 2007/132879; or to form a layer modified with hydrogen plasma as disclosed in Japanese Patent Laid-Open No. 2009-123886. Alternatively, it is also possible to form a modified layer containing a nitrogen atom and a fluorine atom as disclosed in International Patent Publication No. 03/083935. If the sidewall protective films 50a and 50b contain a fluorine atom and form a compound with a lower electrode 14 which will be formed later, conductivity of the lower electrode 14 is impaired. In the present embodiment, however, the fluorine atom which the sidewall protective films 50a and 50b have has a firm bond with a nitrogen atom so that such a problem as loss of conductivity of the lower electrode 14 due to a compound formed between the lower electrode 14 and the sidewall protective films 50a and 50b does not occur.

In Modification Example 1, formation of a hole 23 and a wiring trench 28 is followed by the formation of a modified layer to be the sidewall protective film 50a and 50b. Such modified layer is formed by modifying the surface layer of the interlayer insulating layers 7a and 7b. Described specifically, the sidewall protective films 50a and 50b are formed by exciting plasma in an atmosphere containing hydrogen, nitrogen, carbon, or fluorine, or containing, in addition to it, an inert gas such as helium or argon to modify the surface layer of the interlayer insulating layers 7a and 7b. Alternatively, the sidewall protective films 50a and 50b are formed by modifying the surface layers of the interlayer insulating layers 7a and 7b by exposing them to ultraviolet irradiation in an atmosphere containing at least oxygen.

MODIFICATION EXAMPLE 2

Figure 64:
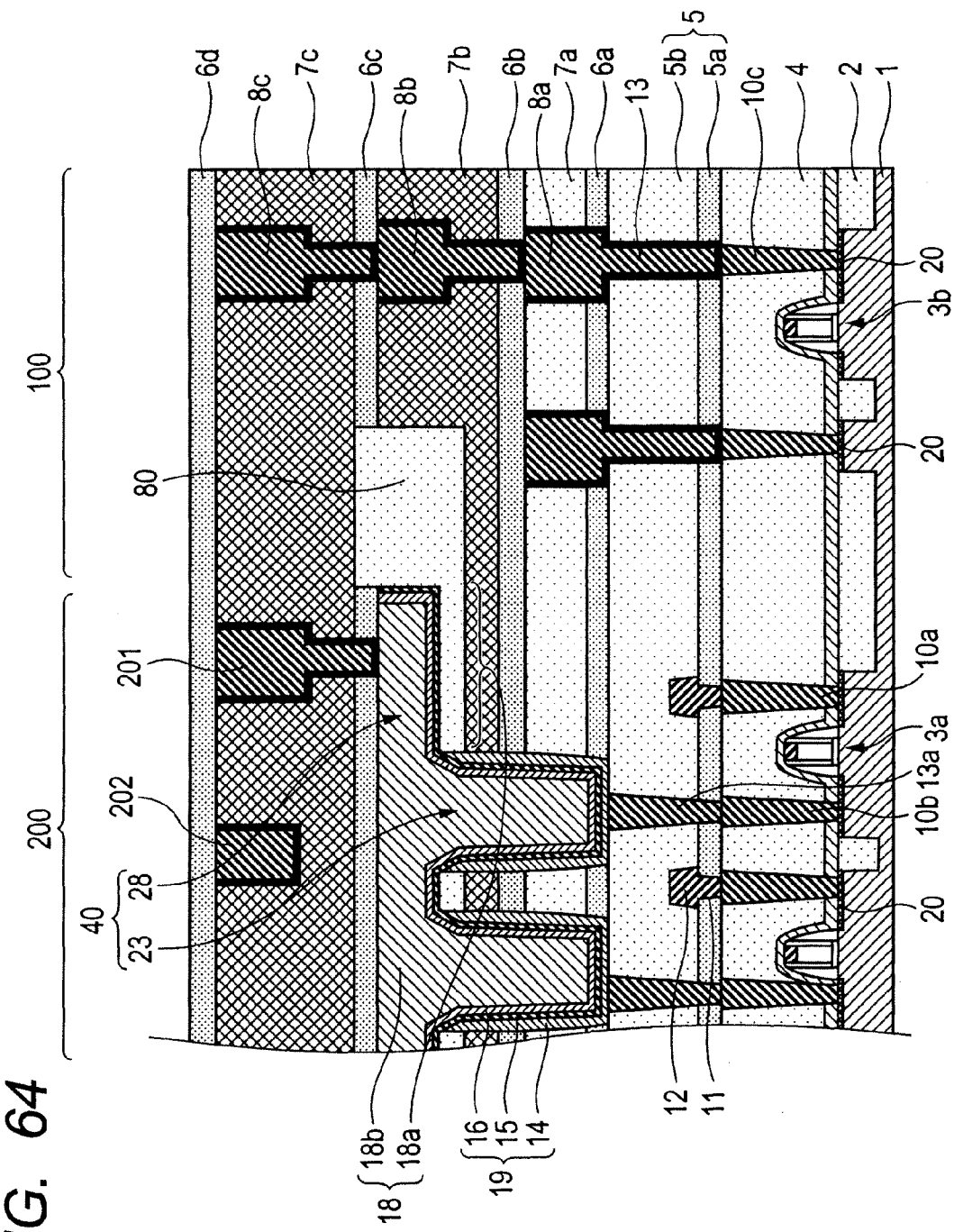
FIG. 64 is a cross-sectional view schematically showing another modification example of the semiconductor device of the present embodiment.

FIG. 64 shows the configuration of a semiconductor device of Modification Example 2. The upper surface of the upper coupling wiring 18 may be made flush with the upper surface of the wiring 8b. In addition, the upper surface of the protective layer 80 may be made flush with the cap layer 6c.

A first active element (active element 3a) is placed on a substrate (semiconductor substrate 1). A capacitor contact 13a electrically couples the active element 3a to a capacitor 19. A coupling contact 13 is formed in a logic circuit region and electrically couples an active element 3b to a first wiring (wiring 8a). The first wiring (wiring 8a) is placed in a wiring layer (interlayer insulating layer 7a) which is the bottom layer among wiring layers in which the capacitor 19 has been buried. The coupling contact 13 is placed in the same layer as the capacitor contact 13a. The first wiring (wiring 8a) and the coupling contact 13 have a dual damascene structure.

In contact insulating layers (contact interlayer insulating layers 5a and 5b), a first contact (coupling contact 13) is buried. This contact insulating layer preferably has a dielectric constant lower than that of a silicon oxide film. In addition, the coupling contact 13 is preferably made of a metal material (for example, a metal material containing Cu or having Cu as a main component) of the same kind as the wiring 8a and integrated therewith.

Figure 65:
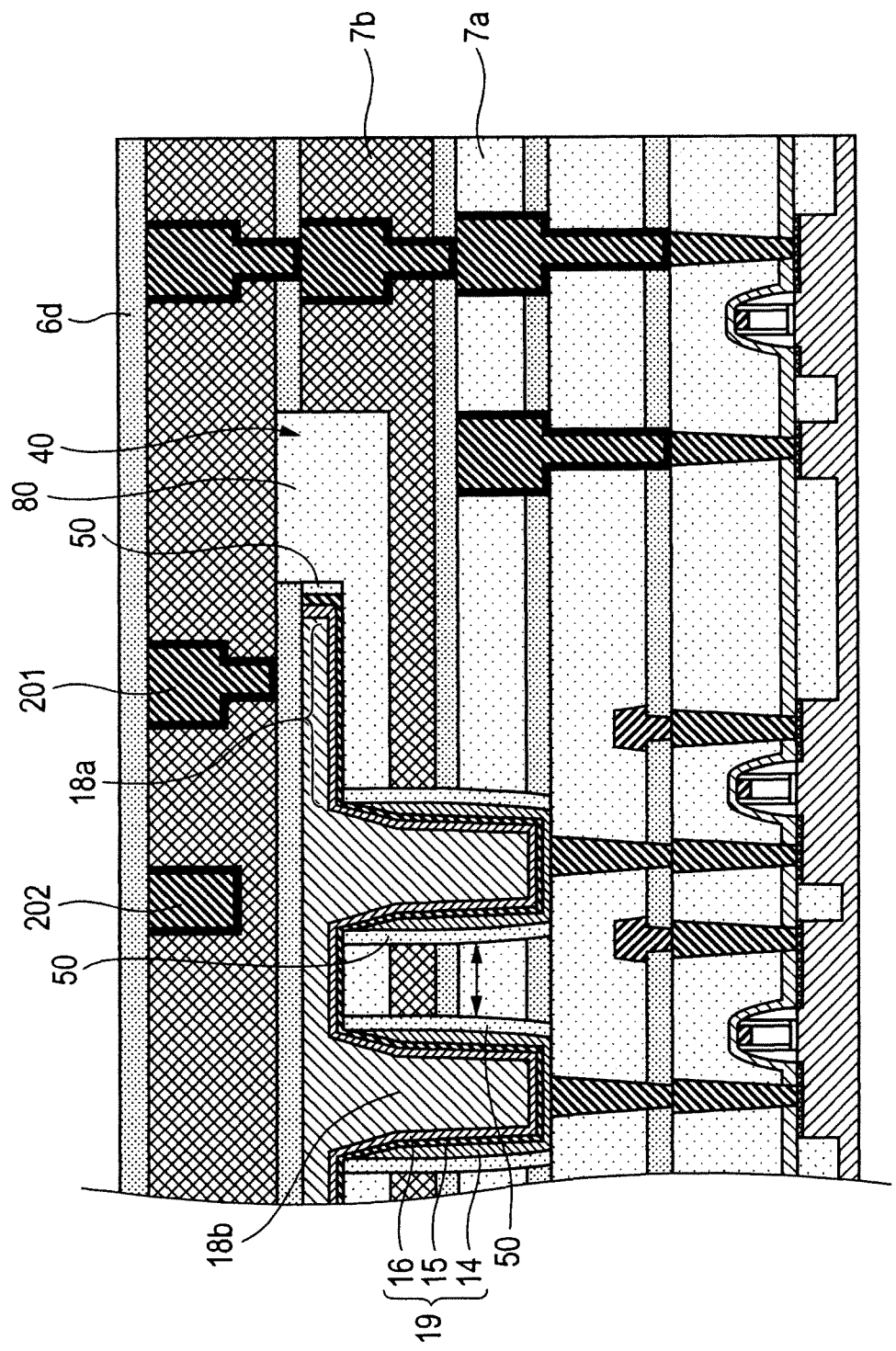
FIG. 65 is a cross-sectional view schematically showing the another modification example of the semiconductor device of the present embodiment.
Figure 66:
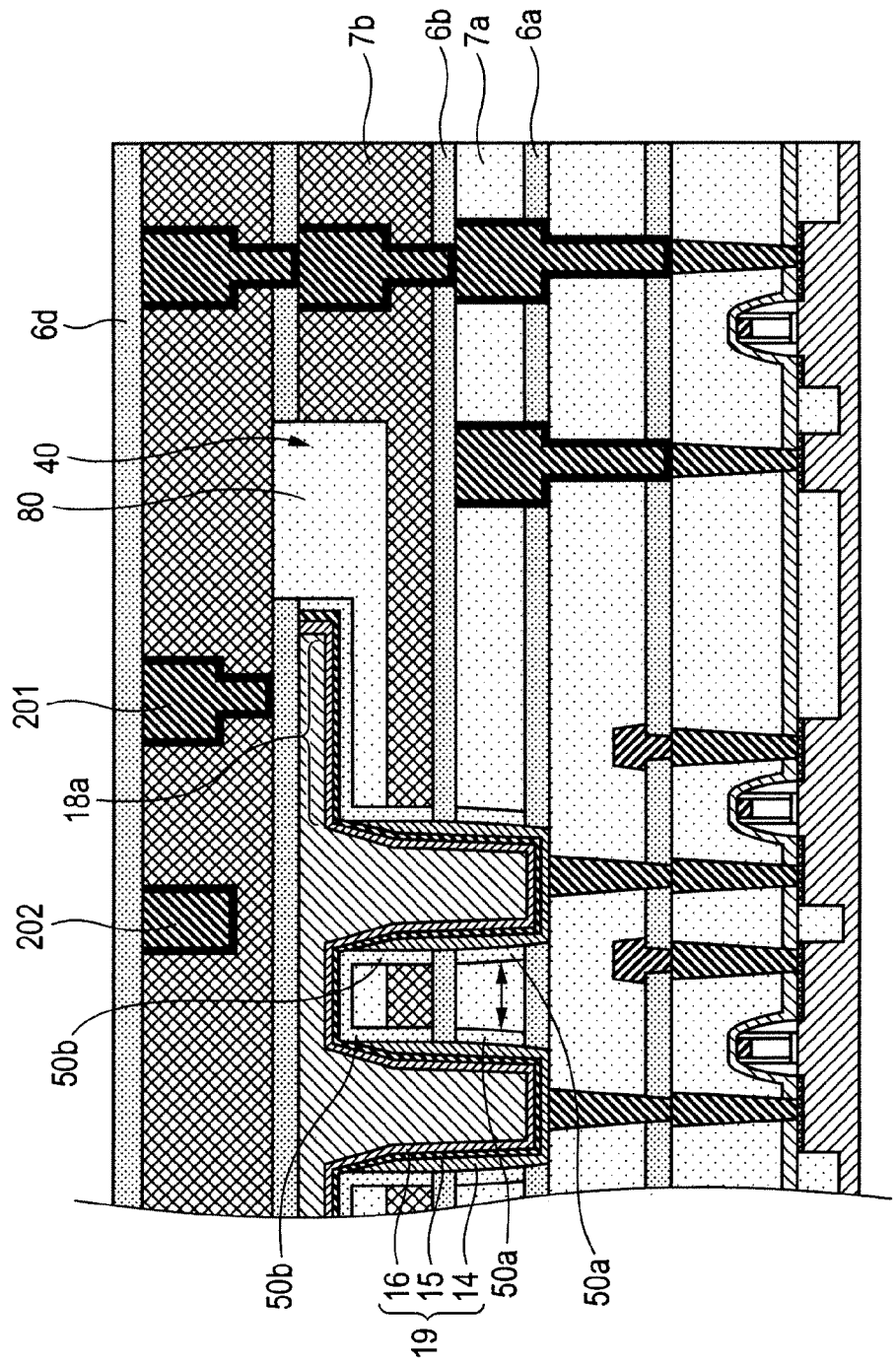
FIG. 66 is a cross-sectional view schematically showing the another modification example of the semiconductor device of the present embodiment.

As shown in FIGS. 65 and 66, the semiconductor device of Modification Example 2 is equipped further with sidewall protective films 50, 50a, and 50b placed on the outer wall of the capacitor 19. Modification Example 2 produces similar advantages to those of Modification Example 1.

MODIFICATION EXAMPLE 3

Figure 67:
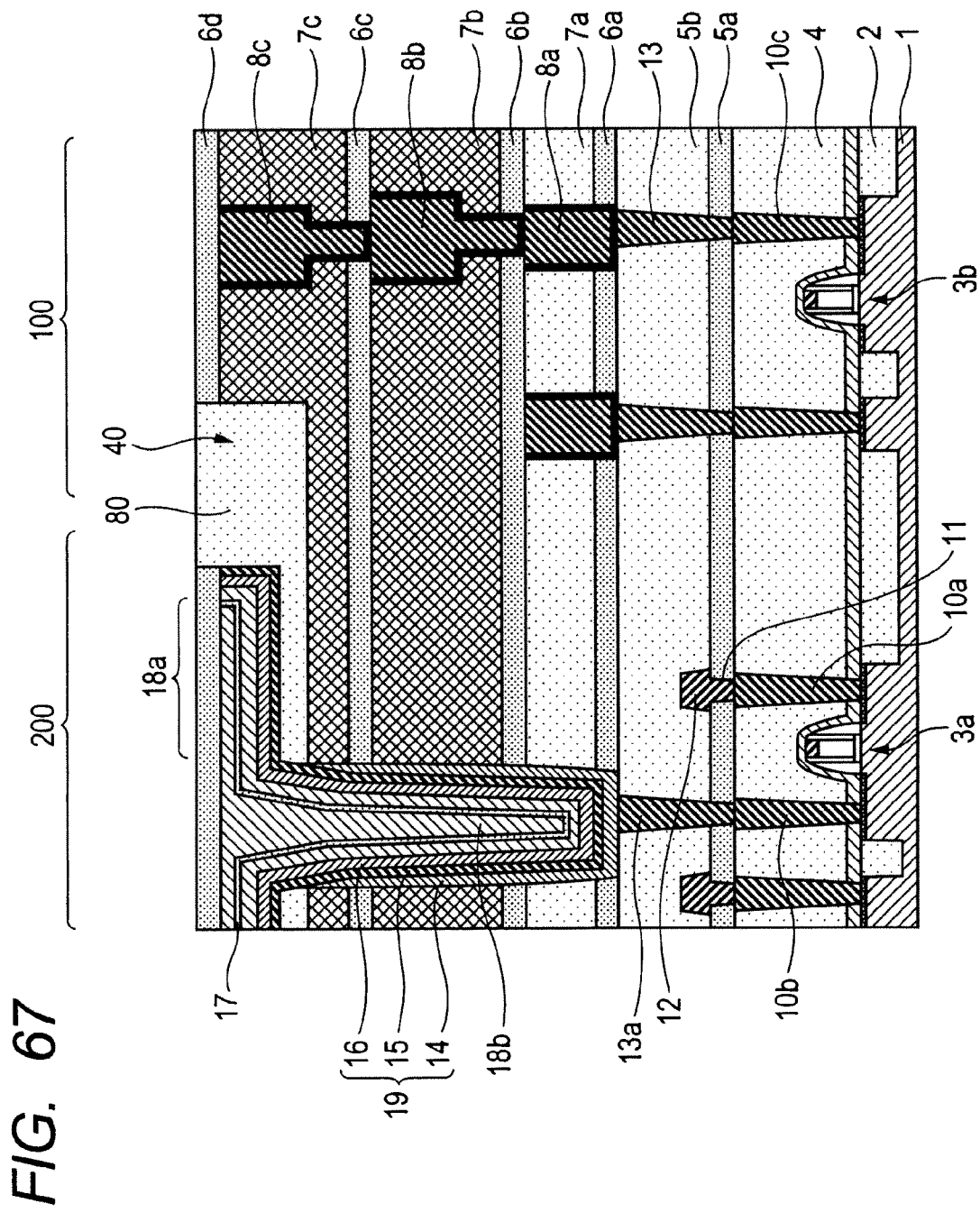
FIG. 67 is a cross-sectional view schematically showing a further modification example of the semiconductor device of the present embodiment.
Figure 68:
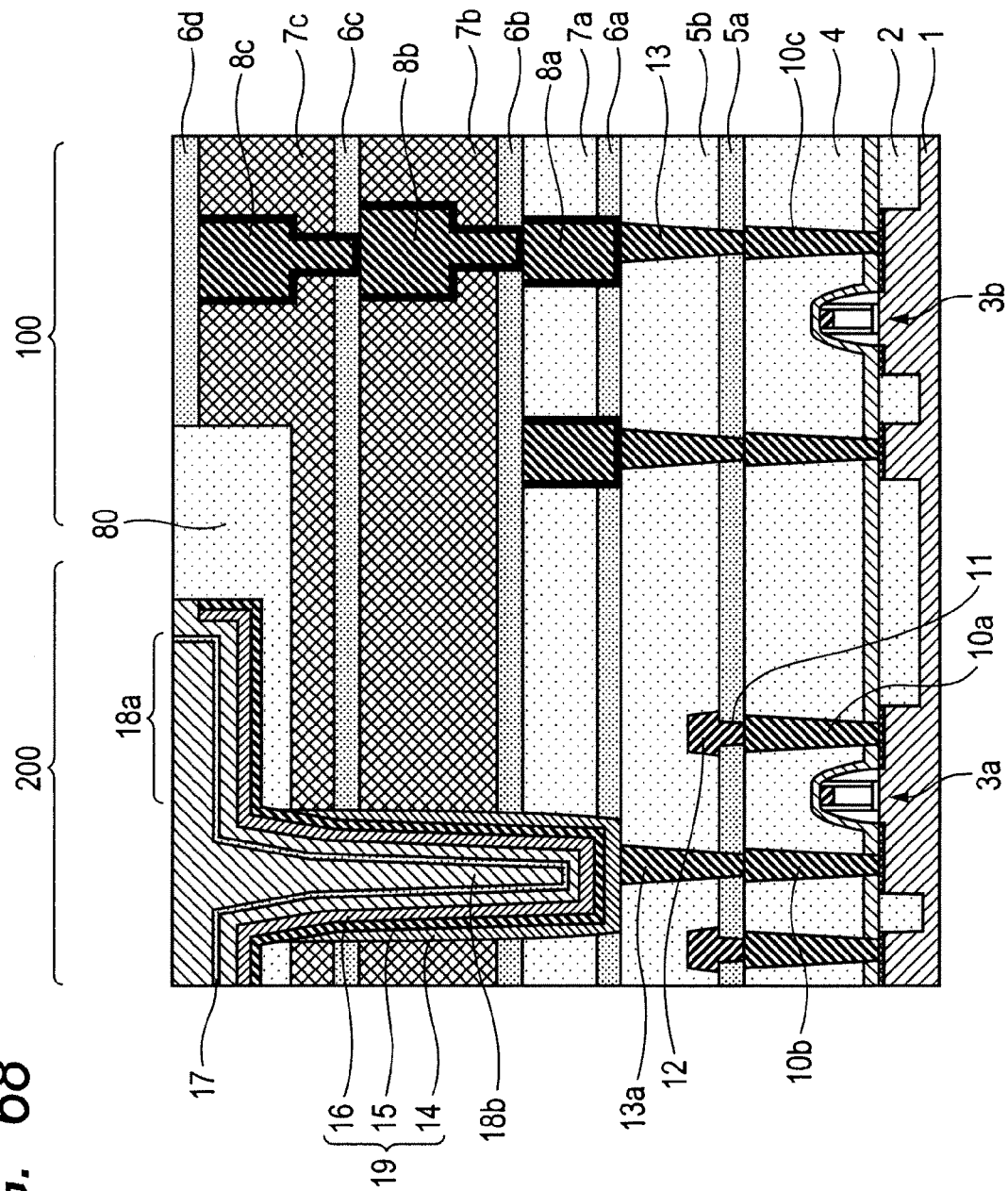
FIG. 68 is a cross-sectional view schematically showing the further modification example of the semiconductor device of the present embodiment.
Figure 69:
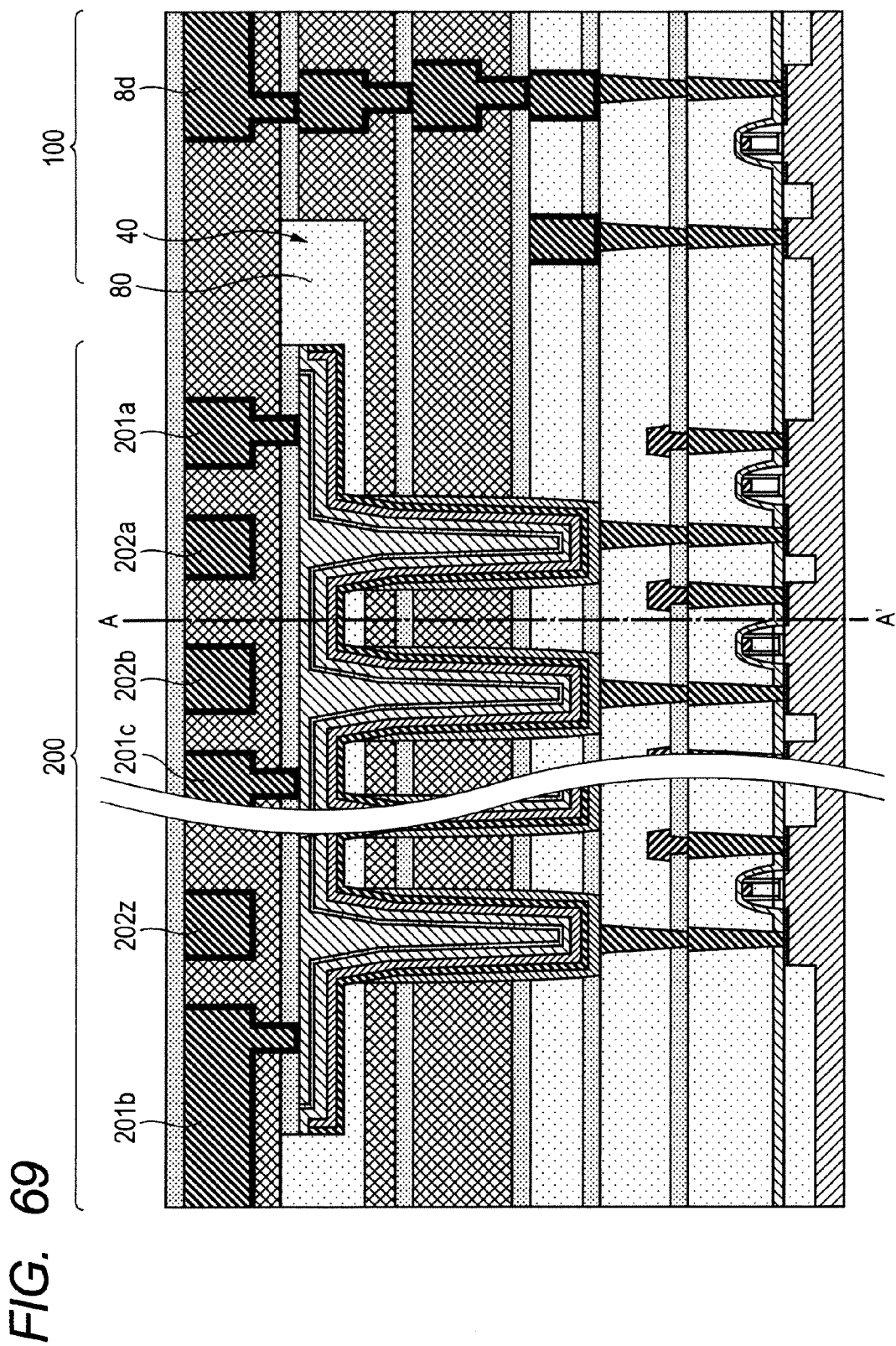
FIG. 69 is a cross-sectional view schematically showing the further modification example of the semiconductor device of the present embodiment.

FIGS. 67 to 69 show the configuration of a semiconductor device of Modification Example 3. As shown in FIGS. 67 and 69, a difference in height between the upper surface of an upper coupling wiring 18 and an upper surface of a wiring 8c configuring a logic circuit formed in the same layer as the upper coupling wiring 18 is preferably 30 nm or less. As shown in FIG. 68, the upper surface of the upper coupling wiring 18 is preferably made flush with the upper surface of the wiring 8c configuring the logic circuit formed in the wiring layer same as the upper coupling wiring 18. In Modification Example 3, the capacitor 19 extends across three wiring layers. For example, the capacitor 19 has thereabove wirings 201a to 201c having a fixed potential and signal wirings 202a, 202b, and 202z. Modification Example 3 produces similar advantages to those of Modification Example 1.

MODIFICATION EXAMPLE 4

Figure 70:
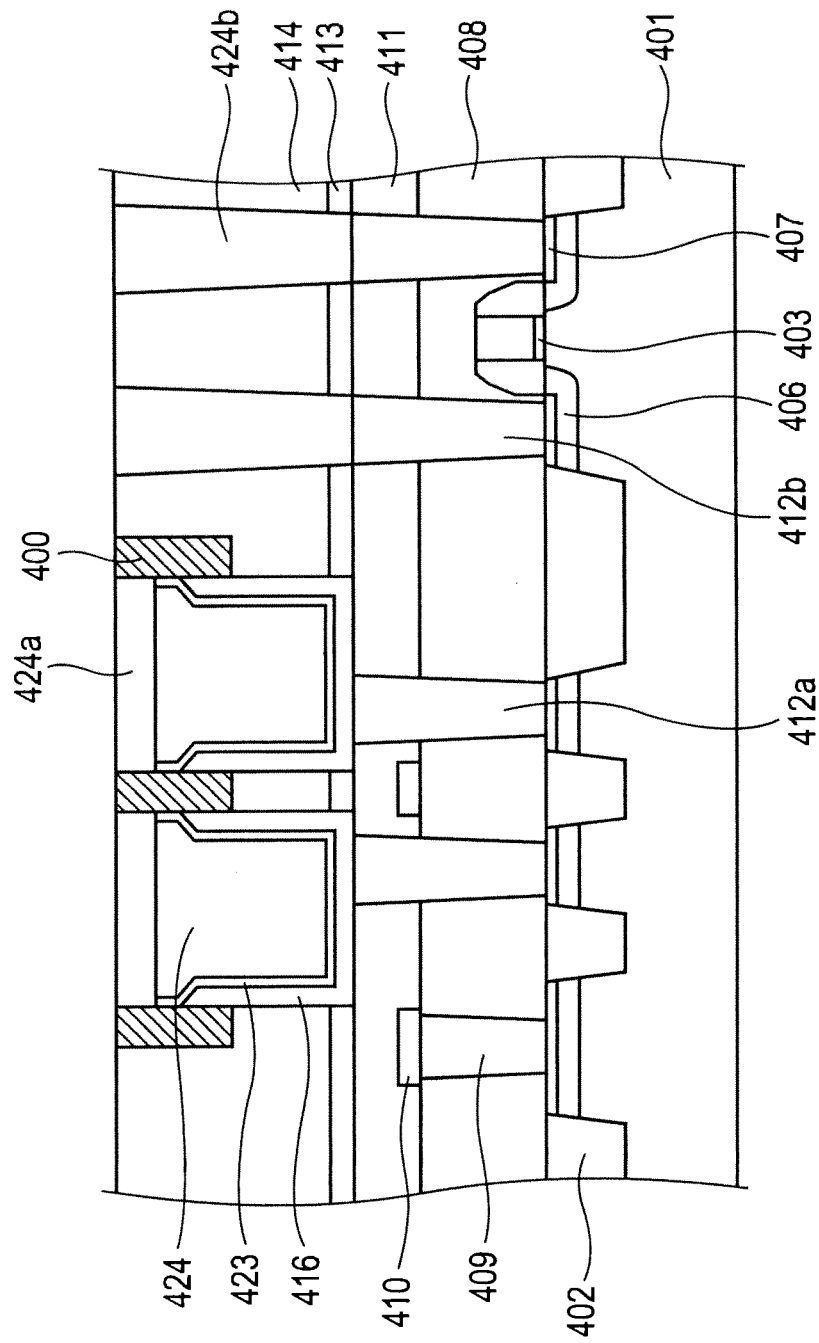
FIG. 70 is a cross-sectional view schematically showing a still further modification example of the semiconductor device of the present embodiment.

FIG. 70 shows the configuration of a semiconductor device of Modification Example 4. In FIG. 70, indicated at 401 is a silicon substrate, 402 an element isolation film, 403 a gate insulating film, 406 a source/drain region, 407 a silicide layer, 408 a lower interlayer insulating film, 409 a contact, 410 a bit line, 411 a lower interlayer insulating film, 412a a capacitance contact, 412b a logic contact, 413 a cap layer, 414 an upper interlayer insulating film, 416 a lower electrode, 423 a capacitor insulating film, 424 an upper electrode, 424a an upper capacitance wiring, 424b a logic contact, and 400 a protective film.

In Modification Example 4, the capacitor is placed in the same layer as a logic contact 412b or logic wiring (not illustrated). The capacitor has, at the periphery of the upper end portion thereof, a protective layer 400. The protective layer 400 may be formed at least at the upper end portion of the capacitor and it may be formed on the entire side wall of the capacitor. The protective layer 400 is made of a material having a higher dielectric constant than that of the upper interlayer insulating film 414. The upper interlayer insulating film 414 may be made of a material other than a low-k film. A single stage contact is formed in the lower interlayer insulating films 408 and 411 placed below the capacitor. The term "single stage contact" means a seamless contact formed in one step. In addition, the upper capacitance wiring 424a is filled thoroughly in the capacitor burying recess. Modification Example 4 produces similar advantages to those of Modification Example 1.

MODIFICATION EXAMPLE 5

Figure 71:
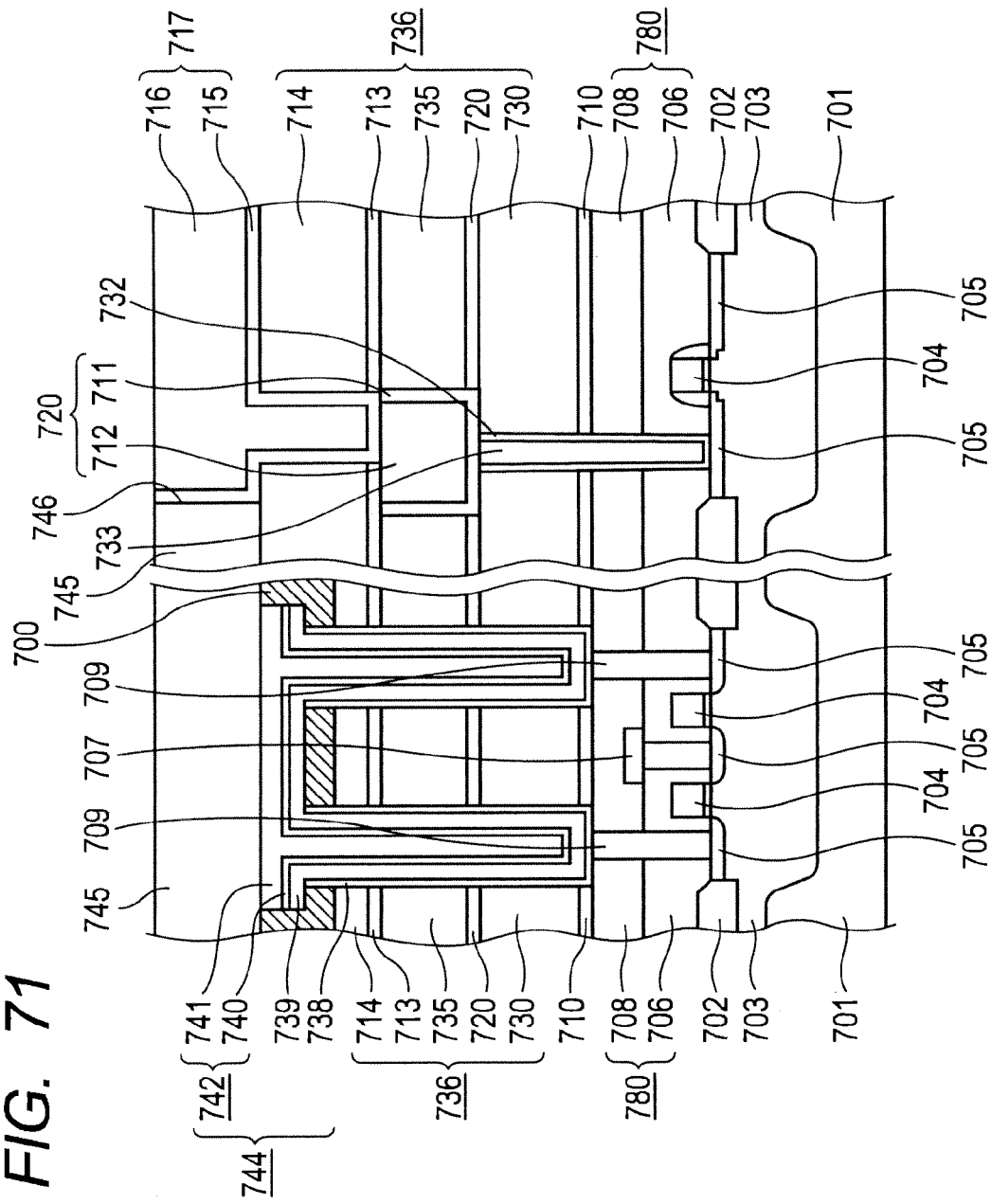
FIG. 71 is a cross-sectional view schematically showing a still further modification example of the semiconductor device of the present embodiment.

FIG. 71 shows the configuration of a semiconductor device of Modification Example 5. In FIG. 71, indicated at 701 is a semiconductor substrate, 702 an element isolation layer, 703 an active region, 704 a gate electrode, 705 a source/drain region, 707 a bit line, 706, 708, and 780 interlayer insulating films, 709 a lower electrode contact plug, 710, 713, and 720 cap films, 730 a first insulating film, 735 a second insulating film, 714 a third insulating film, 745 a fourth insulating film, 736 a second interlayer insulating film, 744 a capacitor, 738 a lower electrode, 739 a capacitor insulating film, 740 an upper electrode, 741 an upper coupling wiring, 742 a copper film, 733 a bottom contact, 732 a barrier film, 712 a copper film, 711 a barrier film, 720 a first wiring layer, 715 a barrier film, 716 a copper film, 717 a second wiring layer, and 700 a protective layer.

In Modification Example 5, the capacitor 744 is buried in the second interlayer insulating film 736. In the layer corresponding to the intermediate portion of the capacitor 744, the first wiring layer 720 is formed. The first wiring layer 720 is placed as the bottom layer of the multilayer wiring layer of a logic circuit. In the layer corresponding to the upper portion of the capacitor 744, a via portion of the second wiring layer 717 is formed, while in the layer corresponding to the lower portion of the capacitor 744, a portion of the bottom contact 733 is formed. The bottom contact 733 is a seamless single-stage contact. In the layer corresponding to the bottom portion of the bottom contact 733, a lower electrode contact plug 709 to be coupled to the bottom portion of the capacitor 744 is formed. The capacitor 744 has, at the periphery of the upper end portion thereof, the protective layer 700. The protective layer 700 covers therewith a side edge portion of the upper electrode 739 and at the same time, the side edge portion of the upper coupling wiring 741. The film thickness of the protective layer 700 may be smaller than the height of the via portion of the second wiring 717 but may be equal thereto. In addition, the protective layer 700 may extend across not only the third insulating layer 714 but also the second insulating layer 735. The protective layer 700 is composed of a material having a dielectric constant higher than that of the second insulating film 735 and the third insulating film 714. The second insulating film 735 and the third insulating film 714 are, for example, a low-k film. The upper coupling wiring 741 is made of a copper metal. Modification Example 5 produces advantages similar to those of Modification Example 1.

MODIFICATION EXAMPLE 6

Figure 72:
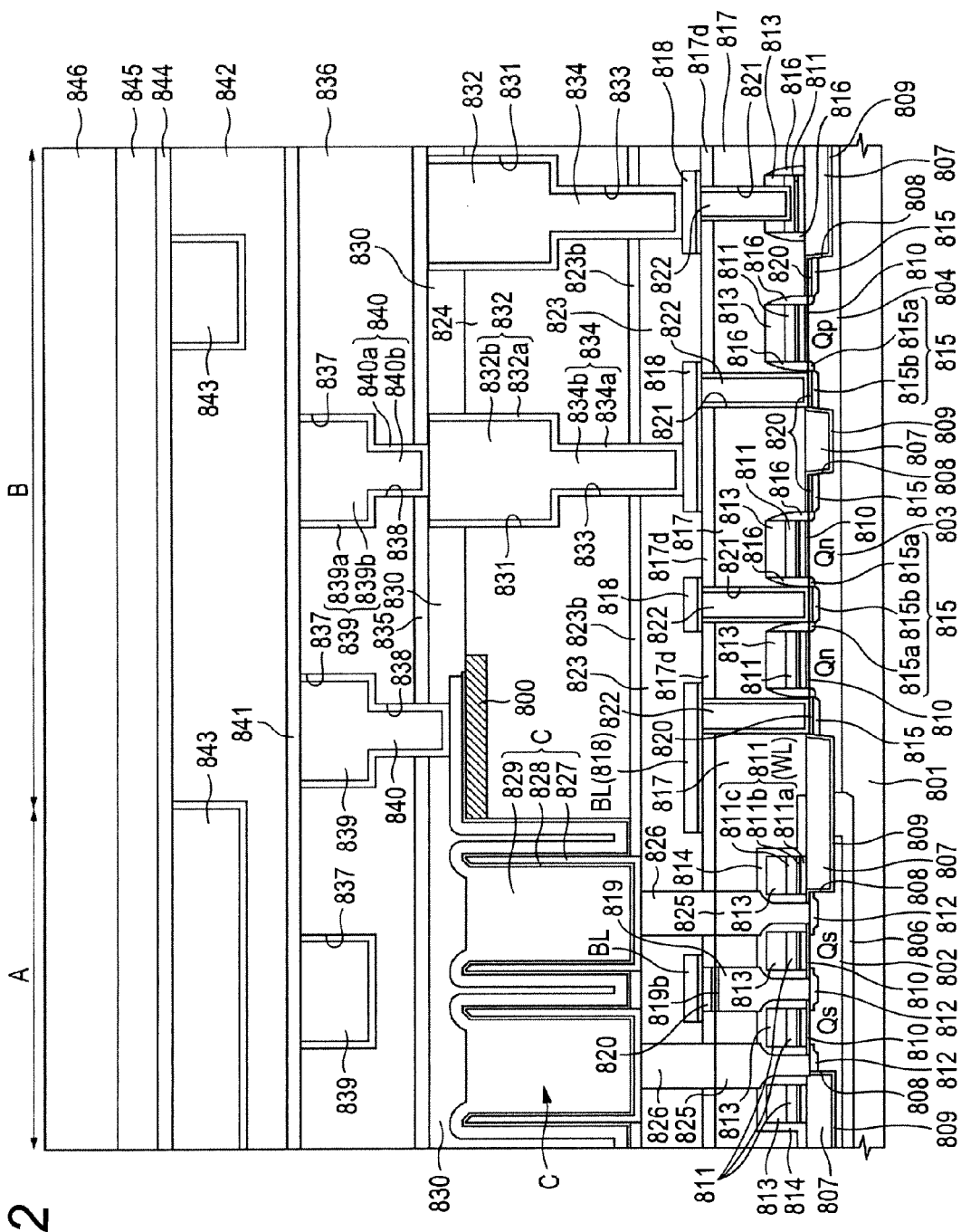
FIG. 72 is a cross-sectional view schematically showing a still further modification example of the semiconductor device of the present embodiment.

FIG. 72 shows the configuration of a semiconductor device of Modification Example 6. In FIG. 72, indicated at 801 is a semiconductor substrate, 802 a semiconductor chip, 803 a p well, 806 an n well, 807 a deep well, 808 an isolation region, 809 a shallow trench, 810 a silicon oxide film, 811 a gate insulating film, 811a a gate electrode, 811b a polycrystalline silicon film, 811c a titanium nitride film, 812 an impurity semiconductor region, 813 a tungsten film, 814 a cap insulating film, 815 a diffusion layer, 815a an impurity semiconductor region, 815b a lightly doped region, 816 a sidewall spacer, 817 an interlayer insulating film, 817d a TEAS oxide film, 818 a first-level wiring, 818b a titanium nitride film, 819 a tungsten film, 819b a plug, 820 a cobalt silicide film, 821 a coupling hole, 822 a plug, 822a a titanium nitride film, 822b a tungsten film, 823 an interlayer insulating film, 823b a silicon nitride film, 824 an insulating film, 825 a plug, 826 a plug, 827 a lower electrode, 828 a capacitor insulating film, 829 a plate electrode, 830 an insulating film, 831 a wiring trench, 832a a second-level wiring, 832a a first conductive layer, 832b a second conductive layer, 833 a coupling hole, 834 a coupling portion, 834a a first conductive layer, 834b a second conductive layer, 835 a silicon nitride film, 836 an interlayer insulating film, 837 a wiring trench, 838 a coupling hole, 839 a third-level wiring, 839a a first conductive layer, 839b a second conductive layer, 840 a coupling portion, 840a a first conductive layer, 840b a second conductive layer, 841 a silicon nitride film, 842 an interlayer insulating film, 843 a fourth-level wiring, 844 a silicon nitride film, 845 an insulating film, 846 an insulating film, BL a decoder portion, C a capacitor, Qn a main word line, Qn2 an re-channel MISFET, Qp an n-channel MISFET, Qs a p-channel MISFET, and 800 a protective layer.

In Modification Example 6, the capacitor C is buried in interlayer insulating films (insulating films 824 and 830). In the same layer as the capacitor C, a portion of the second-level wiring 832a and a portion of the coupling portion 834 are formed. The upper end portion of the second-level wiring 832a is formed at a position higher than that of the upper end portion of the capacitor. The coupling portion 834 is coupled to the first wiring 818. The first wiring 818 is buried in the interlayer insulating layer 823 which lies below the capacitor C. In the same layer as the first wiring 818, the plug 826 to be coupled to the bottom portion of the capacitor C is placed. This means that a single wiring layer is formed between the capacitor C and a transistor. The plate electrode 829 (upper electrode) of the capacitor C extends outside the capacitor burying recess and is formed on the upper surface of the insulating film 824. The capacitor C has, at the periphery of the upper end portion thereof, a protective layer 800. The protective layer 800 is placed, in a cross-sectional view, outside the end portion of the plate electrode 829. In the present modification example, the protective layer 800 may not be formed between two capacitors C. The protective layer 800 is made of a material having a dielectric constant higher than that of the insulating film 824. Modification Example 6 produces advantages similar to those of Modification Example 1.

MODIFICATION EXAMPLE 7

Figure 73:
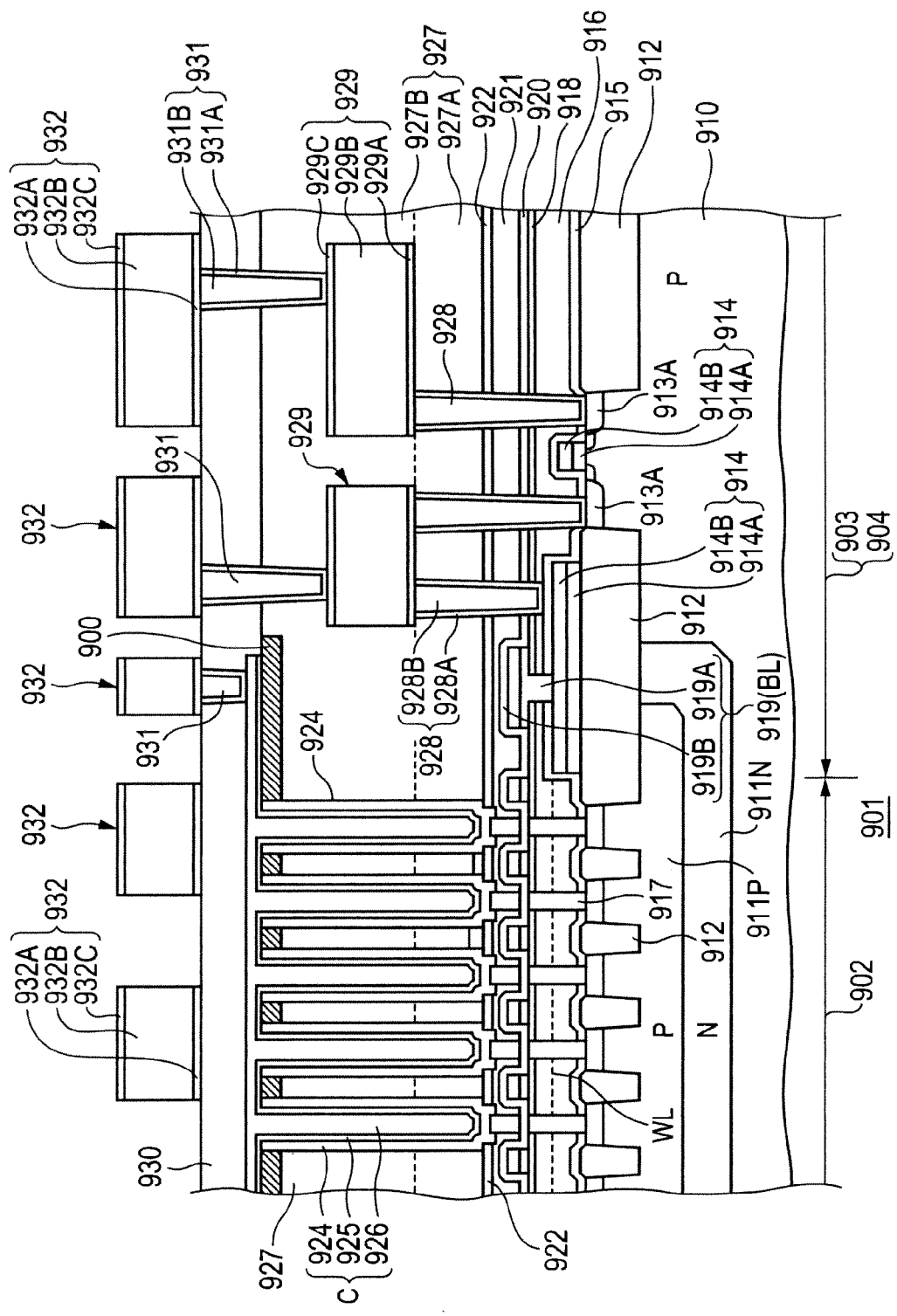
FIG. 73 is a cross-sectional view schematically showing a still further modification example of the semiconductor device of the present embodiment.

FIG. 73 shows the configuration of a semiconductor device of Modification Example 7. In FIG. 73, indicated at 901 is a semiconductor device, 902 a memory cell portion, 903 a peripheral circuit portion, 904 a logic circuit, 905 a semiconductor memory, 906 a drive circuit, 907 a bit line contact, 908 a memory node contact, 909, 913A, and 913B diffusion layers, 910 a semiconductor substrate, 911 a well region, 912 an element isolation layer, 913 a source/drain region, 914 a gate electrode, 915, 918, and 938 insulating films, 916, 921, 927, and 935 interlayer insulating layers, 917 a contact layer, 919 a bit line (BL), 920, 922, 934, and 937 insulating films (nitride films), 924 a memory node electrode (lower electrode), 925 a dielectric film, 926 a plate electrode (upper electrode), 928 a first contact layer, 929 a first metal wiring layer, 930 and 936 planarized insulating layers, 931 a second contact layer, 932 a second metal wiring layer, 933 a contact hole, WL a word line, BL a bit line, C a capacitor, and 900 a protective layer.

In Modification Example 7, the capacitor C is buried in the interlayer insulating film 927. The interlayer insulating film 927 has, at the intermediate portion thereof, a bottom wiring (first metal wiring layer 929) of the logic circuit. The first metal wiring layer 929 has the second contact layer 931 coupled thereon and the first contact layer 928 coupled thereunder. This means that in the layer corresponding to the intermediate portion of the capacitor C, the first metal wiring layer 929 is placed. In the layer corresponding to the upper portion of the capacitor C, the second contact layer 931 is placed, and the in the layer corresponding to the lower portion of the capacitor C, the first contact layer 928 is placed. The capacitor C has, at the periphery of the upper end portion thereof, the protective layer 900. In the present embodiment, the end portion of the protective layer 900 is placed, in a cross-sectional view, outside the end portion of the plate electrode 926. The protective layer 900 is made of a material having a dielectric constant higher than that of the interlayer insulating film 927. Modification Example 7 produces advantages similar to those of Modification Example 1.

It is needless to say that the above-described embodiments and modification examples may be used in combination insofar as they are not contradictory to each other. In addition, in the above embodiments and modification example, the structure and the like of each member were described specifically, but they may be changed insofar as they satisfy the present invention.

What is claimed is:

1. A semiconductor device, comprising:
   a substrate; a multilayer wiring layer having wiring lavers provided over the substrate;
   a capacitor buried in a recess provided in the multilayer wiring layer and having a lower electrode, a capacitor insulating film, and an upper electrode;
   a logic circuit provided over the substrate;
   an upper coupling wiring to be coupled to the capacitor; and
   a protective layer provided at the periphery of the upper end portion of the recess;
   wherein, the protective layer has a dielectric constant higher than that of an insulating layer configuring the multilayer wiring layer having the logic circuit provided therein,
   wherein the insulating layer is placed in the same layer as the protective layer,
   wherein a trench is provided in the multilayer wiring layer,
   wherein the protective layer is placed over the bottom surface of the trench,
   wherein the recess is formed in the protective layer, and
   wherein the upper coupling wiring is placed over the protective layer and is buried in the trench.

2. The semiconductor device according to claim 1,
   wherein a portion of the protective layer is formed directly under an upper portion of the capacitor insulating film and the upper electrode.

3. The semiconductor device according to claim 1, further comprising:
   a buried electrode buried in the recess and placed over the upper electrode; and
   an insulating member buried in the recess and placed over the buried electrode,
   wherein the upper electrode is formed along an inner wall of the recess and has an end portion over the protective layer, and
   wherein the insulating member is buried fully in a space of the recess which has remained after the lower electrode, the capacitor insulating film, the upper electrode, and the buried electrode have been buried.

4. The semiconductor device according to claim 3, further comprising:
a first cap layer placed between the buried electrode and the insulating member and is more resistant to etching than the protective layer.

5. The semiconductor device according to claim 1, further comprising:
a buried electrode buried in the recess and placed over the upper electrode,
wherein the buried electrode is buried fully in a space of the recess which has remained after the lower electrode, the capacitor insulating film, and the upper electrode have been buried.

6. The semiconductor device according to claim 1, further comprising:
a first cap layer placed over the upper coupling wiring and is more resistant to etching than the protective layer.

7. The semiconductor device according to claim 1,
wherein the protective layer is a silicon oxide film.

8. The semiconductor device according to claim 1,
wherein the capacitor extends across a plurality of wiring layers, and
wherein each of a plurality of insulating layers of the plurality of wiring layers is made of a material having a relative dielectric constant lower than that of a silicon oxide film.

9. The semiconductor device according to claim 1,
wherein the capacitor extends across a plurality of the wiring layers, and
wherein each of wirings of the wiring layers has a damascene structure.

10. The semiconductor device according to claim 1,
wherein the thickness of the protective layer is ½ or greater than a trench depth of the trench, and
wherein the trench is in the same layer as the upper coupling wiring and is placed in the logic circuit region.

11. The semiconductor device according to claim 1,
further comprising a sidewall protective layer provided between the capacitor and the insulating layer.

12. The semiconductor device according to claim 11,
wherein the protective layer and the sidewall protective layer are made of materials of the same kind 13. The semiconductor device according to claim 1,
wherein the protective layer extends over an entire side wall of a first insulating layer, and
wherein the first insulating layer is placed in the same layer as the upper coupling wiring and configures one wiring layer of the multilayer wiring layer placed in the logic circuit region.

14. The semiconductor device according to claim 1 further comprising:
a second cap layer provided so as to be brought into contact with the upper surface of a wiring,
wherein the wiring is placed in the logic circuit region and configures the wiring layer provided on the uppermost layer among the multilayer wiring layer in which the capacitor has been buried, and
wherein the upper surface of the upper coupling wiring is made flush with the upper surface of the second cap layer.

15. The semiconductor device according to claim 1, further comprising:
a first active element placed over the substrate;
a first contact electrically coupling the first active element to the capacitor; and
a contact insulating layer in which the first contact has been buried;
wherein the contact insulating layer has a dielectric constant lower than that of a silicon oxide film.

16. The semiconductor device according to claim 1,
wherein a difference in height between the upper surface of the upper coupling wiring and the upper surface of a wiring is 30 nm or less, and
wherein the wiring is placed in the logic circuit region and is placed in the same layer as the upper coupling wiring.

17. The semiconductor device according to claim 1, further comprising:
a second active element placed over the substrate; and
a second contact electrically coupling the second active element to the wiring placed in the logic circuit region,
wherein the second contact s placed in the same layer as the capacitor.

18. The semiconductor device according to Claim I claim 1, further comprising:
a first wiring,
wherein the first wiring is placed in the bottom wiring layer of the multilayer wiring layer in which the capacitor has been buried, and
wherein the first wiring is placed in the same layer as the capacitor.

19. A method of manufacturing a semiconductor device, comprising the steps of:
forming a multilayer wiring layer over a substrate;
wherein the multilayer wiring layer comprises an insulating layer and a wiring layer in the insulating layer;
selectively removing the insulating layer in a memory circuit formation region different from a logic circuit formation region in which the wiring has been formed and thereby forming a trench;
forming, in the trench, a protective layer having a dielectric constant higher than that of the insulating layer;
removing at least a portion of the protective layer, thereby forming a recess;
burying, in the recess, a lower electrode, a capacitor insulating film, and an upper electrode to form a capacitor; and
forming an upper coupling wiring to be coupled onto the upper electrode,
wherein the step of forming the upper coupling wiring includes a step of forming the upper coupling wiring over the protective layer formed at the bottom portion of the trench.

20. The method of manufacturing a semiconductor device according to claim 19,
wherein the step of forming the upper coupling wiring has the steps of:
burying fully a metal film for upper coupling wiring in a space of the recess which has remained after formation of the lower electrode, the capacitor insulating film, and the upper electrode; and
grinding the metal film for upper coupling wiring.

21. The method of manufacturing a semiconductor device according to claim 19, further comprising, after the step of forming the upper coupling wiring, a step of:
forming a cap layer and an insulating member over the upper electrode wiring in the recess.

22. The method of manufacturing a semiconductor device according to claim 19, further comprising, after the step of forming the recess but prior to the step of forming the capacitor, a step
forming a sidewall protective layer over side walls of the recess.

23. The method of manufacturing a semiconductor device according to claim 19,
wherein the step of forming an upper coupling wiring on the upper electrode comprises the steps of:
forming a metal film for upper coupling wiring across the upper electrode, the protective layer, and the wiring;
leaving the upper coupling wiring over the upper electrode by selectively removing the metal film for upper coupling wiring placed over the protective layer and the wiring layer;
forming a film of the same kind as the protective layer over the protective layer which has been removed at least partially by the step of leaving the upper coupling wiring; and
planarizing the film of the same kind of the protective layer.

24. The method of manufacturing a semiconductor device according to claim 23,
wherein the step of planarizing the film of the same kind as the e protective layer comprises the steps of:
planarizing a portion of the film of the same kind as the protective layer by chemical mechanical polishing; and
removing the remaining portion of the film of the same kind as the protective layer by dry etching, 25. The method of manufacturing a semiconductor device according to claim 23,
wherein the step of planarizing the film of the same kind as the protective layer comprises the step of:
removing the film of the same kind as the protective layer only by dry etching.

26. The method of manufacturing a semiconductor device according to claim 19,
wherein the step of planarizing the film of the same kind as the protective layer comprises the step of:
forming, on the metal film for upper coupling wiring, a cap layer more resistant to etching than the film of the same kind as the protective layer.

* * * * *